(12) United States Patent
Lee et al.

(10) Patent No.: US 12,176,389 B2
(45) Date of Patent: Dec. 24, 2024

(54) SEMICONDUCTOR DEVICE INCLUDING STOPPER LAYER AND ELECTRONIC SYSTEM INCLUDING THE SAME

(71) Applicant: SAMSUNG ELECTRONICS CO., LTD., Suwon-si (KR)

(72) Inventors: Hyemi Lee, Seoul (KR); Seongjae Go, Suwon-si (KR); Hyeonjoo Song, Hwaseong-si (KR); Sunjoong Park, Hwaseong-si (KR); Hanyong Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 413 days.

(21) Appl. No.: 17/468,814

(22) Filed: Sep. 8, 2021

(65) Prior Publication Data

US 2022/0199767 A1 Jun. 23, 2022

(30) Foreign Application Priority Data

Dec. 23, 2020 (KR) ........................ 10-2020-0181987

(51) Int. Cl.
| | | |
|---|---|---|
| H01L 29/06 | (2006.01) |
| H01L 25/065 | (2023.01) |
| H10B 43/10 | (2023.01) |
| H10B 43/27 | (2023.01) |
| H10B 43/35 | (2023.01) |
| H10B 43/40 | (2023.01) |
| G11C 5/06 | (2006.01) |

(52) U.S. Cl.
CPC ...... *H01L 29/0638* (2013.01); *H01L 25/0657* (2013.01); *H10B 43/10* (2023.02); *H10B 43/27* (2023.02); *H10B 43/35* (2023.02); *H10B 43/40* (2023.02); *G11C 5/063* (2013.01); *H01L 2225/0651* (2013.01); *H01L 2225/06524* (2013.01); *H01L 2225/06541* (2013.01); *H01L 2225/06562* (2013.01)

(58) Field of Classification Search
CPC ........ H10B 43/00–50; H10B 41/00–70; H01L 25/0657; H01L 21/76829–76832; H05K 2203/0384
See application file for complete search history.

(56) References Cited

U.S. PATENT DOCUMENTS

| | | |
|---|---|---|
| 9,851,912 B2 | 12/2017 | Nam et al. |
| 10,403,632 B2 | 9/2019 | Ogawa et al. |
| 10,490,569 B2 | 11/2019 | Mushiga et al. |
| 2019/0067314 A1 | 2/2019 | Lu et al. |

(Continued)

*Primary Examiner* — Steven M Christopher
*Assistant Examiner* — Tyler J Wiegand
(74) *Attorney, Agent, or Firm* — Muir Patent Law, PLLC

(57) ABSTRACT

A semiconductor device including a peripheral circuit layer on a substrate; a lower stack and upper stack on the substrate; a stopper layer on the upper stack and including an insulating material; an upper mold layer on the stopper layer; a cell channel structure extending through the layers, a side surface of the cell channel structure contacting the stopper layer; first and second capping layers; a word line separation structure including a protrusion protruding toward the stopper layer; and a bit line contact plug connected to the cell channel structure, wherein an inner side surface of the stopper layer is offset from an inner side surface of the upper stack, and in contact with the word line separation structure.

16 Claims, 46 Drawing Sheets

(56) References Cited

U.S. PATENT DOCUMENTS

2020/0161327 A1\* 5/2020 Lee .................. H01L 29/78642
2020/0258911 A1 8/2020 Lim et al.
2020/0266209 A1 8/2020 Yu et al.

\* cited by examiner

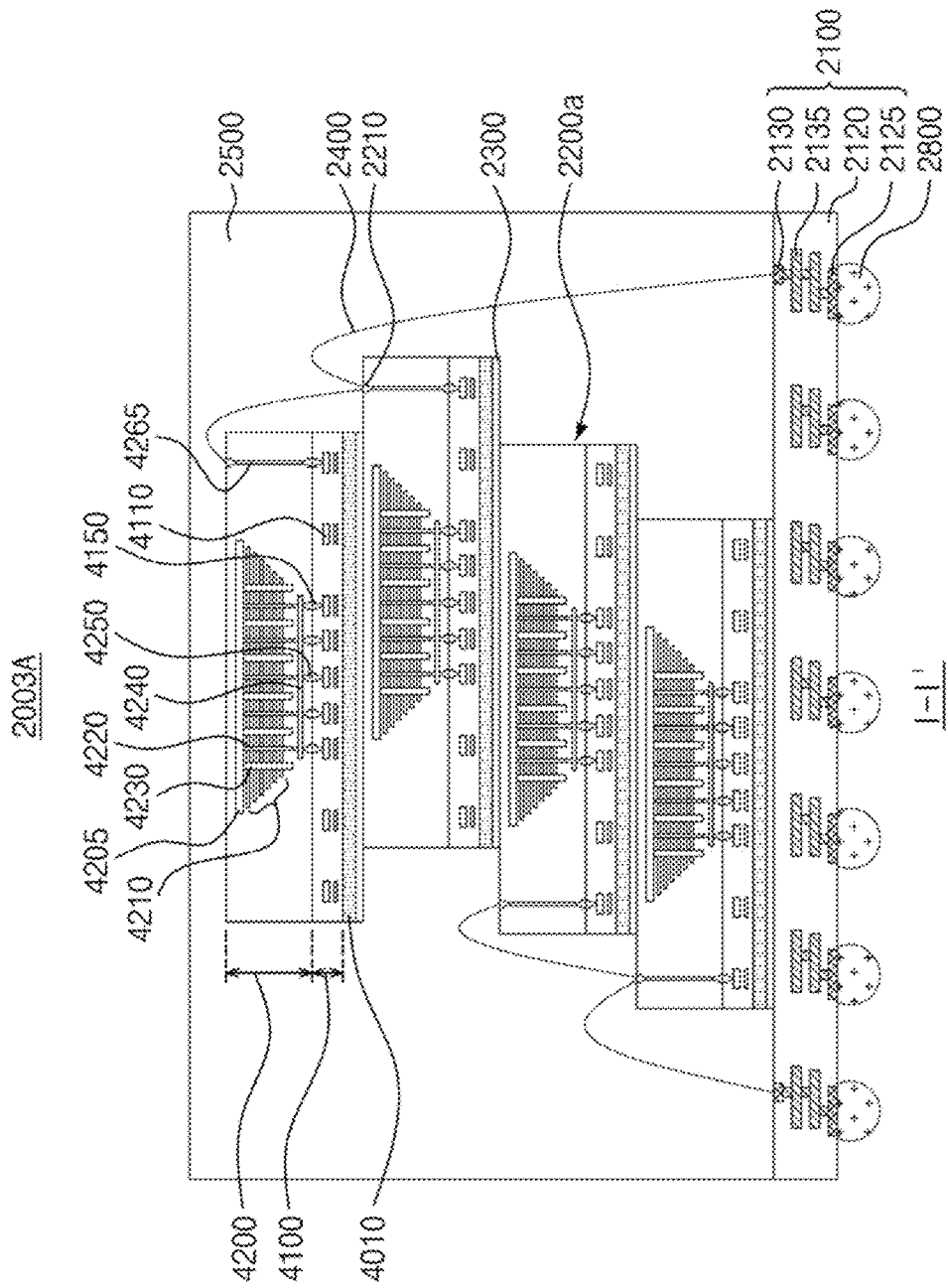

SEMICONDUCTOR DEVICE INCLUDING STOPPER LAYER AND ELECTRONIC SYSTEM INCLUDING THE SAME

CROSS-REFERENCE TO RELATED APPLICATION

Korean Patent Application No. 10-2020-0181987, filed on Dec. 23, 2020, in the Korean Intellectual Property Office, and entitled: "Semiconductor Device Including Stopper Layer and Electronic System Including the Same," is incorporated by reference herein in its entirety.

BACKGROUND

1. Field

Embodiments relate to a semiconductor device including a stopper layer and an electronic system including the same.

2. Description of the Related Art

In an electronic system requiring storage of data, a semiconductor chip capable of storing large volumes of data may be used.

SUMMARY

The embodiments may be realized by providing a semiconductor device including a substrate; a peripheral circuit layer on the substrate; a horizontal semiconductor layer on the peripheral circuit layer; a lower source conductive pattern and an upper source conductive pattern on the horizontal semiconductor layer; a lower stack on the upper source conductive pattern, the lower stack including lower insulating layers and lower gate electrodes which are alternately stacked; an upper stack on the lower stack, the upper stack including upper insulating layers and upper gate electrodes which are alternately stacked; a stopper layer on the upper stack, the stopper layer including a first insulating material; an upper mold layer on the stopper layer, the upper mold layer including a second insulating material having etch selectivity with respect to the stopper layer; a cell channel structure extending through the lower source conductive pattern, the upper source conductive pattern, the lower stack, the upper stack, the stopper layer, and the upper mold layer, a side surface of the cell channel structure contacting the stopper layer; a first capping layer and a second capping layer on the upper mold layer and the cell channel structure; a word line separation structure extending through the lower source conductive pattern, the upper source conductive pattern, the lower stack, the upper stack, the stopper layer, the upper mold layer, the first capping layer, and the second capping layer, the word line separation structure including a protrusion protruding toward the stopper layer; and a bit line contact plug extending through the first capping layer and the second capping layer, the bit line contact plug being connected to the cell channel structure, wherein an inner side surface of the stopper layer is offset from an inner side surface of the upper stack, and in contact with the word line separation structure.

The embodiments may be realized by providing a semiconductor device including a substrate; a gate stack structure on the substrate, the gate stack structure including insulating layers and gate electrodes which are alternately stacked; a stopper layer on the gate stack structure; an upper mold layer on the stopper layer; a cell channel structure extending through the gate stack structure, the stopper layer, and the upper mold layer, a side surface of the cell channel structure contacting the stopper layer; a capping layer on the cell channel structure; a word line separation structure extending through the gate stack structure, the stopper layer, and the capping layer; and a bit line contact plug extending through the capping layer, the bit line contact plug contacting the cell channel structure, wherein an inner side surface of the stopper layer is offset from an inner side surface of an uppermost one of the gate electrodes, and in contact with the word line separation structure.

The embodiments may be realized by providing an electronic system including a main substrate; a semiconductor device on the main substrate; and a controller electrically connected to the semiconductor device on the main substrate, wherein the semiconductor device includes a substrate, a gate stack structure on the substrate, the gate stack structure including insulating layers and gate electrodes which are alternately stacked, a stopper layer on the gate stack structure, an upper mold layer on the stopper layer, a cell channel structure extending through the gate stack structure, the stopper layer, and the upper mold layer, a side surface of the cell channel structure contacting the stopper layer, a capping layer on the cell channel structure, a word line separation structure extending through the gate stack structure, the stopper layer, and the capping layer, and a bit line contact plug extending through the capping layer, the bit line contact plug contacting the cell channel structure, and wherein an inner side surface of the stopper layer is offset from an inner side surface of an uppermost one of the gate electrodes, and in contact with the word line separation structure.

BRIEF DESCRIPTION OF THE DRAWINGS

Features will be apparent to those of skill in the art by describing in detail exemplary embodiments with reference to the attached drawings in which:

FIGS. 46 and 47 are sectional views of semiconductor packages according to exemplary embodiments of the disclosure.

DETAILED DESCRIPTION

Figure 1:
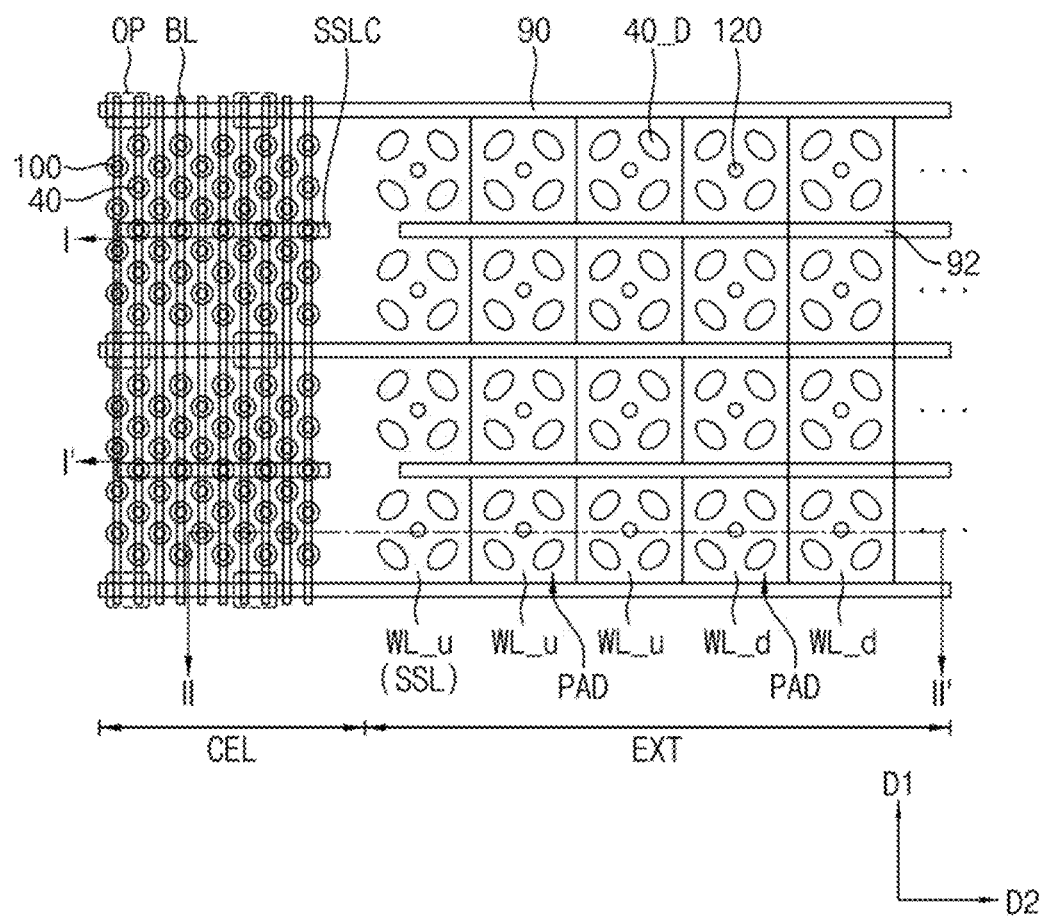
FIG. 1 is a layout view of a semiconductor device according to an exemplary embodiment of the disclosure.

FIG. 1 is a layout view of a semiconductor device according to an exemplary embodiment of the disclosure.

Referring to FIG. 1, the semiconductor device may include a cell area CEL, in or on which memory cells are formed, and an extension area EXT for connecting the memory cells to a wiring. The cell region CEL is partially shown in FIG. 1. In an implementation, as illustrated in FIG. 1, the extension area EXT may be at one side of the cell area CEL, or the extension area may be at opposite sides of the cell area CEL.

The semiconductor device may include cell channel structures 40, dummy channel structures 40_D, gate electrodes WL_u and WL_d, word line separation structures 90, string selection line isolation patterns SSLC, bit line contact plugs 100, and bit lines BL.

The cell channel structures 40 may be on the cell area CEL. The cell channel structures 40 may have a circular shape when viewed in a top or plan view. The cell channel structures 40 may be arranged or aligned in a first direction D1 and, as such, a pad row may be defined, and a plurality of pad rows may be arranged in parallel in a second direction D2. The cell channel structures 40 may be arranged in a hexagonal dense lattice form or a zigzag form.

The dummy channel structures 40_D may be on the extension area EXT. When viewed in a top view, the dummy channel structures 40_D may have a circular shape, an oval shape, an elbow shape, or a bar shape. The dummy channel structures 40_D may be arranged in a quadrangular lattice form. The dummy channel structures 40_D may have a lower pattern density than the cell channel structures 40. The dummy channel structures 40_D may surround the bit line contact plugs 100. In an implementation, one bit line contact plug 100 may be at a center of four adjacent dummy channel structures 40_D.

The gate electrodes WL_d and WL_u may extend from the cell area CEL to the extension area EXT. The gate electrodes WL_d and WL_u may have different lengths in the second direction D2. At least one of the gate electrodes WL_d and WL_u may be a string selection line SSL.

The word line separation structures 90 may extend (e.g., lengthwise) in the second direction D2. The word line separation structures 90 may be in parallel under the condition that the cell channel structures 40 are among or between the word line separation structures 90. A part of the word line separation structures 90 may extend from the cell area CEL to the extension area EXT. In an implementation, another part of the word line separation structures 90 may be on the extension area EXT without being on the cell area CELL.

The string selection line separation patterns SSLC may extend on the cell area CEL in the second direction D2 such that the string selection line isolation patterns SSLC overlap with the gate electrodes WL_d and WL_u. The string selection line isolation patterns SSLC may physically and materially isolate the string selection line SSL. The string selection line isolation patterns SSLC may be on the same line with the word line separation structures 90 in the second direction D2.

The bit line contact plugs 100 may be arranged in a lattice form on the extension area EXT. Each of the bit line contact plugs 100 may be at a center of four adjacent dummy channel structures 40_D. The bit lines BL may be in parallel and may extend in the first direction D1. The bit lines BL may vertically overlap with the cell channel structures 40.

Figure 2:
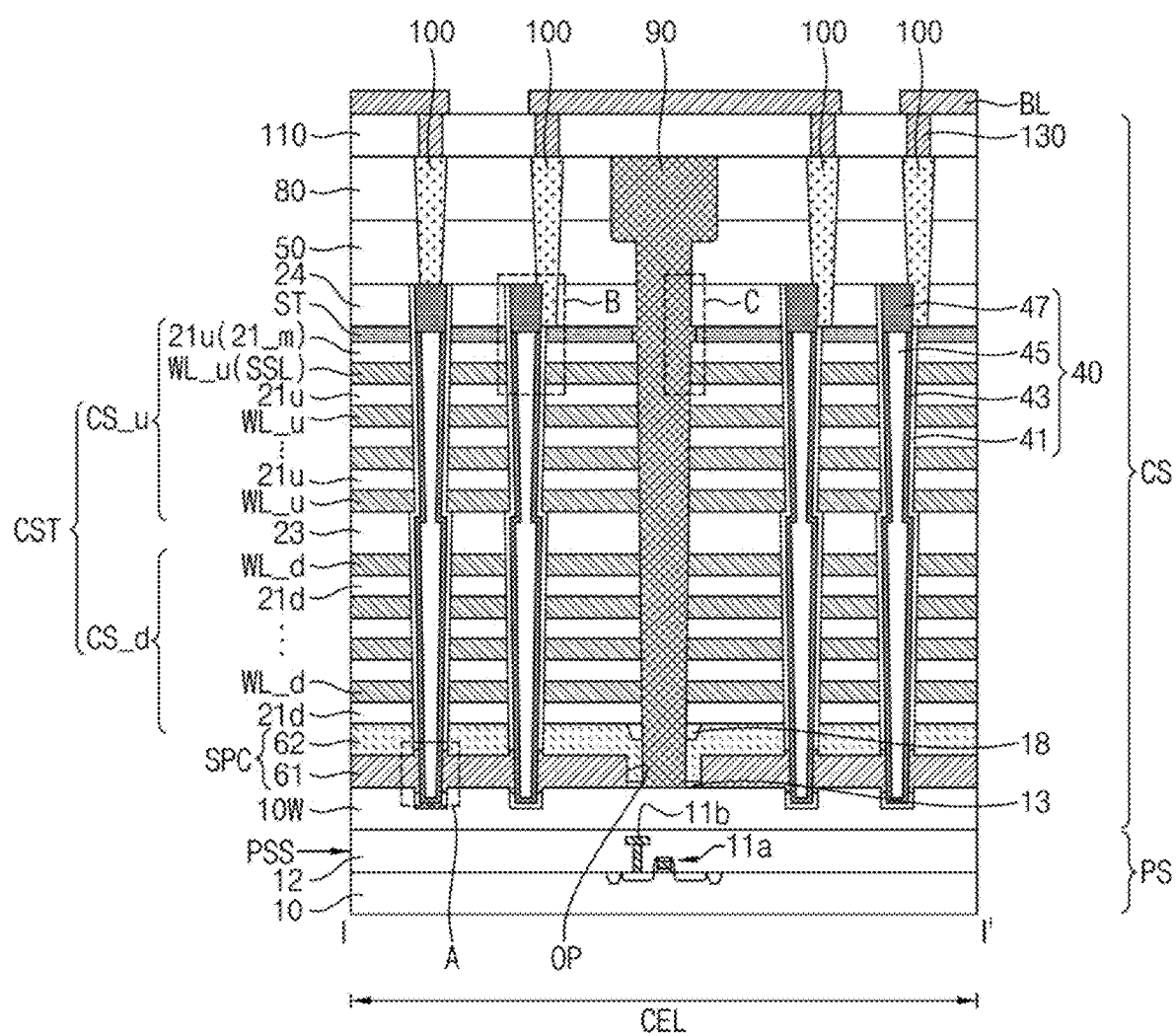
FIG. 2 is a cross-sectional view taken along line I-I' of FIG. 1.
Figure 3:
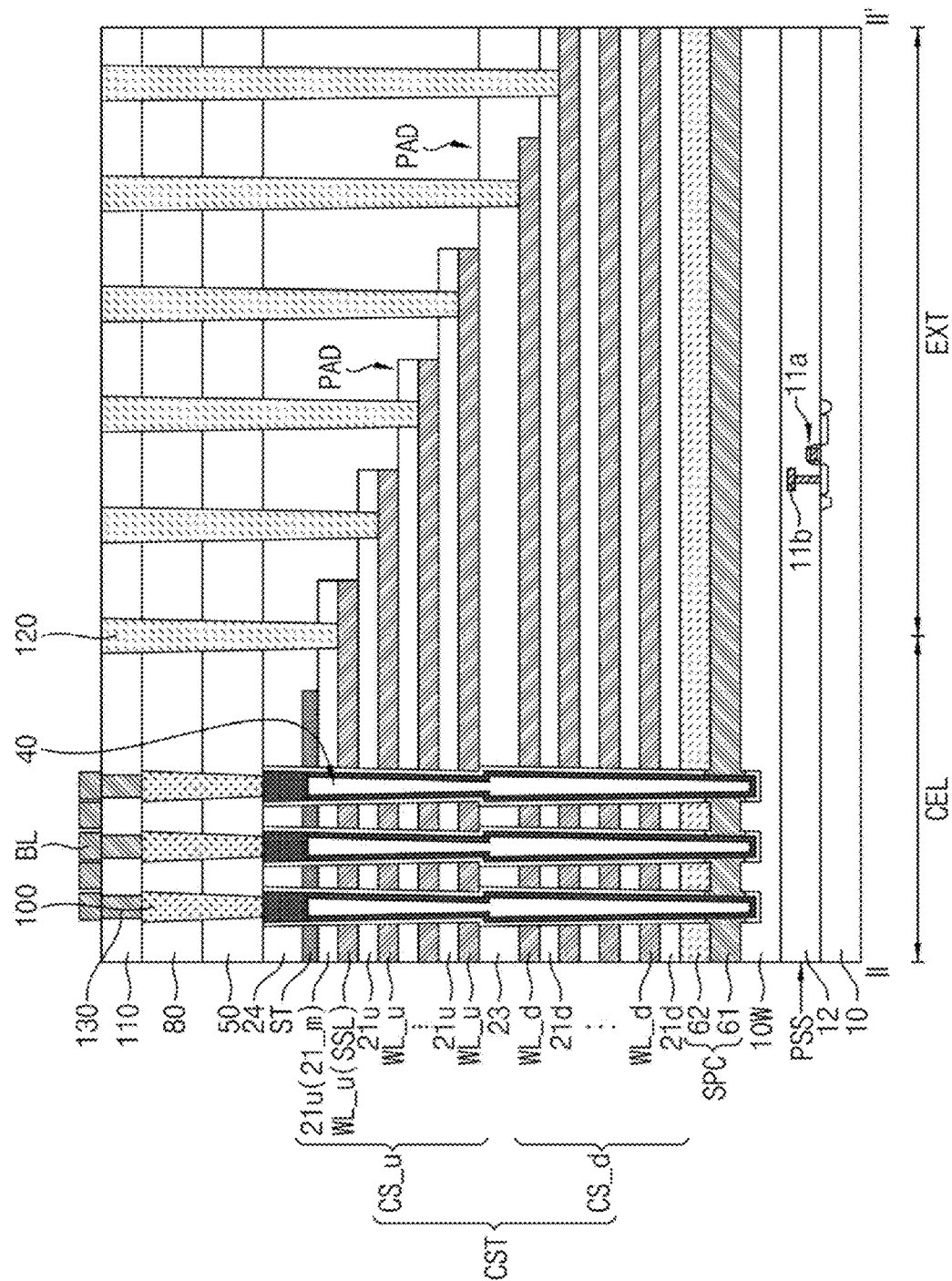
FIG. 3 is a cross-sectional view taken along line II-II' of FIG. 1.

FIG. 2 is a cross-sectional view taken along line I-I' of FIG. 1. FIG. 3 is a cross-sectional view taken along line II-II' of FIG. 1.

Referring to FIGS. 1 to 3, the semiconductor device may include a peripheral circuit structure PS, and a cell array structure CS on the peripheral circuit structure PS. The peripheral circuit structure PS may correspond to a first structure 1100F of FIG. 44, and the cell array structure CS may correspond to a second structure 1100S of FIG. 41.

The peripheral circuit structure PS may include a substrate 10 and a peripheral circuit layer PSS. The substrate 10 may include a silicon wafer. In an implementation, the substrate 10 may include an epitaxially grown material layer such as a silicon layer, a silicon germanium layer, or a silicon carbide layer. In an implementation, the substrate may include a silicon-on-insulator (SOI). As used herein, the term "or" is not an exclusive term, e.g., "A or B" would include A, B, or A and B.

The peripheral circuit layer PSS may be on the substrate 10. The peripheral circuit layer PSS may include a peripheral circuit element 11a, a peripheral circuit wiring 11b, and a peripheral circuit insulating layer 12. In an implementation, the peripheral circuit element 11a may include a source/drain region and a channel region in an active region defined by an element isolation layer, and may include a gate on the substrate 10. The peripheral circuit element 11a may be a peripheral circuit structure to be described below with reference to FIG. 44. The peripheral circuit wiring 11b may be electrically connected to the peripheral circuit element 11a. The peripheral circuit insulating layer 12 may cover the peripheral circuit element 11a and the peripheral circuit wiring 11b. The peripheral circuit insulating layer 12 may include insulating films stacked to form a multilayer structure. In an implementation, the peripheral circuit insulating layer 12 may include a silicon oxide layer, a silicon nitride layer, or a combination thereof.

The cell array structure CS may include a horizontal semiconductor layer 10W, a source conductive pattern SPC, a gate stack structure CST, a stopper layer ST, an upper mold layer 24, the cell channel structures 40, a first capping layer 50, a second capping layer 80, a word line separation structure 90, bit line contact plugs 100, a third capping layer 110, gate contact plugs 120, the bit lines BL, and contact plugs 130.

The horizontal semiconductor layer 10W may be on the peripheral circuit layer PSS. The horizontal semiconductor layer 10W may be a semiconductor substrate including a semiconductor material. The horizontal semiconductor layer 10W may include, e.g., silicon (Si), germanium (Ge), silicon germanium (SiGe), gallium arsenide (GaAs), indium gallium arsenide (InGaAs), aluminum gallium arsenide (AlGaAs), or a combination thereof. The horizontal semiconductor layer 10W may include a semiconductor doped with an impurity or an intrinsic semiconductor in an impurity-undoped state. The horizontal semiconductor layer 10W may have a crystalline structure including a monocrystalline structure, an amorphous crystalline structure, or a polycrystalline structure.

The source conductive pattern SPC may be on the horizontal semiconductor layer 10W. The source conductive pattern SPC may include a lower source conductive pattern 61 and an upper source conductive pattern 62. The lower source conductive pattern 61 may be directly on the horizontal semiconductor layer 10W. An opening OP may be at the lower source conductive pattern 61, to expose a portion of an upper surface of the horizontal semiconductor layer 10W. A buffer insulating film 13 may be in the opening OP, to cover the upper surface of the horizontal semiconductor layer 10W. The upper source conductive pattern 62 may be on the lower source conductive pattern 61. The upper source conductive pattern 62 may extend into the opening OP of the lower source conductive pattern 61, to cover an upper surface of the buffer insulating film 13 and a side surface of the lower source conductive pattern 61. In an implementation, each of the lower source conductive pattern 61 and the upper source conductive pattern 62 may include a semiconductor material doped with an impurity.

The gate stack structure CST may include a lower stack CS_d, a lower mold layer 23, and an upper stack CS_u which are sequentially stacked. The lower stack CS_D may be on the source conductive pattern SPC. The lower stack CS_d may include lower insulating layers 21d and lower gate electrodes WL_d which are alternately stacked. The lower stack CS_d may have a staircase structure on the extension area EXT. The lower insulating layers 21d and the lower gate electrodes WL_d may be paired, and may extend by different lengths in the second direction D2 and, as such, may provide pads PAD having a step.

The lower mold layer 23 may cover an upper surface of the lower stack CS_d. The lower mold layer 23 may cover the staircase structure of the lower stack CS_d, e.g., the pads PAD. In an implementation, the lower mold layer 23 may include silicon oxide.

The upper stack CS_u may be on the lower stack CS_d and the lower mold layer 23. The upper stack CS_u may include upper insulating layers 21u and upper gate electrodes WL_u which are alternately stacked. The upper stack CS_u may have a staircase structure on the extension area EXT. The upper insulating layers 21u and the upper gate electrodes WL_u may be paired, and may extend by different lengths in the second direction D2 and, as such, may provide pads PAD having a step. The upper stack CS_u may have a smaller length in the second direction D2 than the lower stack CS_d, and may form a continuous staircase structure together with the lower stack CS_d. An uppermost upper gate electrode SSL (e.g., farthest from the substrate 10 from among the upper gate electrodes WL_u) may be a string selection line.

In an implementation, each of the upper gate electrodes WL_u and the lower gate electrodes WL_d may include a doped semiconductor, a metal such as tungsten, copper, or the like, a conductive metal nitride such as titanium nitride or tantalum nitride, or a transition metal such as titanium or tantalum. Each of the upper insulating layers 21u and the lower insulating layers 21d may include silicon oxide, silicon nitride, silicon oxynitride, or a low-k dielectric.

The stopper layer ST may be on the upper stack CS_u. The stopper layer ST may contact (e.g., directly contact) an uppermost upper insulating layer 21_m (e.g., farthest from the substrate 10 from among the upper insulating layers 21u of the upper stack CS_u). The stopper layer ST may have a smaller length in the second direction D2 than the uppermost upper insulating layer 21_m and the uppermost upper gate electrode SSL. In an implementation, the stopper layer ST may have the same length in the second direction D2 as the uppermost upper insulating layer 21_m and the uppermost upper gate electrode SSL. As such, the area of the stopper layer ST may be equal to or smaller than the area of each of the uppermost upper insulating layer 21_m and the uppermost upper gate electrode SSL. In an implementation, a thickness of the stopper layer ST may be smaller than a thickness of each of the gate electrodes WL_d and WL_u. The stopper layer ST may include a material having etch selectivity with respect to the upper insulating layers 21u. In an implementation, the stopper layer ST may include silicon nitride, boron nitride, silicon carbide, aluminum oxide, or hafnium oxide.

The upper mold layer 24 may cover the upper stack CS_u, the stopper layer ST, and the lower mold layer 23. The upper mold layer 24 may cover the staircase structure of the upper stack CS_u. The upper mold layer 24 may have a substantially flat upper surface. The upper mold layer 24 may include an insulating material having etch selectivity with respect to the stopper layer ST. In an implementation, the upper mold layer 24 may include silicon oxide, silicon nitride, silicon oxynitride or a low-k dielectric.

The cell channel structures 40 may extend in a vertical direction with respect to an upper surface of the substrate 10 while extending through the source conductive pattern SPC, the lower stack CS_d, the lower mold layer 23, the upper stack CS_u, the stopper layer ST, and the upper mold layer 24 on the cell area CEL. The cell channel structures 40 may be electrically connected to the lower source conductive pattern 61 of the source conductive pattern SPC.

Figure 4:
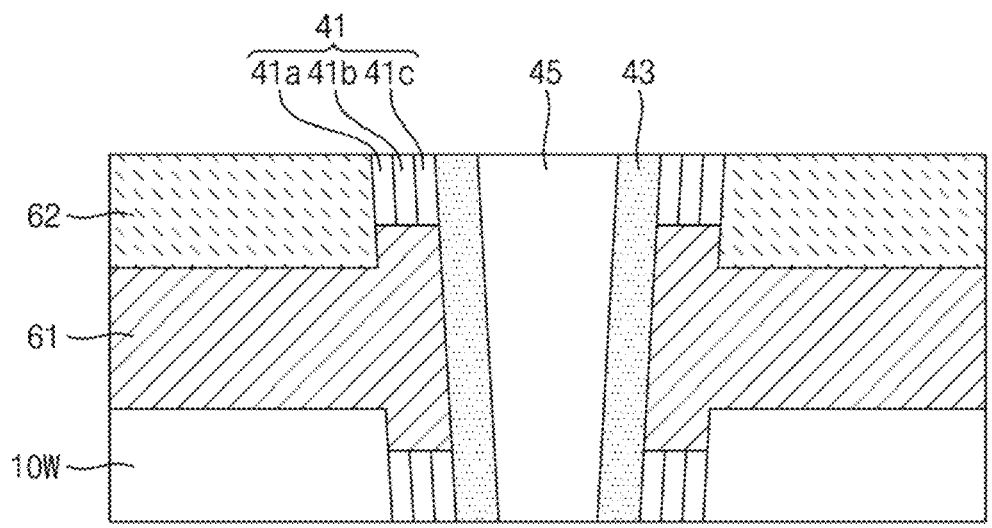
FIG. 4 is an enlarged cross-sectional view of a portion A in FIG. 2.

FIG. 4 is an enlarged cross-sectional view of a portion A in FIG. 2.

Referring to FIGS. 2 and 4, each cell channel structure 40 may include an information storage pattern 41, a channel pattern 43, a buried insulating pattern 45, and a conductive pad 47. The channel pattern 43 may be inside the information storage pattern 41, and the buried insulating pattern 45 may be inside the channel pattern 43. The information storage pattern 41 may form a side surface of the cell channel structure 40 and may contact the upper and lower gate electrodes WL_u and WL_d, the upper and lower insulating layers 21u and 21d, an upper source conductive pattern 62, and a lower source conductive pattern 61. The channel pattern 43 may include polysilicon. The buried insulating pattern 45 may include silicon oxide, silicon nitride, silicon oxynitride, or a combination thereof.

The lower source conductive pattern 61 may extend through the information storage pattern 41, to directly contact a side surface of the channel pattern 43. The lower source conductive pattern 61 may extend between the upper source conductive pattern 62 and the channel pattern 43 (e.g., may include a protruding portion extending between the upper source conductive pattern 62 and the channel pattern 43).

The information storage pattern 41 may include a blocking layer 41a, a charge storage layer 41b, and a tunnel insulating layer 41c. The charge storage layer 41b may be inside the blocking layer 41a, and the tunnel insulating layer 41c may be inside the charge storage layer 41b. The blocking layer 41a and the tunnel insulating layer 41c may include silicon oxide, and the charge storage layer 41b may include silicon nitride.

Referring to FIGS. 2 and 3, the first capping layer 50 and the second capping layer 80 may be sequentially stacked on the upper mold layer 24. The first capping layer 50 may directly cover an upper surface of the upper mold layer 24. In an implementation, the first capping layer 50 may cover upper surfaces of the cell channel structures 40. In an implementation, each of the first capping layer 50 and the second capping layer 80 may include silicon oxide, silicon nitride, silicon oxynitride, or a low-k dielectric.

The word line separation structure 90 may extend in a vertical direction with respect to the upper surface of the substrate 10, e.g., may extend through the source conductive pattern SPC, the lower stack CS_d, the lower mold layer 23, the upper stack CS_u, the stopper layer ST, and the upper mold layer 24, the first capping layer 50 and the second capping layer 80. A bottom surface of the word line separation structure 90 may contact the horizontal semiconductor layer 10W. In an implementation, the word line separation structure 90 may include silicon oxide, silicon nitride, or silicon oxynitride. The word line separation structure 90 may include a material different from those of the upper insulating layers 21u and the lower insulating layers 21d or may include the same material as the upper insulating layers 21u and the lower insulating layers 21d. The word line separation structure 90 may include a material different from that of the upper mold layer 24 or may include the same material as the upper mold layer 24.

The bit line contact plugs 100 may extend through the first capping layer 50 and the second capping layer 80, and may be connected to the cell channel structures 40, respectively. At least a part of the bit line contact plugs 100 may vertically overlap with corresponding ones of the cell channel structures 40. Each bit line contact plug 100 may contact the conductive pad 47 of the corresponding cell channel structure 40. In an implementation, each bit line contact plug 100 may contact the conductive pad 47 and the information storage pattern 41 of the corresponding cell channel structure 40. In an implementation, each bit line contact plug 100 may include a conductive material such as tungsten.

The bit line contact plugs 100 may extend through at least a part of the lower mold layer 23, the upper mold layer 24, the lower insulating layers 21d, the upper insulating layers 21u, the first capping layer 50, the second capping layer 80 and the third capping layer 110 such that each bit line contact plug 100 is connected to selected ones of the lower gate electrodes WL_d and the upper gate electrodes WL_u. In an implementation, the bit line contact plugs 100 may include a conductive material such as tungsten.

The third capping layer 110 may be on the second capping layer 80 and the bit line contact plugs 100. The third capping layer 110 may include the same insulating material as the first capping layer 50 or the second capping layer 80. In an implementation, the third capping layer 110 may include silicon oxide, silicon nitride, silicon oxynitride, or a low-k dielectric. The bit lines BL may be on the third capping layer 110. The contact plugs 130 may extend through the third capping layer 110, to interconnect the bit line contact plugs 100 and the bit lines BL.

The gate contact plugs 120 may be on the extension area EXT. The gate contact plugs 120 may extend through at least a part of the lower mold layer 23, the upper mold layer 24, the lower insulating layers 21d, the upper insulating layers 21u, the first capping layer 50, the second capping layer 80 and the third capping layer 110 such that each gate contact plug 120 is connected to selected ones of the lower gate electrodes WL_d and the upper gate electrodes WL_u. In an implementation, the gate contact plugs 120 may be connected to respective pads PAD of the upper stack CS_u and the lower stack CS_d. In an implementation, the gate electrode plugs 120 may include a conductive material such as tungsten.

Figure 5:
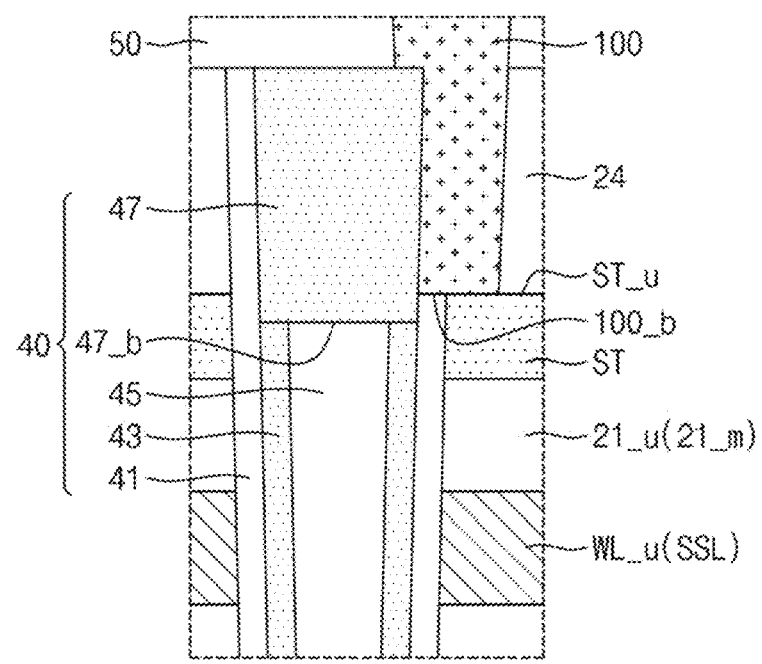
FIG. 5 is an enlarged cross-sectional view of a portion B in FIG. 2.

FIG. 5 is an enlarged cross-sectional view of a portion B in FIG. 2. FIG. 5 illustrates a case in which misalignment has occurred in a process for forming a through hole (cf. FIG. 35) for formation of a bit line contact plug 100.

Referring to FIGS. 2 and 5, in an embodiment, when misalignment of a bit line contact plug 100 occurs, the bit line contact plug 100 may extend through the upper mold layer 24 and, as such, may contact the stopper layer ST. The bit line contact plug 100 may contact a side surface of the corresponding conductive pad 47. At least a portion of the information storage pattern 41 may have an upper end at a lower level than an upper surface of the conductive pad 47, with reference to or as measured from the upper surface of the substrate 10.

In an implementation, a top surface ST_u of the stopper layer ST may be at a higher level than a bottom surface 47_b of the conductive pad 47, with reference to the upper surface of the substrate 10. As such, a lower end 100_b of the bit line contact plug 100 contacting the top surface ST_u of the stopper layer ST may be at a higher level than the bottom surface 47_b of the conductive pad 47, with reference to the upper surface of the substrate 10.

Figure 6:
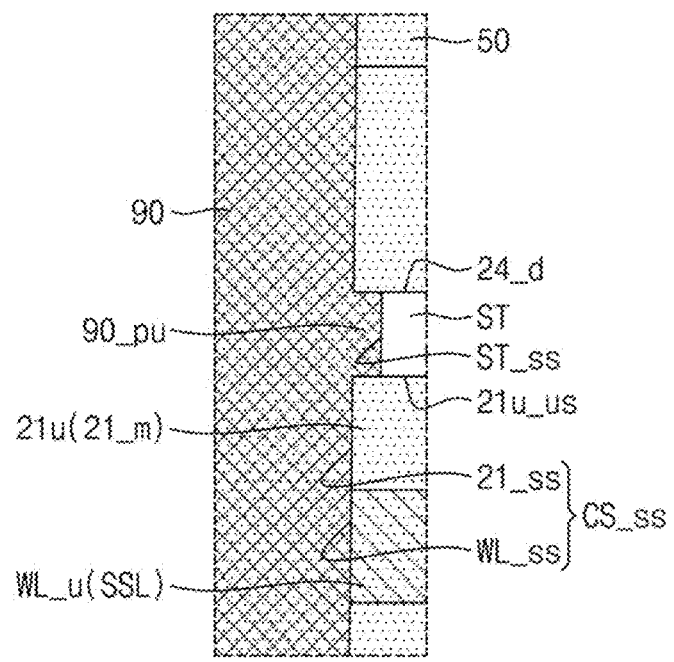
FIG. 6 is an enlarged cross-sectional view of a portion C in FIG. 2.

FIG. 6 is an enlarged cross-sectional view of a portion C in FIG. 2.

Referring to FIGS. 2 and 6, in an embodiment, an inner side surface ST_ss of the stopper layer ST may be offset from an inner side surface CS_ss of the upper stack CS_u (e.g., the inner side surface ST_ss of the stopper layer ST may not be aligned or continuous with an inner side surface CS_ss of the upper stack CS_u). The inner side surface ST_ss of the stopper layer ST means a side surface contacting the word line separation structure 90 among side surfaces of the stopper layer. In an implementation, the inner side surface ST_ss of the stopper layer ST may be horizontally or laterally offset (e.g., laterally spaced apart) from inner side surfaces 21_ss and WL_ss of one upper insulating layer 21u (e.g., the uppermost upper insulating layer 21_m) and one upper gate electrode WL_u (e.g., the uppermost upper gate electrode SSL) in the upper stack CS_u. The inner side surfaces 21_ss and WL_ss of the upper insulation layer 21u and upper gate electrode WL_u in the upper stack CS_u means side surfaces contacting the word line separation structure 90 among side surfaces the upper insulation layer 21u and upper gate electrode WL_u. Here, "offset" may mean that one surface and the other surface, which extend in the same direction, form a step, or are misaligned from each other without being coplanar or colinear with each other. The inner side surface ST_ss of the stopper layer ST may be offset from the inner side surfaces 21_ss and WL_ss of the upper insulating layer 21u and the upper gate electrode WL_u in an inward direction of the stopper layer ST.

In an implementation, the word line separation structure 90 may include a protrusion 90_pu protruding (e.g., outwardly) from a side surface of the word line separation structure 90 toward the stopper layer ST. The protrusion 90_pu may contact (e.g., directly contact) the inner side surface ST_ss of the stopper layer ST, a bottom surface 24_dd of the upper mold layer 24, and a top surface 21u_us of the uppermost upper insulating layer 21_m.

Figure 7:
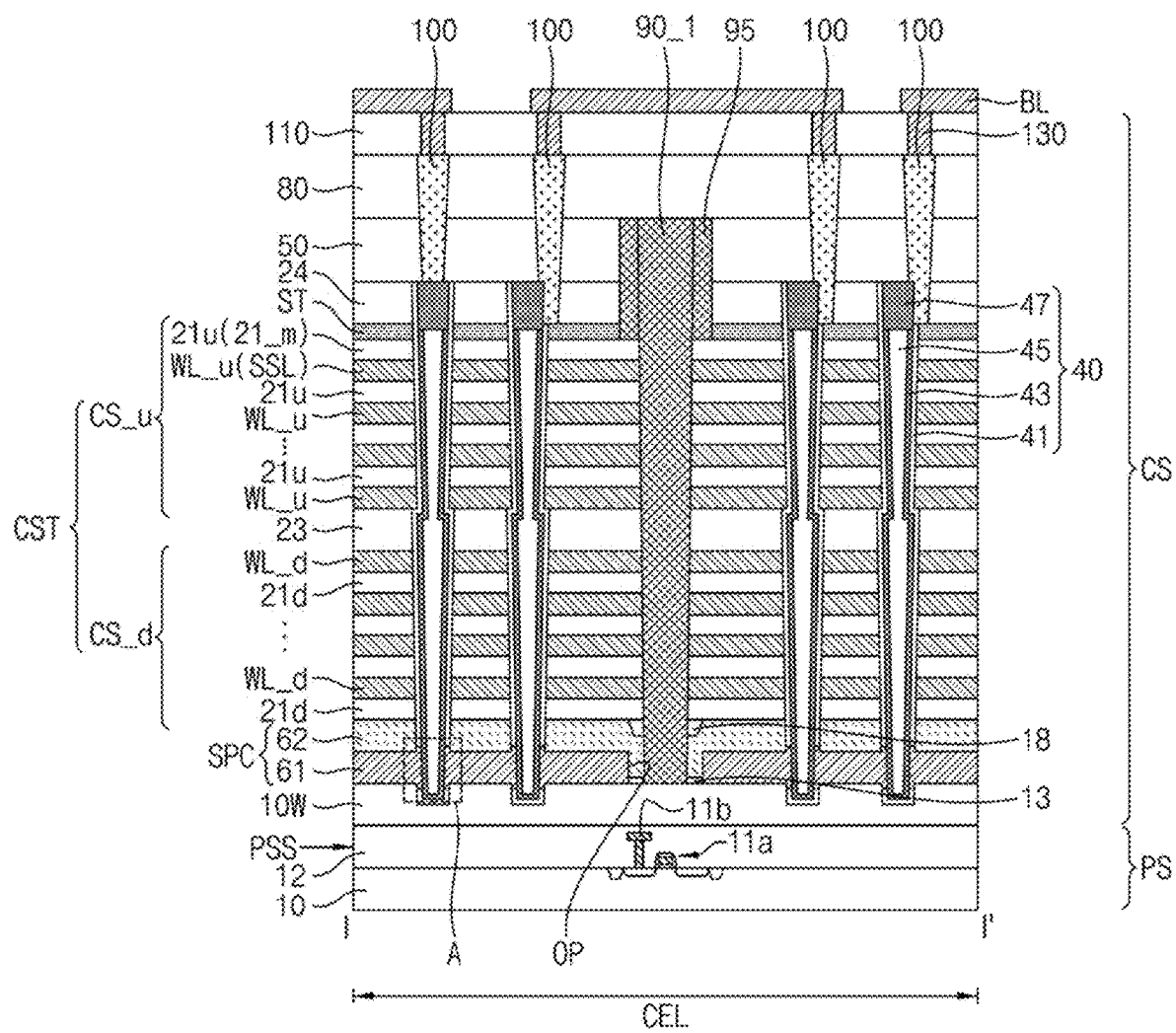
FIG. 7 is an alternative cross-sectional view taken along line I-I' in FIG. 1.

FIG. 7 is an alternative cross-sectional view taken along line I-I' in FIG. 1.

Referring to FIG. 7, a semiconductor device according to an exemplary embodiment of the disclosure differs from the semiconductor device described with reference to FIG. 2 in that the semiconductor device of FIG. 7 includes a word line separation structure 90_1 and a stopper capping pattern 95. The word line separation structure 90_1 may extend through a source conductive pattern SPC, a gate stack structure CST, a stopper layer ST, an upper mold layer 24, and a first capping layer 50. The word line separation structure 901 may be spaced apart from the stopper layer ST, the upper mold layer 24 and the first capping layer 50 and may contact the source conductive pattern SPC and the gate stack structure CST. In an implementation, the word line separation structure 90_1 may include silicon oxide.

The stopper capping pattern 95 may be on an uppermost upper insulating layer 21_m. The stopper capping pattern 95 may surround a portion of a side surface of the word line separation structure 90_1. The stopper capping pattern 95 may have a ring shape when viewed in a top view. An inner surface of the stopper capping pattern 95 may contact (e.g., directly contact) the side surface of the word line separation structure 90_1, and an outer surface of the stopper capping pattern 95 may contact (e.g., directly contact) the stopper layer ST, the upper mold layer 24, and the first capping layer 50. A bottom surface of the stopper capping pattern 95 may contact the uppermost upper insulating layer 21_m. In an implementation, the stopper capping pattern 95 may include the same material as the word line separation structure 90_1. In an implementation, the stopper capping pattern 95 and the word line separation structure 90_1 may form an integrated structure.

FIGS. 8 to 37 are cross-sectional views of stages in a semiconductor device manufacturing method according to an exemplary embodiment of the disclosure. FIG. 28 is an enlarged view of a portion E1 of FIG. 27.

Figure 8:
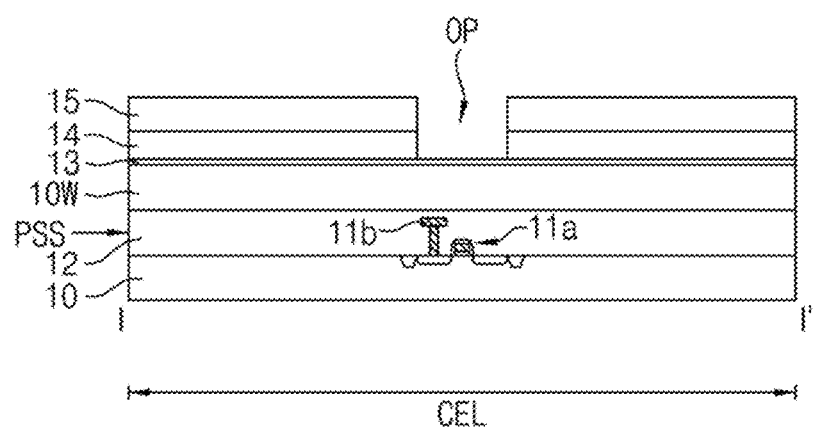
FIGS. 8 to 37 are cross-sectional views of stages in a method of manufacturing a semiconductor device according to an exemplary embodiment of the disclosure.
Figure 9:
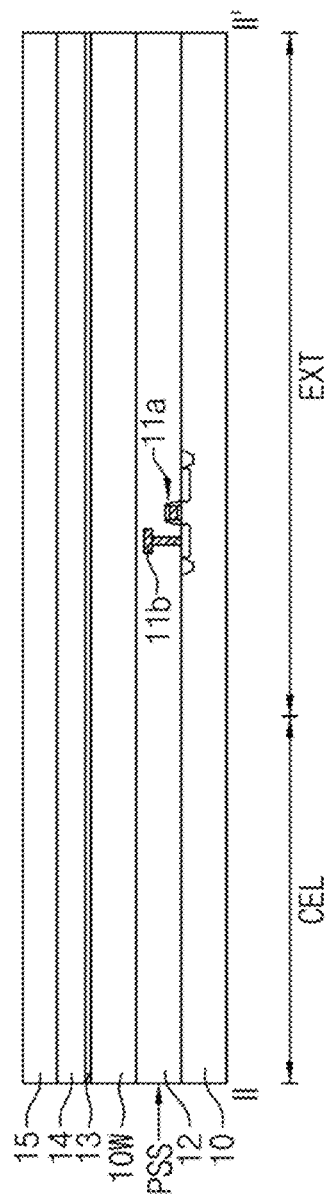

Referring to FIGS. 8 and 9, the method may include forming a peripheral circuit layer PSS on a substrate 10. An element isolation layer may be provided in the substrate 10. The element isolation layer may define an active region of the substrate 10.

Formation of the peripheral circuit layer PSS on the substrate 10 may include forming a peripheral circuit element 11a and a peripheral circuit wiring 11b on the substrate 10, and forming a peripheral circuit insulating layer 12 covering the peripheral circuit element 11a and the peripheral circuit wiring 11b. The peripheral circuit element 11a may constitute a decoder circuit 1110, a pager buffer 1120, a logic circuit 1130, or the like of FIG. 44. The peripheral circuit element 11a may include a gate structure on the active area of the substrate 10 and an impurity region in the substrate 10.

The method may include forming a horizontal semiconductor layer 10W on the peripheral circuit insulating layer 12. The method may include forming a buffer insulating film 13 on the horizontal semiconductor layer 10W. In an implementation, the buffer insulating film 13 may include silicon oxide. The buffer insulating film 13 may be formed by thermally oxidizing a surface of the horizontal semiconductor layer 10W or depositing silicon oxide on the surface of the horizontal semiconductor layer 10W.

The method may include forming a lower sacrificial pattern 14 on the buffer insulating film 13. Formation of the lower sacrificial pattern 14 may include forming a lower sacrificial film on the buffer insulating film 13, forming a mask pattern 15 on the lower sacrificial film, and etching a portion of the lower sacrificial film using the mask pattern 15 as an etch mask. As the portion of the lower sacrificial film is etched, the lower sacrificial pattern 14, which includes an opening OP, may be formed. A portion of an upper surface of the buffer insulating film 13 may be exposed through the opening OP.

The lower sacrificial pattern 14 may include a material having etch selectivity with respect to the buffer insulating film 13. In an implementation, the lower sacrificial pattern 14 may include silicon nitride, silicon oxynitride, silicon carbide, or silicon germanium. After formation of the lower sacrificial pattern 14, the mask pattern 15 may be removed.

Figure 10:
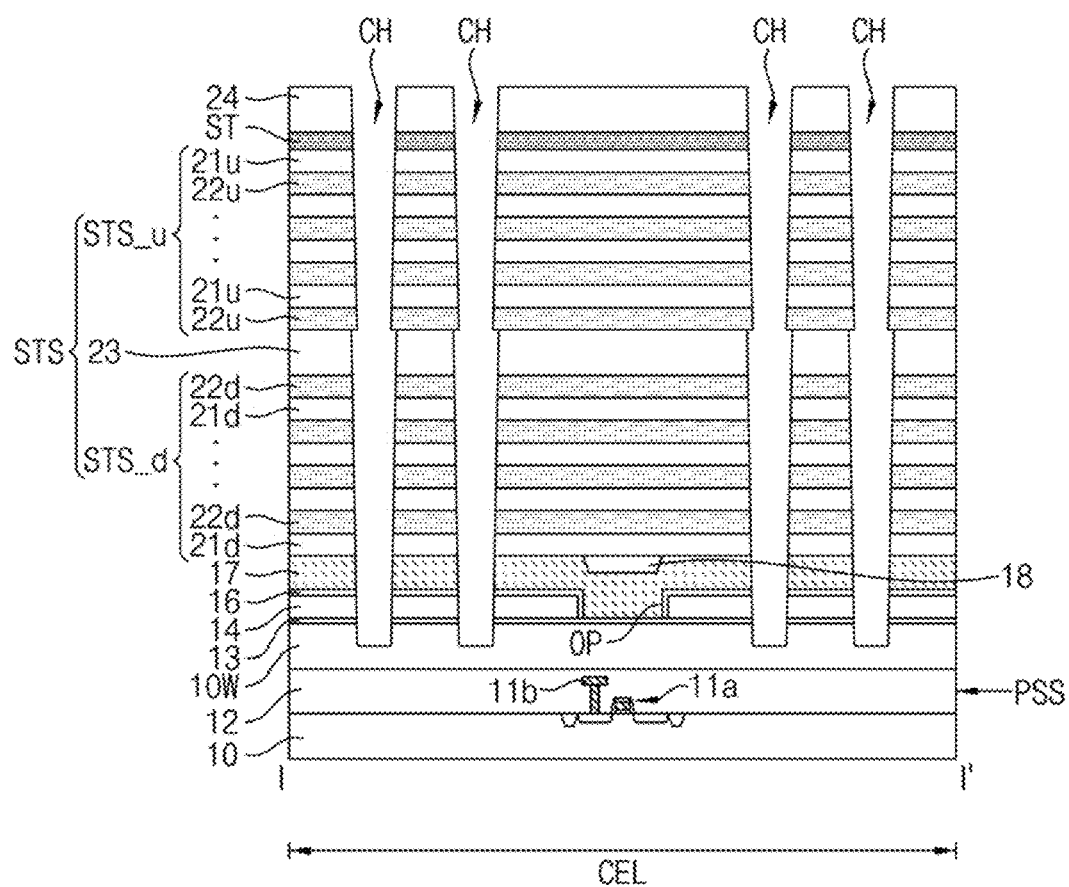
Figure 11:
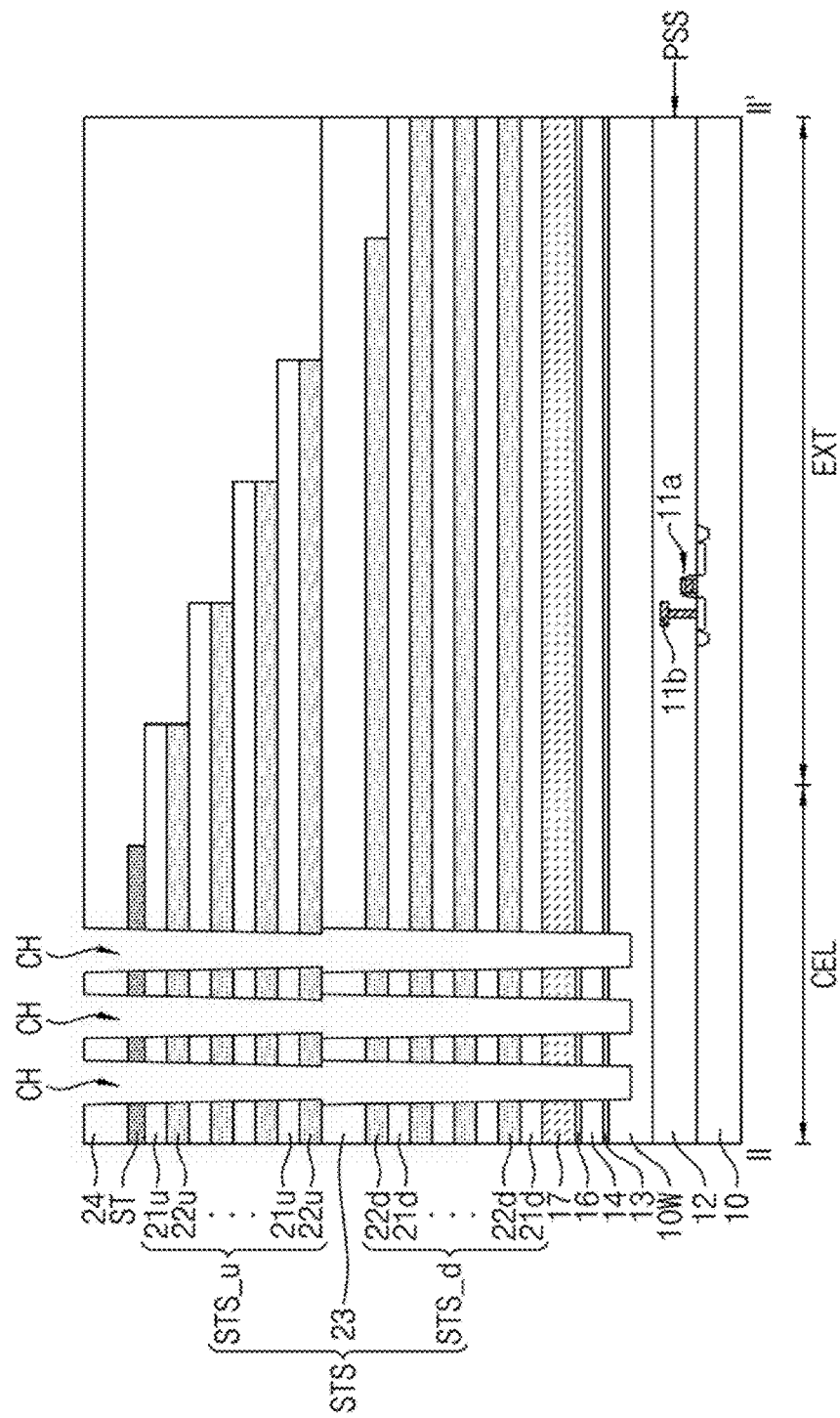

Referring to FIGS. 10 and 11, the method may include forming a liner 16 covering the lower sacrificial pattern 14, forming a source conductive layer 17 on the liner 16, forming a buffer layer 18 on the source conductive layer 17, forming a stack structure STS on the source conductive layer 17 and the buffer layer 18, forming a stopper layer ST on the stack structure STS, forming an upper mold layer 24 on the stopper layer ST, and forming a channel hole CH extending through the stack structure STS, the stopper layer ST and the upper mold layer 24.

The liner 16 may conformally cover upper and side surfaces of the lower sacrificial pattern 14. In an implementation, the liner 16 may include silicon oxide. The source conductive layer 17 may cover an upper surface of the liner 16 and may cover a side surface of the liner 16 and may fill the opening OP. The source conductive layer 17 may be formed to have a uniform thickness and, as such, a top surface of the source conductive layer 17 may be recessed downwardly at a position vertically overlapping with the opening OP. In an implementation, the source conductive layer 17 may include a polysilicon film doped with an N-type impurity (e.g., phosphorous (P) or arsenic (As)).

The buffer layer 18 may be formed on the recessed top surface of the source conductive layer 17. Formation of the buffer layer 18 may include forming an insulating film on the source conductive layer 17, and planarizing the insulating film to expose the top surface of the source conductive layer 17. In an implementation, the insulating film may include silicon oxide.

Formation of the stack structure STS may include forming a lower stack structure STS_d on the source conductive layer 17. Formation of the lower stack structure STS_d may include alternately stacking a lower insulating layer 21d and a lower sacrificial layer 22d, thereby forming a lower mold structure. The lower insulating layer 21d may include a material having etch selectivity with respect to the lower sacrificial layer 22d. In an implementation, the lower sacrificial layer 22d may include silicon nitride, and the lower insulating layer 21d may include silicon oxide. In an implementation, the lower sacrificial layer 22d may include the same material as the lower sacrificial pattern 14.

Formation of the lower stack structure STS_d may include trimming the lower mold structure. The trimming process may include repetition of forming a mask pattern on the lower mold structure, etching a portion of the lower mold structure using the mask pattern, reducing a horizontal area of the mask pattern, and etching a portion of the lower mold structure using the area-reduced mask pattern. Through the trimming process, the lower stack structure STS_d, which has a staircase structure with a height reduced stepwise as the structure extends from a cell area CEL to an extension area EXT, may be formed.

Formation of the stack structure STS may include forming a lower mold layer 23 covering the lower stack structure STS_d. The lower mold layer 23 may be formed to cover the trimmed lower insulating layer 21d and the trimmed lower sacrificial layer 22d. The lower mold layer 23 may include a material having etch selectivity with respect to the lower sacrificial layer 22d. In an implementation, the lower mold layer 23 may include at least one of silicon oxide, silicon oxynitride, a low-k dielectric, a high-k dielectric, or a combination thereof. An upper surface of the lower mold layer 23 may be planarized through a process such as chemical mechanical polishing (CMP).

Formation of the channel hole CH may include forming a lower channel hole extending through the lower stack structure STS_d and the lower mold layer 23. The lower channel hole may extend through the source conductive layer 17, the liner 16, the lower sacrificial pattern 14, and the buffer insulating film 13. The lower channel hole may be formed through an anisotropic etching process. The lower channel hole may be filled with an insulating material having etch selectivity with respect to the lower stack structure STS_d.

Formation of the stack structure STS may include forming an upper stack structure STS_u on the lower stack structure STS_d and the lower mold layer 23. Formation of the upper stack structure STS_u may include alternately stacking an upper insulating layer 21u and an upper sacrificial layer 22u, thereby forming an upper mold structure. The upper insulating layer 21u may include a material having etch selectivity with respect to the upper sacrificial layer 22u. The upper insulating layer 21u may include the same material as the lower insulating layer 21d. The upper sacrificial layer 22u may include the same material as the lower sacrificial layer 22d. In the specification, each of the lower sacrificial layer 22d and the upper sacrificial layer 22u may be referred to as a "sacrificial layer", whereas each of the lower insulating layer 21d and the upper insulating layer 21u may be referred to as an "insulating layer".

The stopper layer ST may be formed on the upper mold structure of the stack structure STS. The stopper layer ST may include the same material as the lower sacrificial layer 22d and the upper sacrificial layer 22u. In an implementation, the stopper layer ST may include silicon nitride. After formation of the stopper layer ST, a trimming process may be performed for the upper mold structure and the stopper layer ST. As the upper mold structure is trimmed, the upper stack structure STS_u, which has a staircase structure, may be formed. As the stopper layer ST is trimmed together with the upper stack structure STS_u, the stopper layer ST may have an area equal to or smaller than areas of an uppermost upper insulating layer 21_m and an uppermost upper sacrificial layer 22u in the upper stack structure STS_u.

Thereafter, the upper mold layer 24 may be formed on the upper stack structure STS_u and the stopper layer ST. The upper mold layer 24 may cover the staircase structure of the upper stack structure STS_u and the lower mold layer 23.

Formation of the channel hole CH may include forming an upper channel hole extending through the upper stack structure STS_u and the upper mold layer 24. The upper channel hole may be formed at a position vertically overlapping with the lower channel hole. After formation of the upper channel hole, an insulating material in the lower channel hole may be removed, thereby forming the channel hole CH. The upper channel hole may be connected to the lower channel hole and, as such, may form the channel hole CH which has an integrated structure.

Figure 12:
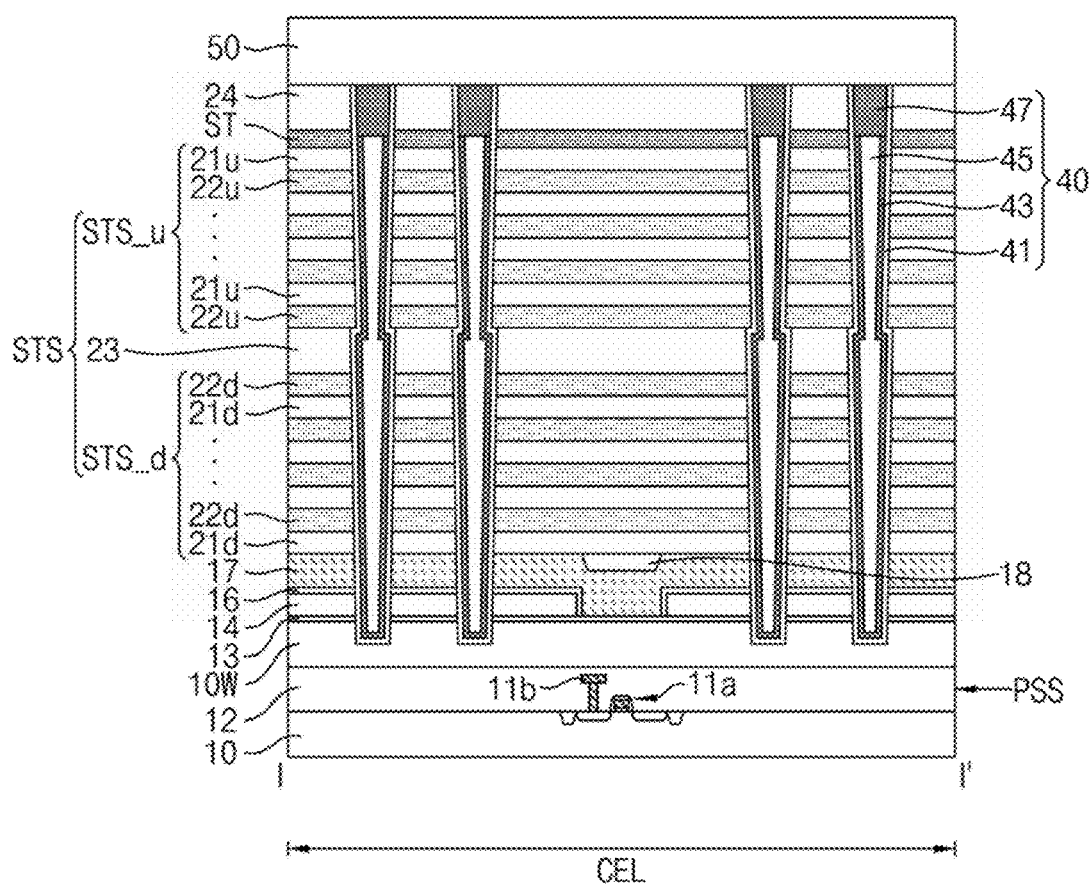
Figure 13:
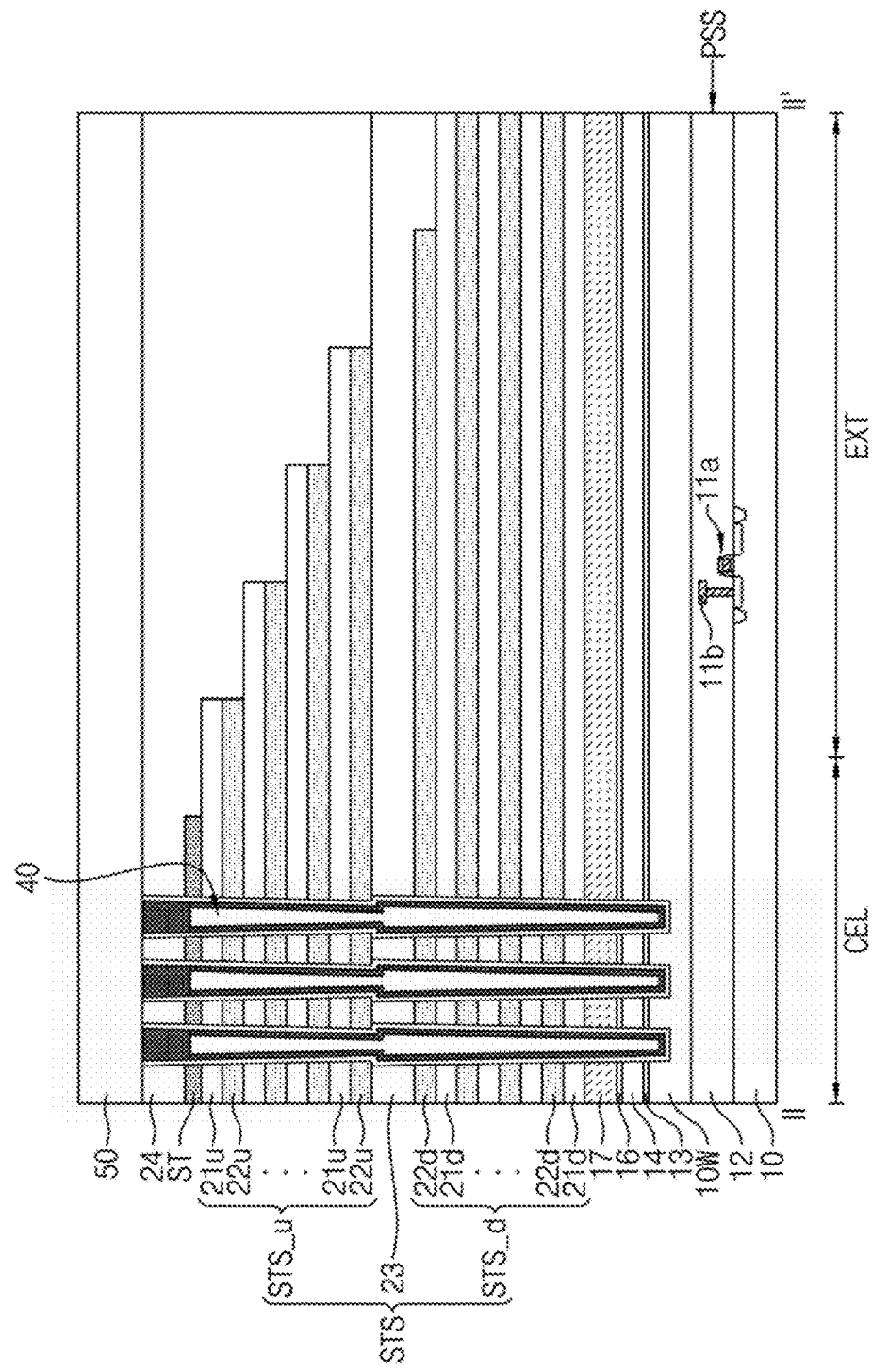

Referring to FIGS. 12 and 13, the method may include forming a cell channel structure 40 in the channel hole CH, and forming a first capping layer 50 on the upper mold layer 24 and the cell channel structure 40. Formation of the cell channel structure 40 may include sequentially forming an information storage pattern 41, a channel pattern 43, a buried insulating pattern 45, and a conductive pad 47. The cell channel structure 40 may extend through the stack structure STS, the stopper layer ST, and the upper mold layer 24.

The information storage pattern 41 and the channel pattern 43 may be formed to fill a portion of the channel hole CH. The buried insulating pattern 45 may fill a residual space remaining after formation of the information storage pattern 41 and the channel pattern 43 in the channel hole CH. The conductive pad 47 may be formed on the channel pattern 43 and the buried insulating pattern 45. After formation of the cell channel structure 40, the first capping layer 50 may be formed on the conductive pad 47 and the upper mold layer 24. The first capping layer 50 may be planarized through chemical mechanical polishing (CMP).

Figure 14:
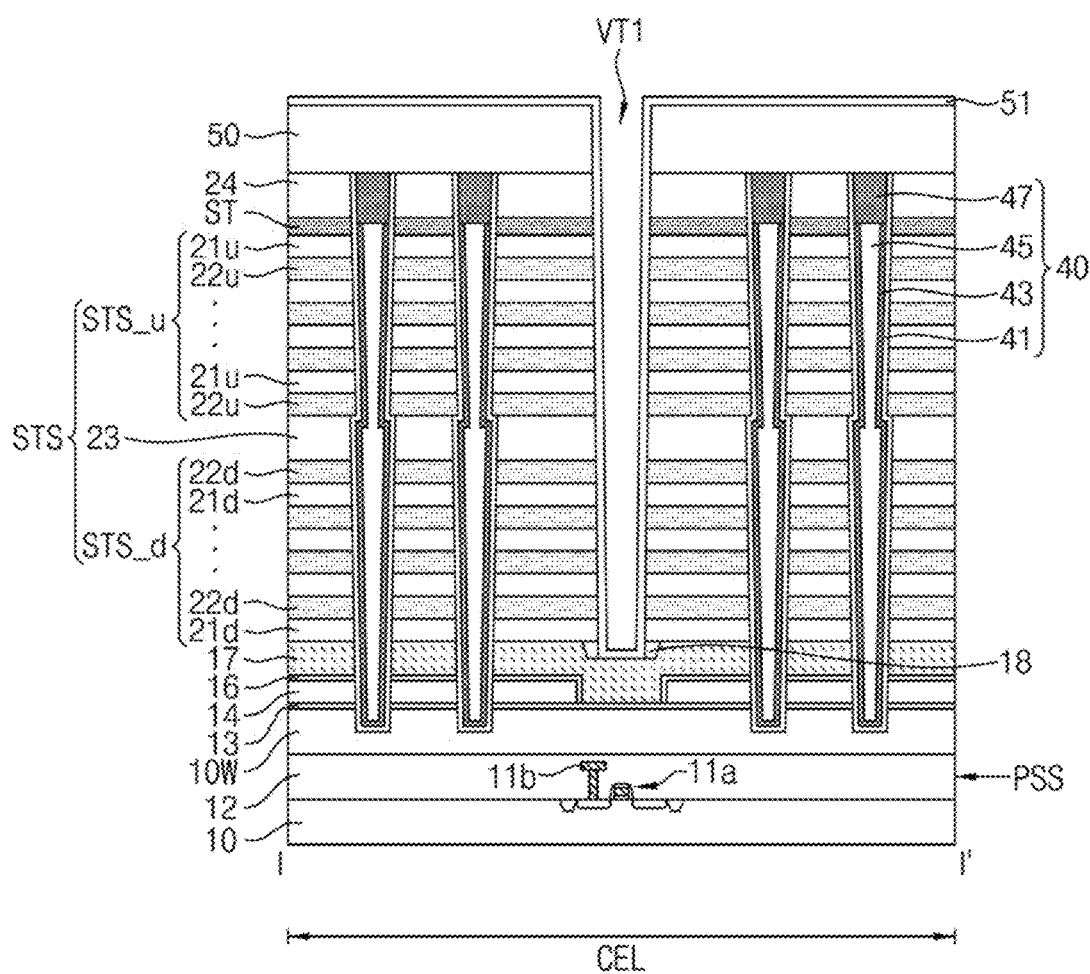
Figure 15:
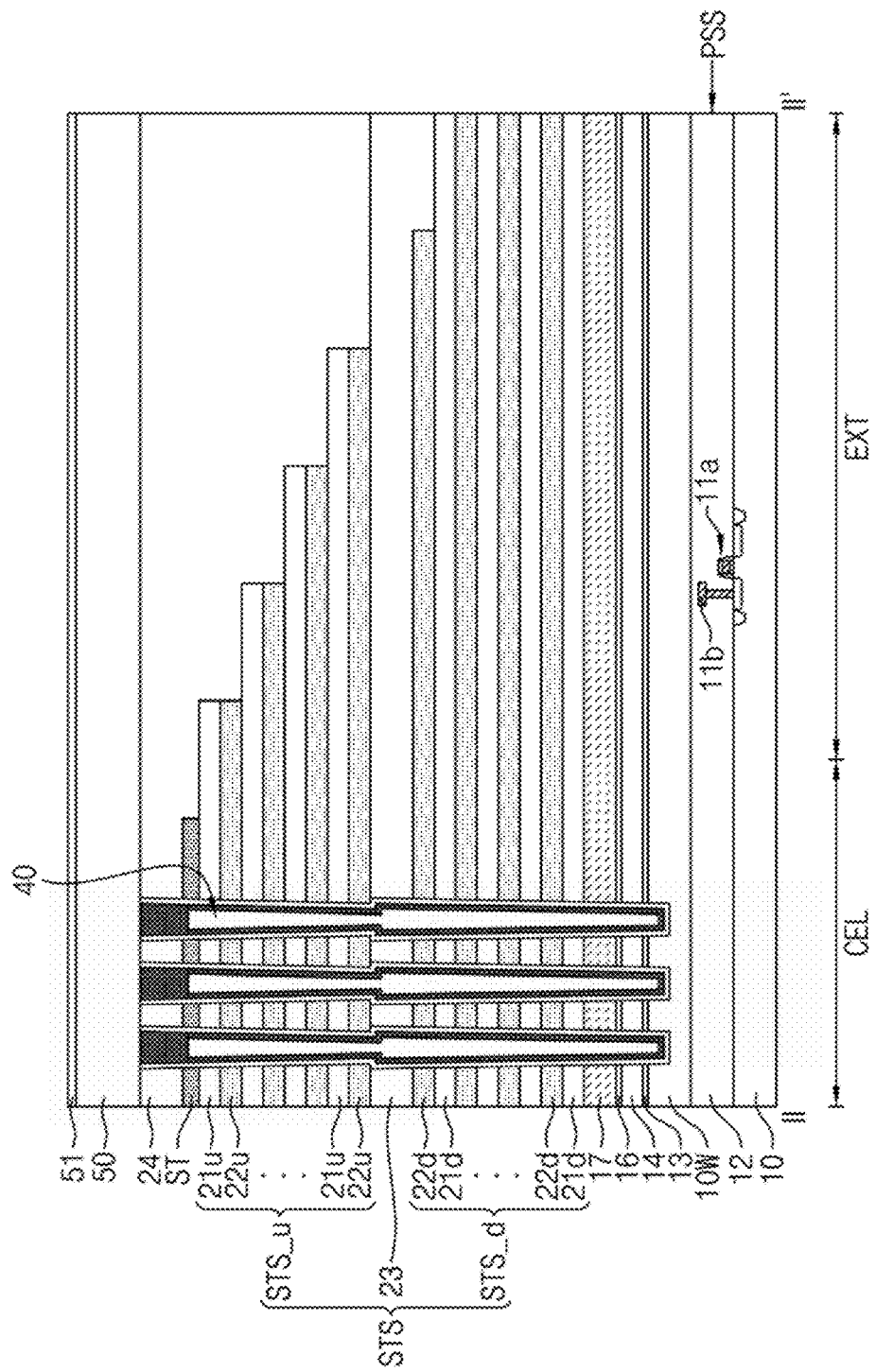

Referring to FIGS. 14 and 15, the method may include forming a trench VT1 extending through the first capping layer 50 and the stack structure STS, and forming a sacrificial spacer layer 51 in the trench VT1. The trench VT1 may extend through the buffer layer 18, thereby exposing the source conductive layer 17. The sacrificial spacer layer 51 may be conformally formed while covering an upper surface of the first capping layer 50, the top surface of the source conductive layer 17 and a side wall of the trench VT1. The sacrificial spacer layer 51 may incompletely fill the trench VT1. In an implementation, the sacrificial spacer layer 51 may include polysilicon.

Figure 16:
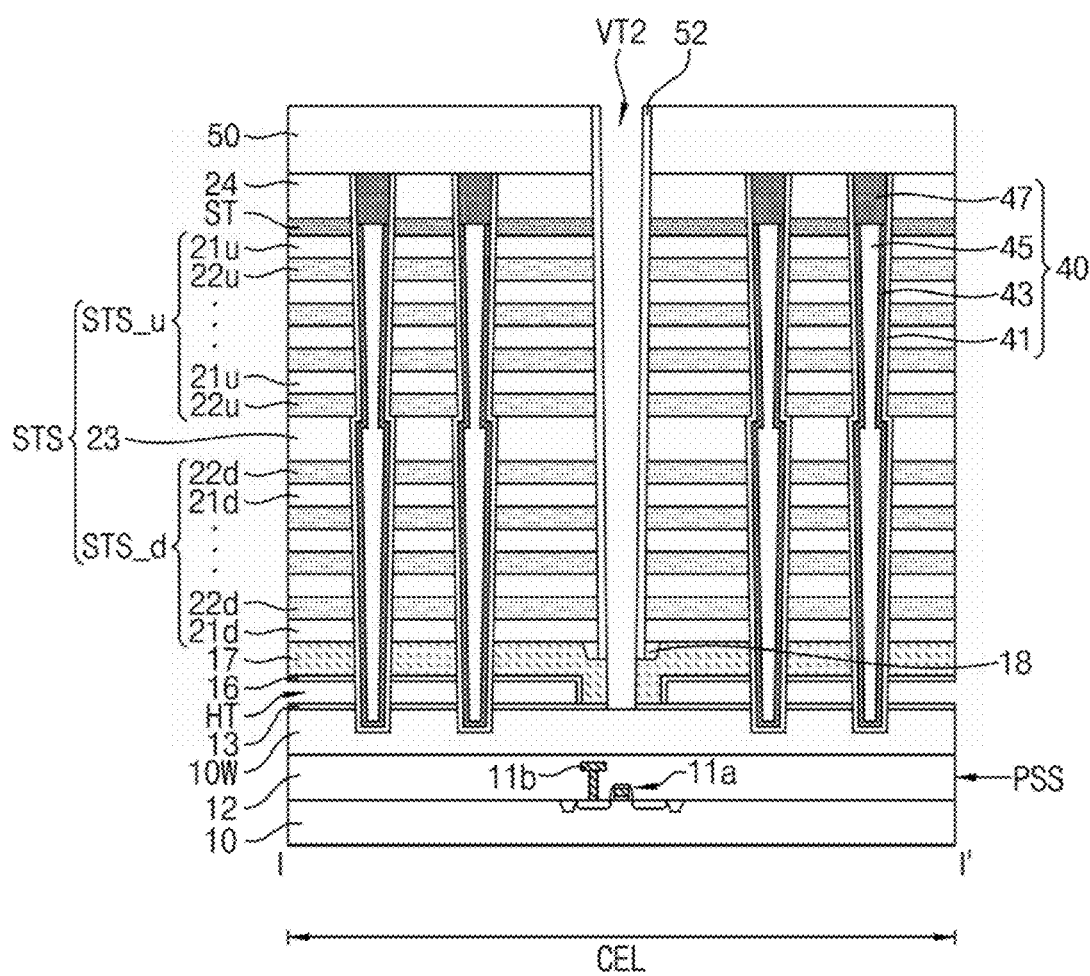
Figure 17:
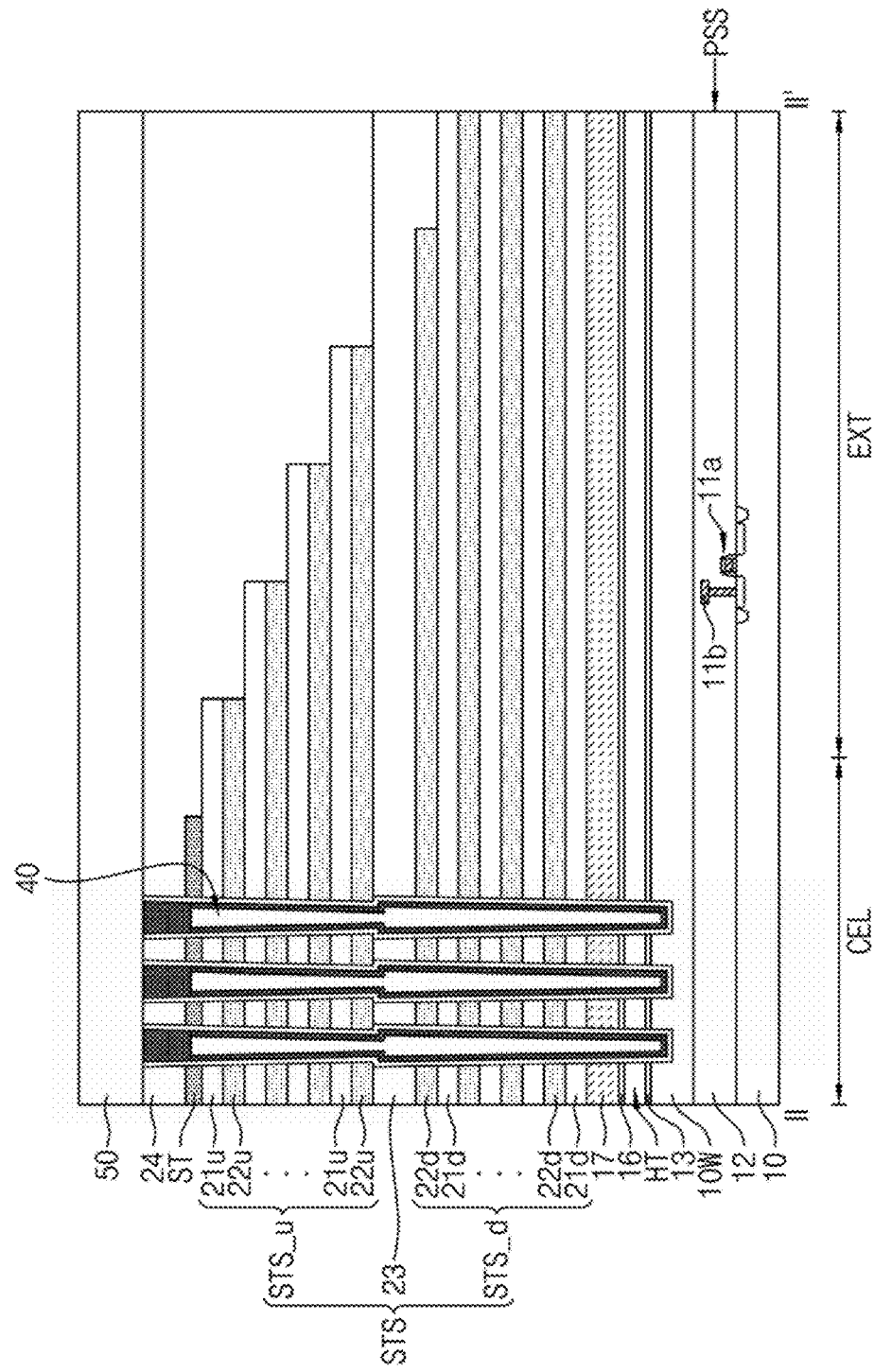

Referring to FIGS. 16 and 17, the method may include forming a sacrificial spacer 52 and a vertical through region VT2, and forming a horizontal through region HT.

Formation of the sacrificial spacer 52 may include etching a portion of the sacrificial spacer layer 51. In an implementation, as the portion of the sacrificial spacer layer 51 is removed through an anisotropic etching process, the sacrificial spacer 52 may be formed. Through an anisotropic etching process, the source conductive layer 17 and the buffer insulating film 13 may be etched. In an implementation, the trench VT1 may further extend downwardly and, as such, the vertical through region VT2, which exposes an upper surface of the horizontal semiconductor layer 10W, may be formed. The vertical through region VT2 may expose the buffer insulating film 13 and the source conductive layer 17. In an implementation, as illustrated in the drawings, the vertical through region VT2 may be spaced apart from the lower sacrificial pattern 14 by the source conductive layer 17, or the vertical through region VT2 may expose the lower sacrificial pattern 14 at a position offset therefrom in a second direction D2 (cf. FIG. 1). As such, formation of the horizontal through region HT may be isotropic etching of the lower sacrificial pattern 14 through an isotropic etching process. As the lower sacrificial pattern 14 is removed through the isotropic etching process, the horizontal through region HT may be formed. The horizontal through region HT may expose an outer side surface of the cell channel structure 40, e.g., a portion of the information storage pattern 41. In addition, the horizontal through region HT may expose an inner side surface of the liner 16 and the upper surface of the buffer insulating film 13. The isotropic etching process may be performed using an etching recipe having etch selectivity with respect to the sacrificial spacer 52, the source conductive layer 17 and the liner 16. During formation of the horizontal through region HT, the source conductive layer 17 may function as a supporter for preventing collapse of the stack structure STS.

Figure 18:
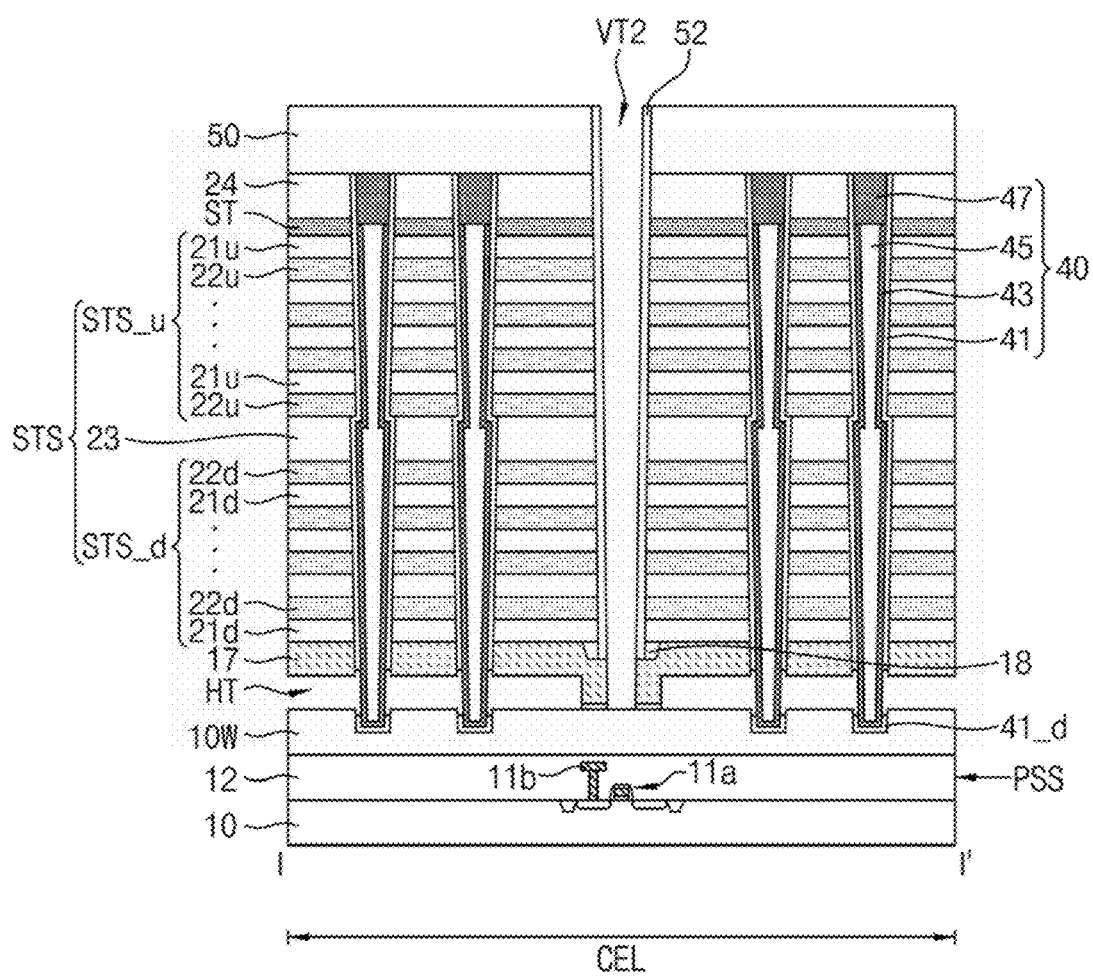
Figure 19:
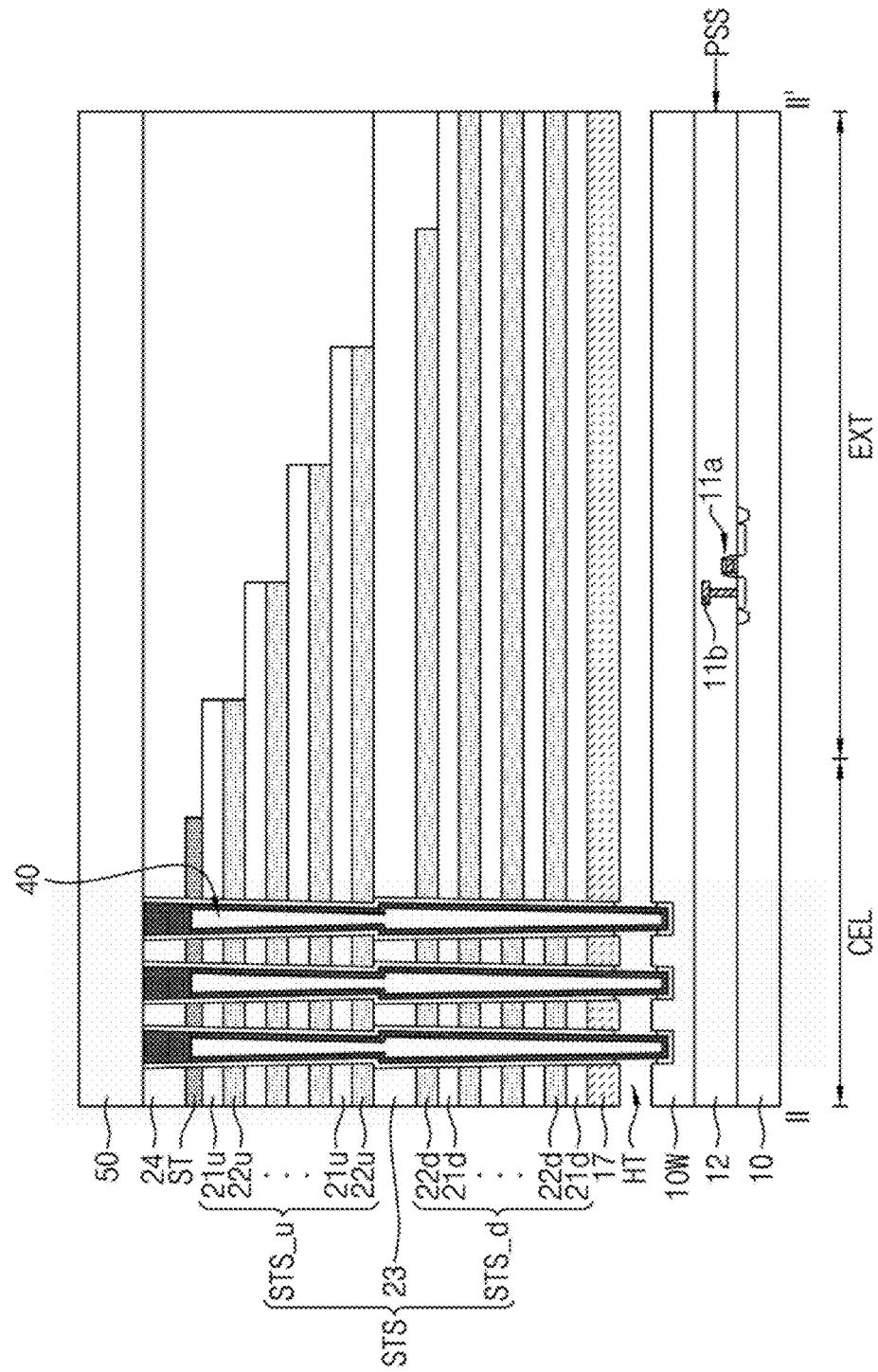

Referring to FIGS. 18 and 19, the method may include removing a portion of the information storage pattern 41 exposed through the horizontal through region HT, thereby exposing a portion of a side surface of the channel pattern 43. As the portion of the information storage pattern 41, the information storage pattern 41 may be separated into an information storage pattern 41 and a dummy information storage pattern which are vertically spaced apart from each other. A portion of the channel pattern 43 may be exposed between the information storage pattern 41 and the dummy information storage pattern which are spaced apart from each other. When the portion of the information storage pattern 41 is removed, the buffer insulating film 13 and the liner 16 may be removed. Accordingly, a bottom surface of the source conductive layer 17 and an upper surface of the horizontal semiconductor layer 10W may be exposed through the horizontal through region HT.

Figure 20:
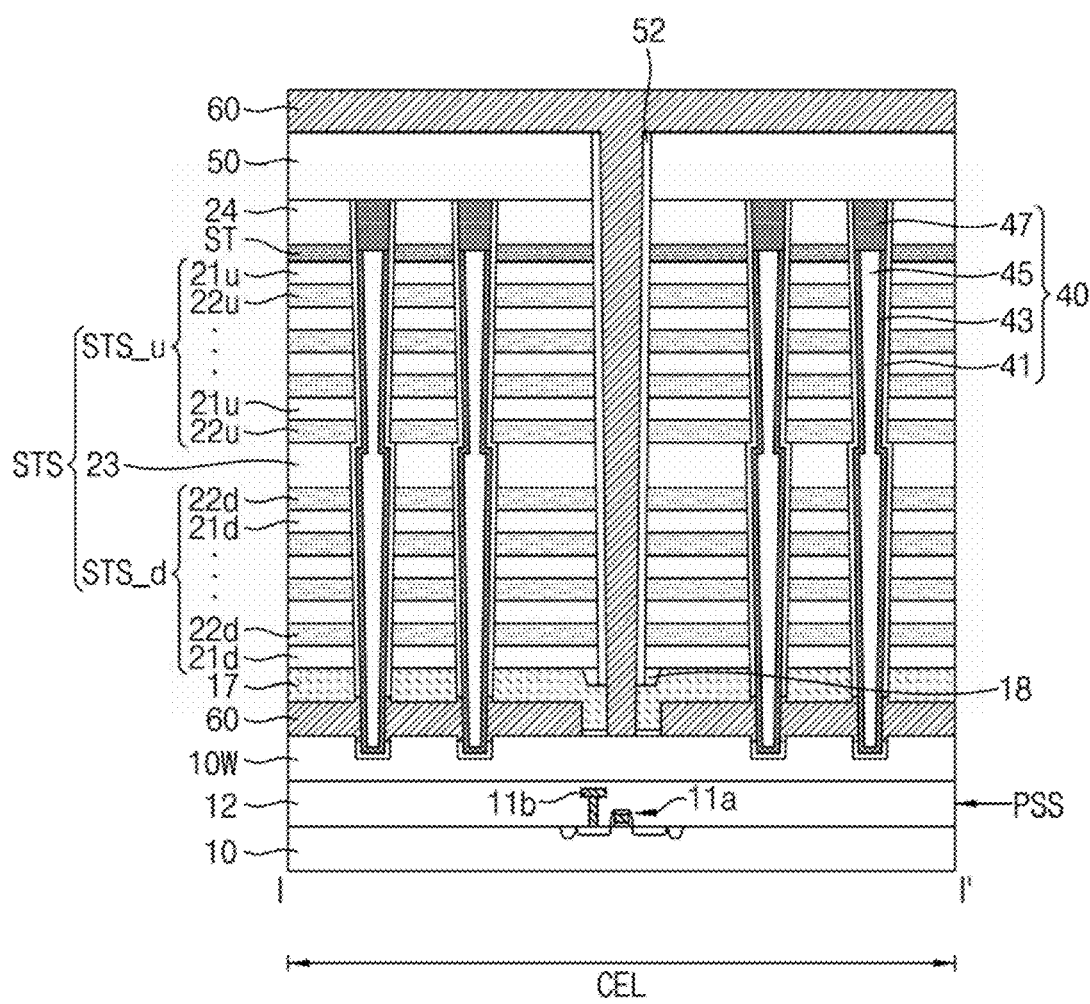
Figure 21:
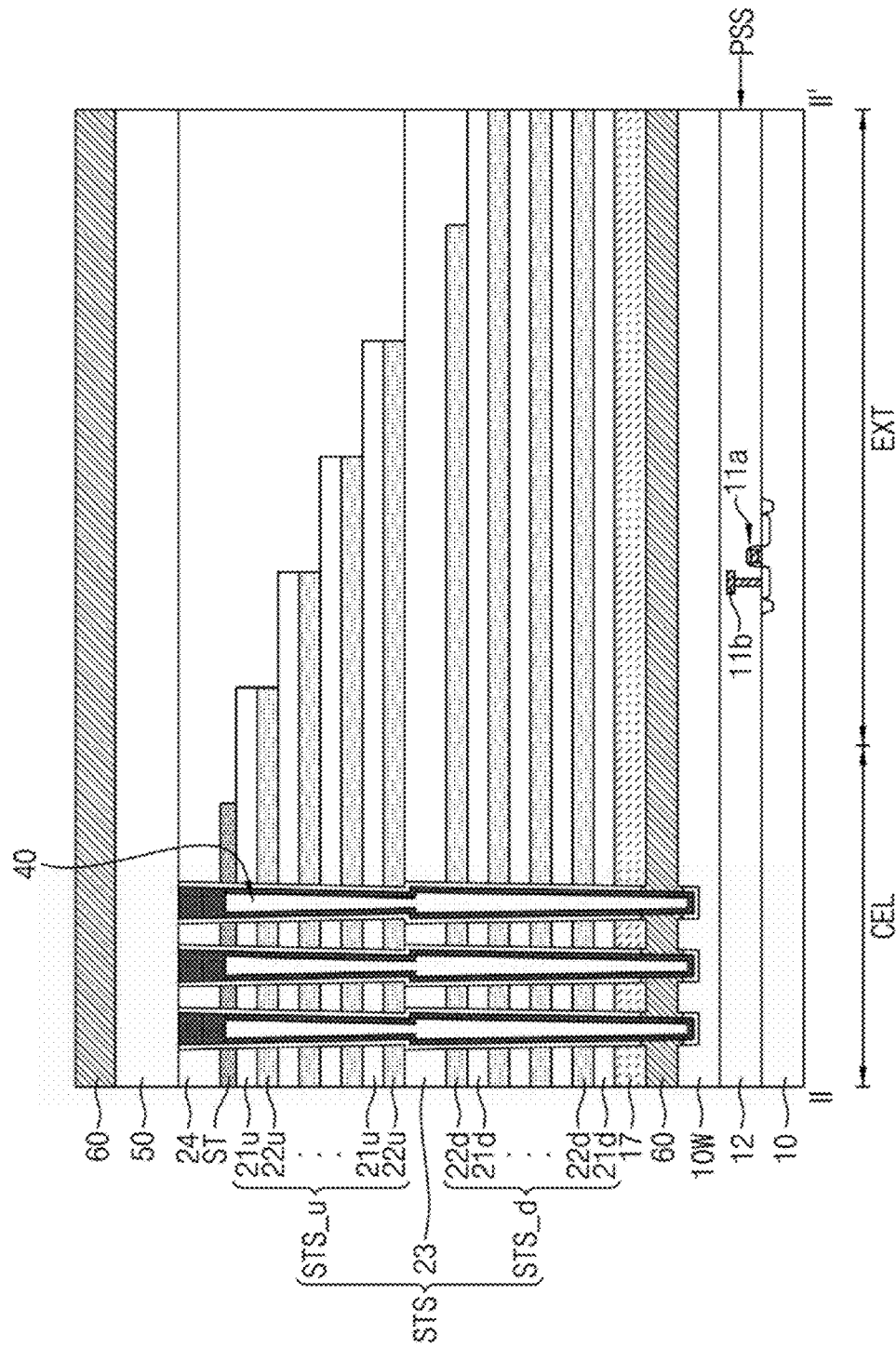

Referring to FIGS. 20 and 21, the method may include forming a conductive layer 60 in the horizontal through region HT and the vertical through region VT2. The conductive layer 60 may fill the horizontal through region HT, and may cover a side surface of the vertical through region VT2 to a uniform thickness or may fill the vertical through region VT2. An air gap or a core may be formed at a portion of the conductive layer 60 filling the horizontal through region HT. The conductive layer 60 may directly cover a side surface of the channel pattern 43. In an implementation, the conductive layer 60 may be formed using chemical vapor deposition (CVD) or atomic layer deposition (ALD). The conductive layer 60 may be a semiconductor layer doped with an impurity. In an implementation, the conductive layer 60 may include polysilicon doped with an N-type impurity.

Figure 22:
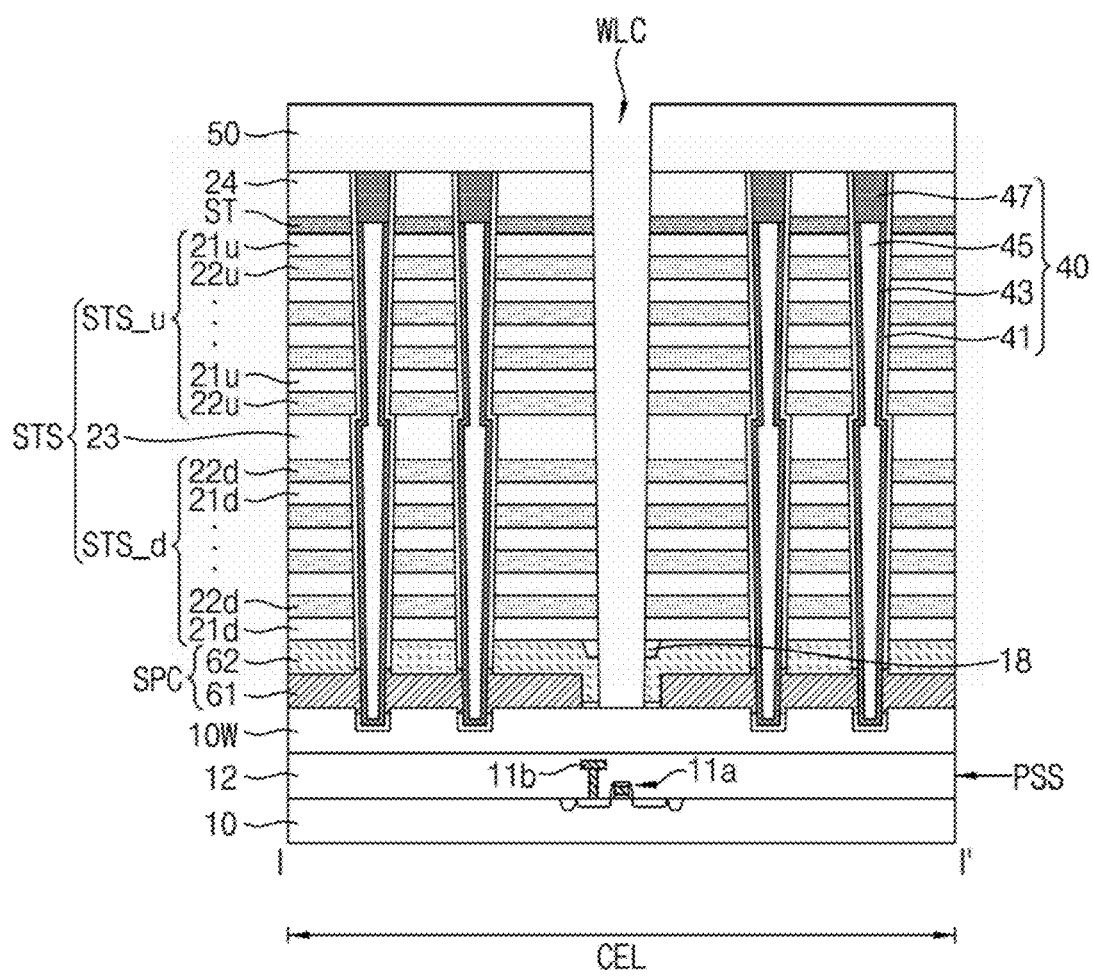
Figure 23:
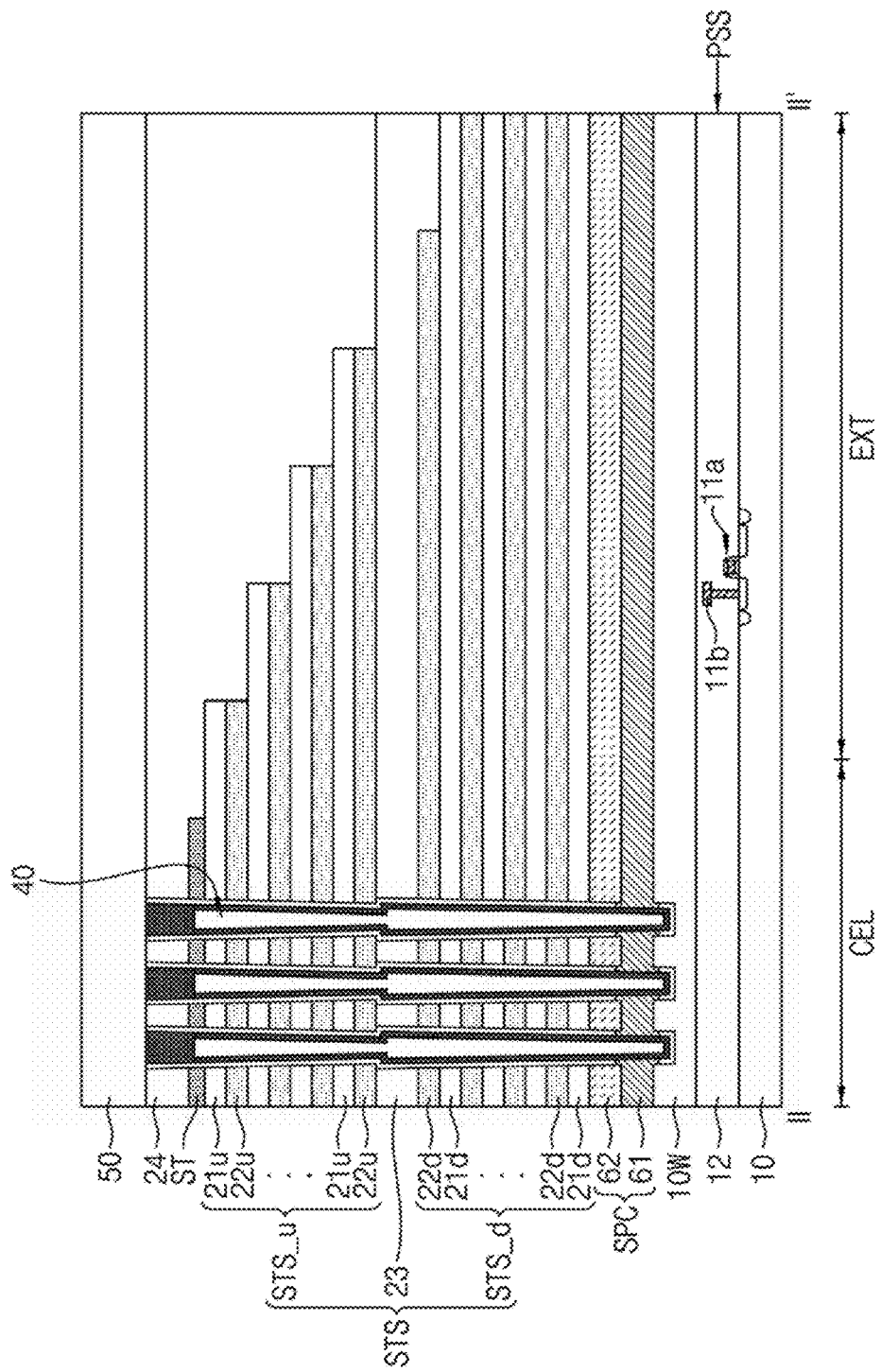

Referring to FIGS. 22 and 23, the method may include removing a portion of the conductive layer 60 and the sacrificial spacer 52, thereby forming a source conductive pattern SPC and a word line cut WLC. As a portion filling the vertical through region VT2 from among portions of the conductive layer 60 is removed, a lower source conductive pattern 61 may be formed. The lower source conductive pattern 61 may be in the horizontal through region HT. During an isotropic etching process for the conductive layer 60, a portion of the source conductive layer 17 may also be etched. As the portion of the source conductive layer 17 is etched, an upper source conductive pattern 62 may be formed. The sacrificial spacer 52 may also be removed through an isotropic etching process. As the sacrificial spacer 52 is removed, the word line cut WLC may be formed. The word line cut WLC may extend through the source conductive pattern SPC, the stack structure STS, the stopper layer ST, the upper mold layer 24 and the first capping layer 50. The word line cut WLC may expose an inner side surface of the stack structure STS. The isotropic etching process for removing the portion of the conductive layer 60 may be performed using an etching recipe having etch selectivity with respect to the stack structure STS.

Figure 24:
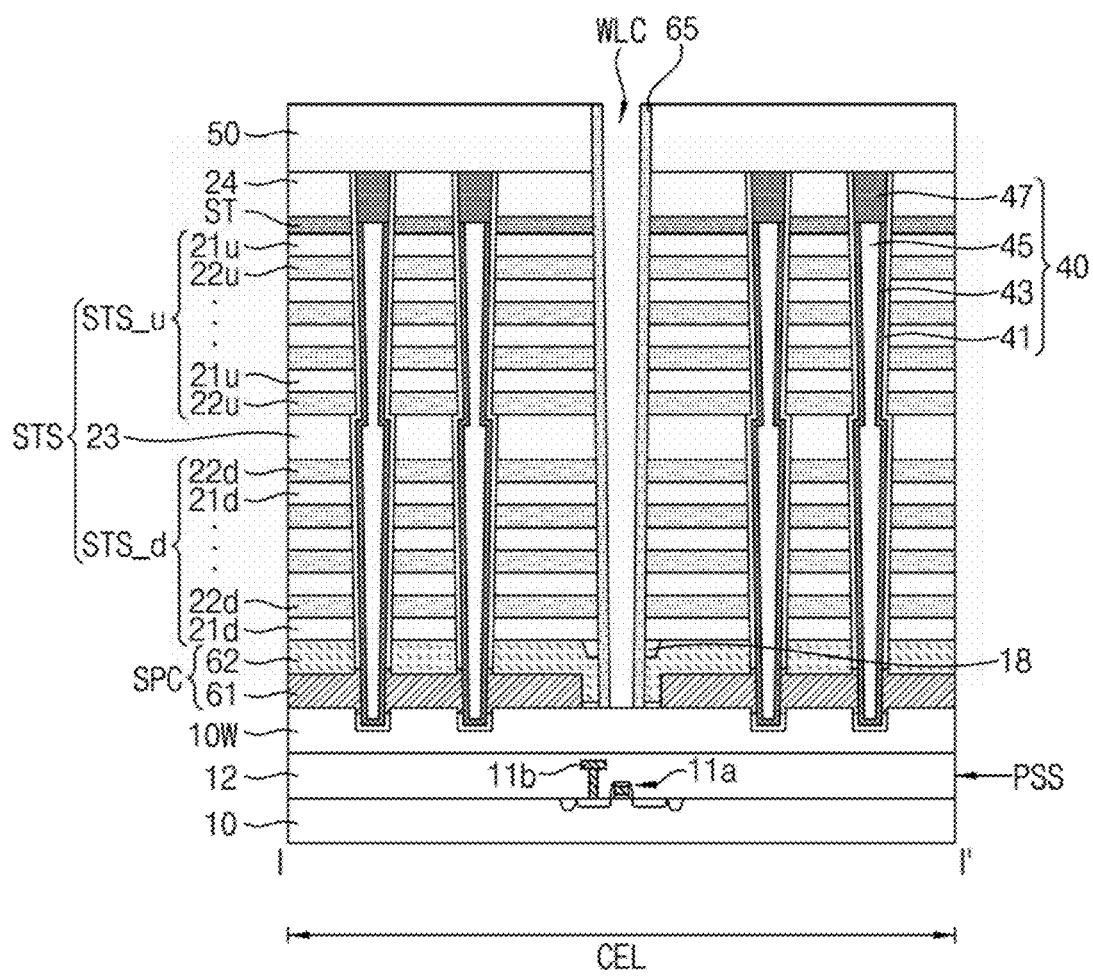

Referring to FIG. 24, the method may include forming a spacer 65 in the word line cut WLC. Formation of the spacer 65 may include forming an insulating layer conformally covering a side wall of the word line cut WLC, the upper surface of the horizontal semiconductor layer 10W and the upper surface of the first capping layer 50, and then anisotropically etching the insulating layer, thereby exposing the upper surface of the horizontal semiconductor layer 10W through the word line cut WLC. The spacer 65 may cover the side wall of the word line cut WLC. In an implementation, the spacer 65 may cover the inner side surface of the stack structure STS exposed by the word line cut WLC. In an implementation, the spacer 65 may cover an inner side surface of the stopper layer ST, an inner side surface of the upper mold layer 24, and an inner side surface of the first capping layer 50, which are exposed by the word line cut WLC. The spacer 65 may include the same material as the upper sacrificial layer 22u and the lower sacrificial layer 22d. In an implementation, the spacer 65 may include silicon nitride.

Figure 25:
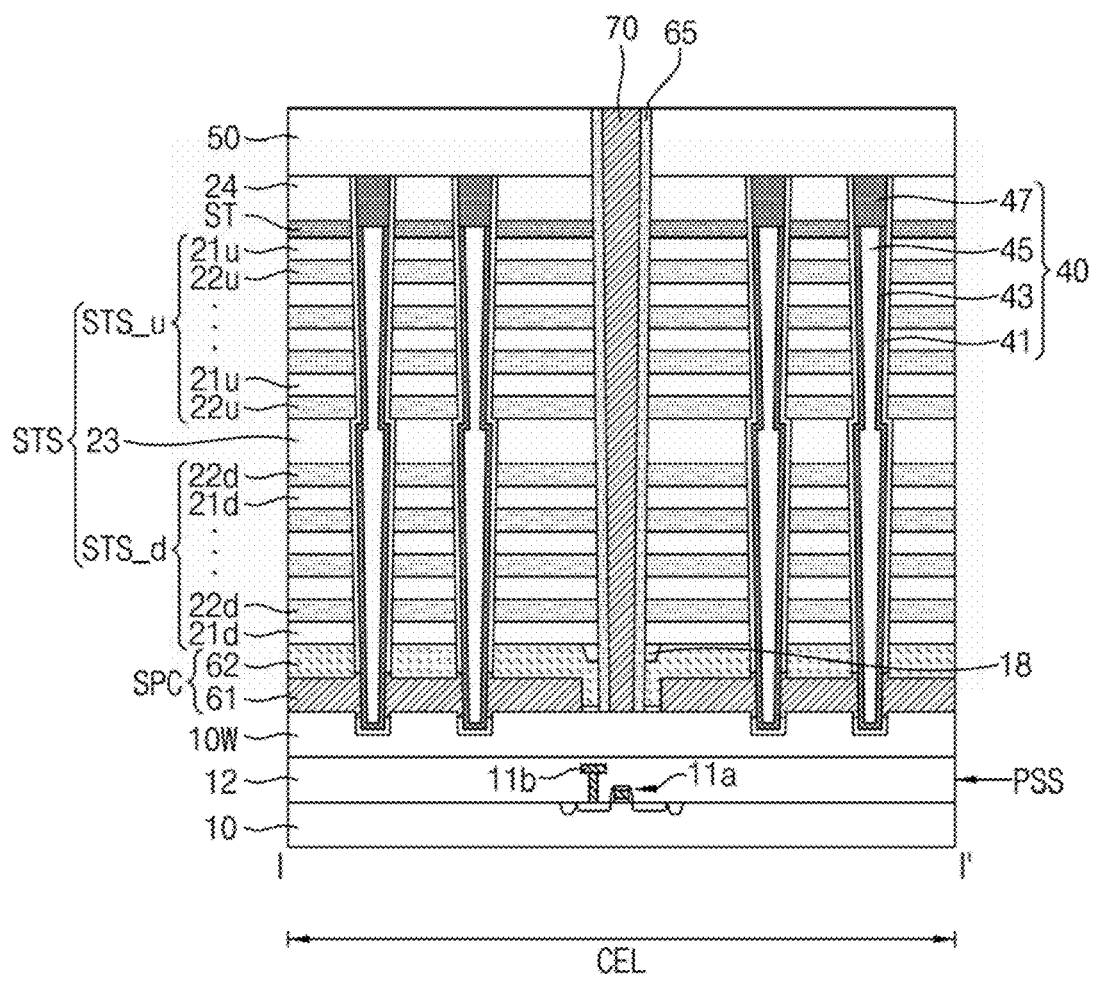

Referring to FIG. 25, the method may include forming a sealing layer 70 in the word line cut WLC. The sealing layer 70 may be formed on the spacer 65 in the word line cut WLC. The sealing layer 70 may completely fill a space in the word line cut WLC. In an implementation, the sealing layer 70 may include polysilicon. Formation of the sealing layer 70 may include forming polysilicon such that the polysilicon covers the side wall of the word line cut WLC and the first capping layer 50, and removing the polysilicon on the first capping layer 50 through a planarization process such as chemical mechanical polishing (CMP), thereby exposing the upper surface of the first capping layer 50.

Figure 26:
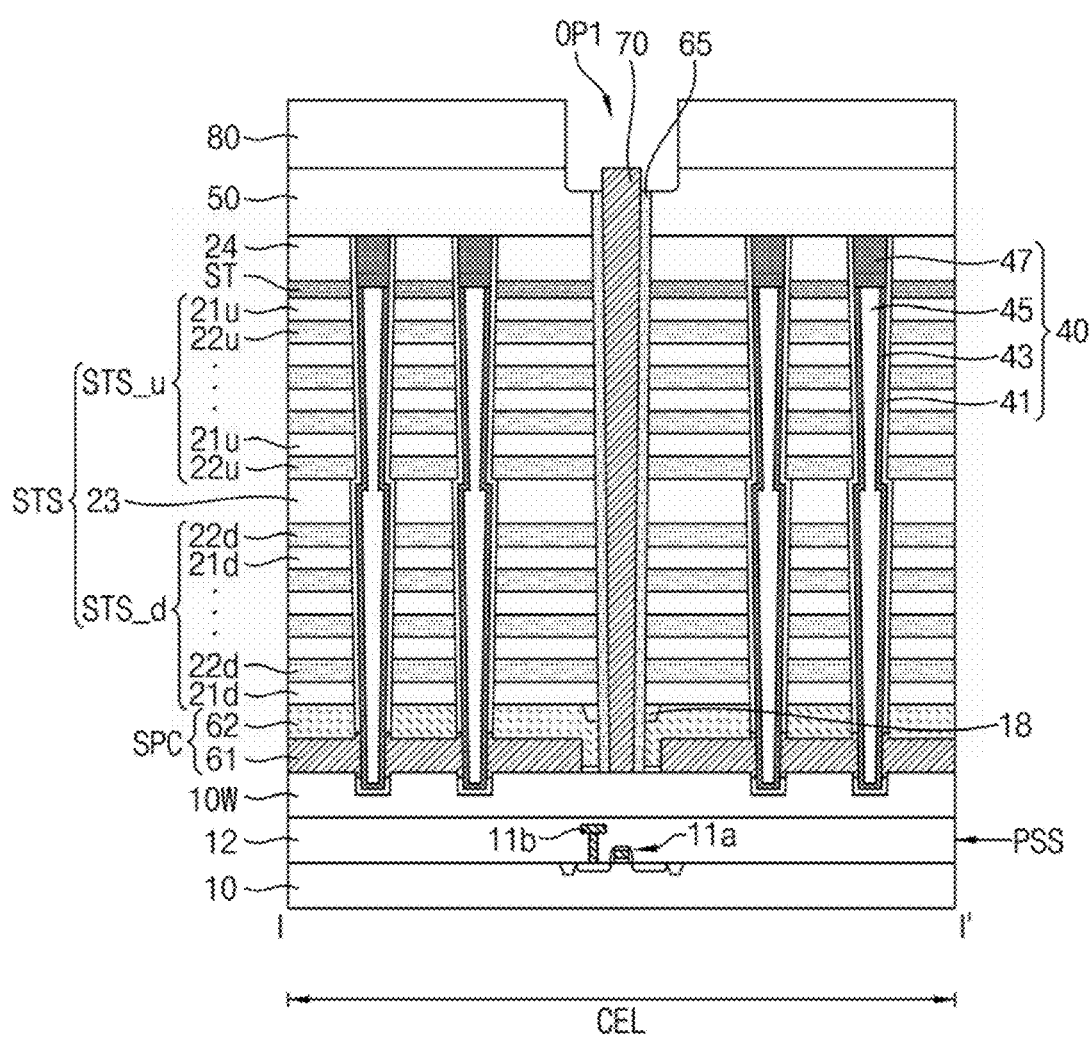

Referring to FIG. 26, the method may include forming a second capping layer 80 on the first capping layer 50, the spacer 65, and the sealing layer 70, and forming an upper opening OP1 exposing the first capping layer 50, the spacer 65, and the sealing layer 70. The second capping layer 80 may include a material having etch selectivity with respect to the sealing layer 70. In an implementation, the second capping layer 80 may include silicon oxide. After formation of the second capping layer 80, the upper opening OP1 may be formed by forming a mask pattern on the second capping layer 80, and performing an isotropic or anisotropic etching process for the second capping layer 80 using the mask pattern as an etch mask. By the etching process for the second capping layer 80, portions of the first capping layer 50 and the spacer 65 may also be removed together with the second capping layer 80. The etching process for the second capping layer 80 may be an etching process having etch selectivity with respect to the sealing layer 70. Accordingly, the sealing layer 70 may not be etched during etching of the first capping layer 50 and the spacer 65 by the etching process. As a result, in the upper opening OP1, an upper portion of the sealing layer 70 may protrude upwards from a bottom surface of the upper opening OP1.

Figure 27:
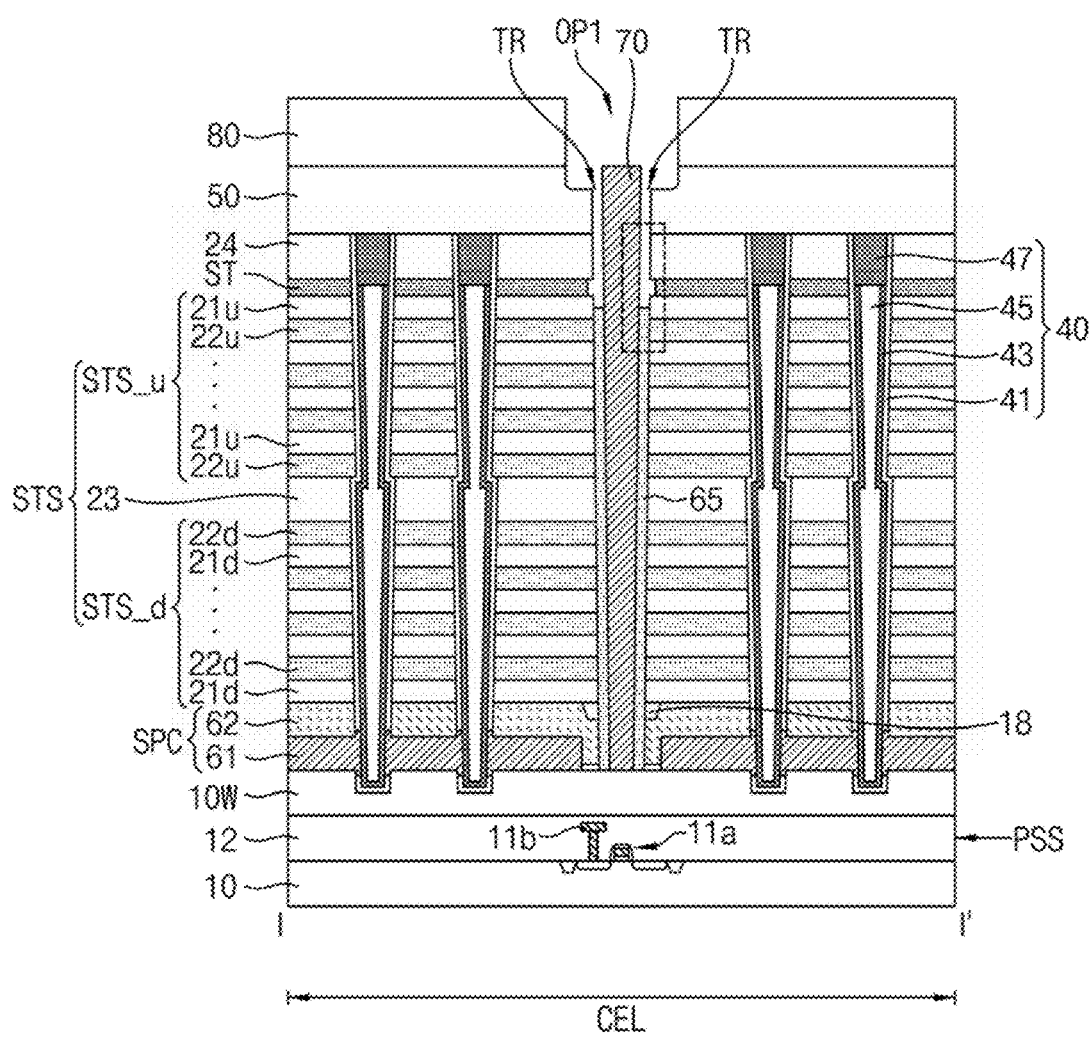
Figure 28:
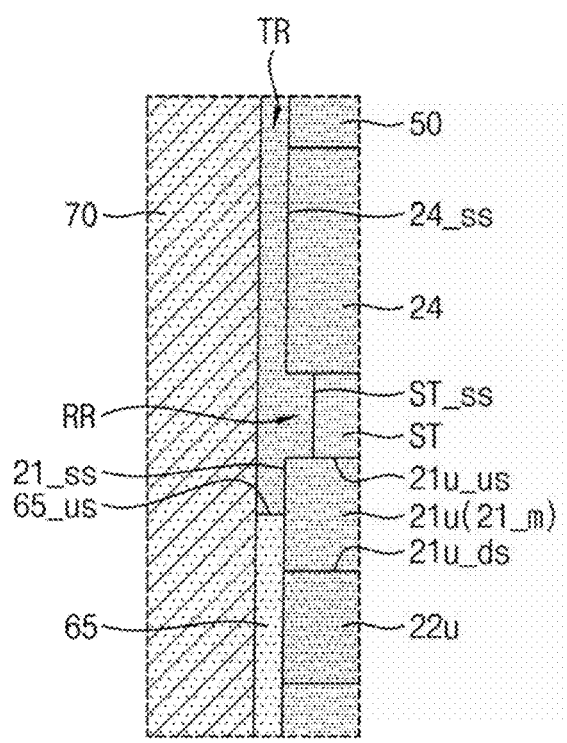

Referring to FIGS. 27 and 28, the method may include etching a portion of the spacer 65 exposed through the upper opening OP1, thereby forming a trench TR. The spacer 65 (e.g., a portion of the spacer 65) may be removed through an isotropic etching process or an etch-back process. The isotropic etching process or the etch-back process may use an etching recipe having etch selectivity with respect to the sealing layer 70, the upper insulating layer 21u, the first capping layer 50, and the second capping layer 80.

The spacer 65 may be etched until an upper surface 65_us of the spacer 65 is lower than an upper surface of the upper stack structure STS_u, e.g., a top surface 21u_us of the uppermost upper insulating layer 21_m (or a bottom surface of the stopper layer ST) with reference to the upper surface of the substrate 10. In an implementation, the upper surface 65_us of the spacer 65 may be higher than a bottom surface 21u_ds of the uppermost upper insulating layer 21_m of the upper stack structure STS_u (or a top surface of the uppermost upper sacrificial layer 22u) with reference to the upper surface of the substrate 10. The trench TR may be formed to expose the sealing layer 70, the spacer 65, the uppermost upper insulating layer 21_m, the stopper layer ST, and the upper mold layer 24.

By the isotropic etching process for etching the spacer 65, a portion of the stopper layer ST, which includes the same material as the spacer 65 or a material having low etch selectivity with respect to the spacer 65, may also be etched together with the spacer 65. As the portion of the stopper layer ST is etched, an inner side surface ST_ss of the stopper layer ST may be offset (e.g., recessed) from an inner side surface 21_ss of the uppermost upper insulating layer 21_m and an inner side surface 24_ss of the upper mold layer 24. As such, a recess RR, in which the trench TR extends horizontally toward the inner side surface ST_ss of the stopper layer ST, may be formed.

Figure 29:
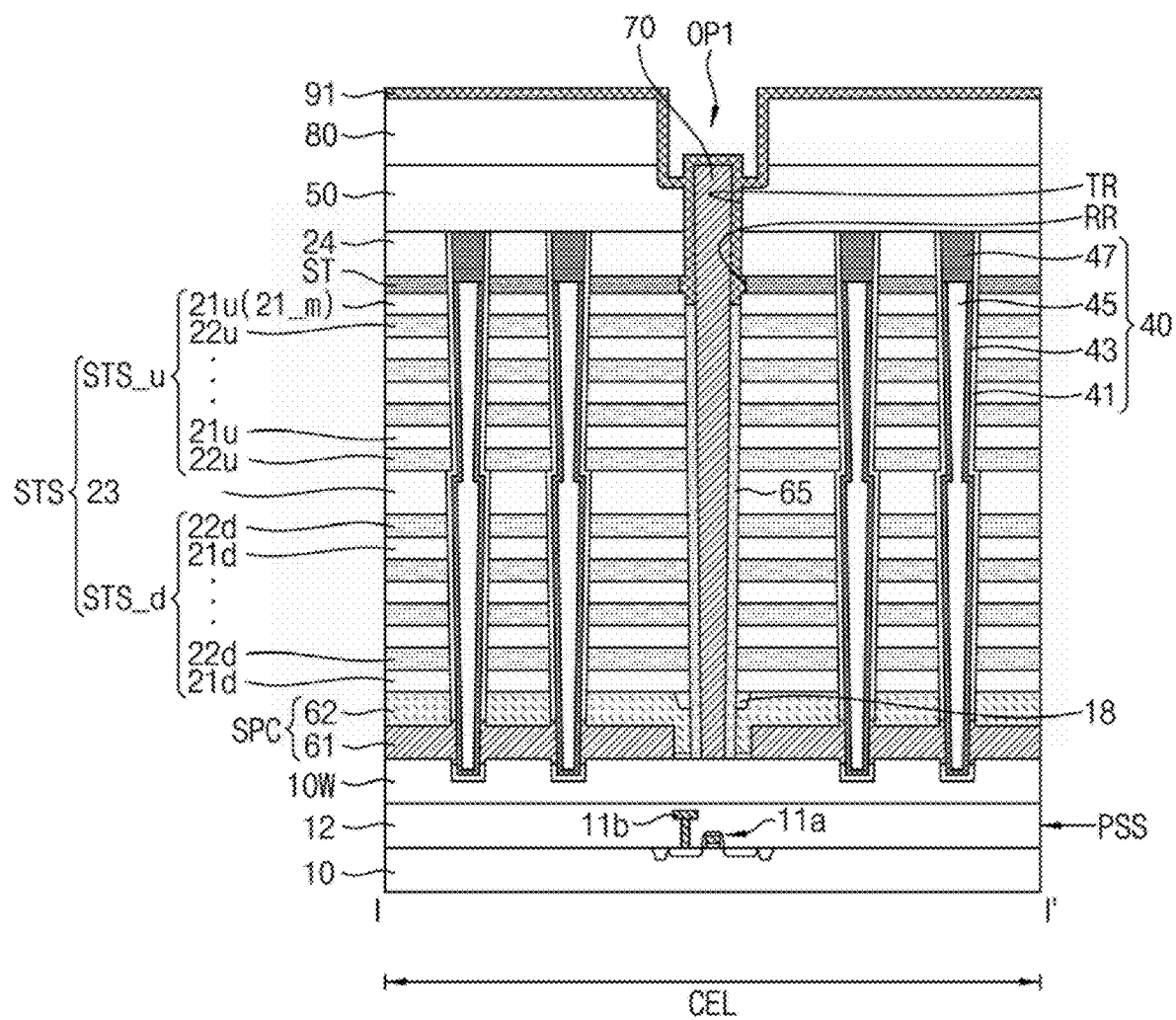

Referring to FIG. 29, the method may include forming a trench capping layer 91 filling the trench TR. In an implementation, the trench capping layer 91 may be formed using chemical vapor deposition (CVD) or atomic layer deposition (ALD). The trench capping layer 91 may include a material having etch selectivity with respect to the lower sacrificial layer 22d and the upper sacrificial layer 22u. In an implementation, the trench capping layer 91 may include the same material as the lower insulating layer 21d and the upper insulating layer 21u. In an implementation, the trench capping layer 91 may include silicon oxide.

The trench capping layer 91 may conformally cover an upper surface of the second capping layer 80, an inner side surface of the upper opening OP1, and a bottom surface of the upper opening OP1. The trench capping layer 91 may conformally cover a surface of the upper portion of the sealing layer 70 protruding from the bottom surface of the upper opening OP1. The trench capping layer 91 may completely fill the trench TR and the recess RR. In an implementation, the trench capping layer 91 may incompletely fill the upper opening OP1 such that a residual space remains in the upper opening OP1. In the trench TR, the trench capping layer 91 may cover an upper surface of the spacer 65 while covering a side surface of the sealing layer 70. In an implementation, the trench capping layer 91 may cover an inner side surface of the uppermost upper insulating layer 21_m and the inner side surface of the upper mold layer 24 in the trench TR. The trench capping layer 91 may cover the inner side surface of the stopper layer ST, the top surface of the uppermost upper insulating layer 21_m, and a bottom surface of the upper mold layer 24 in the recess RR.

Figure 30:
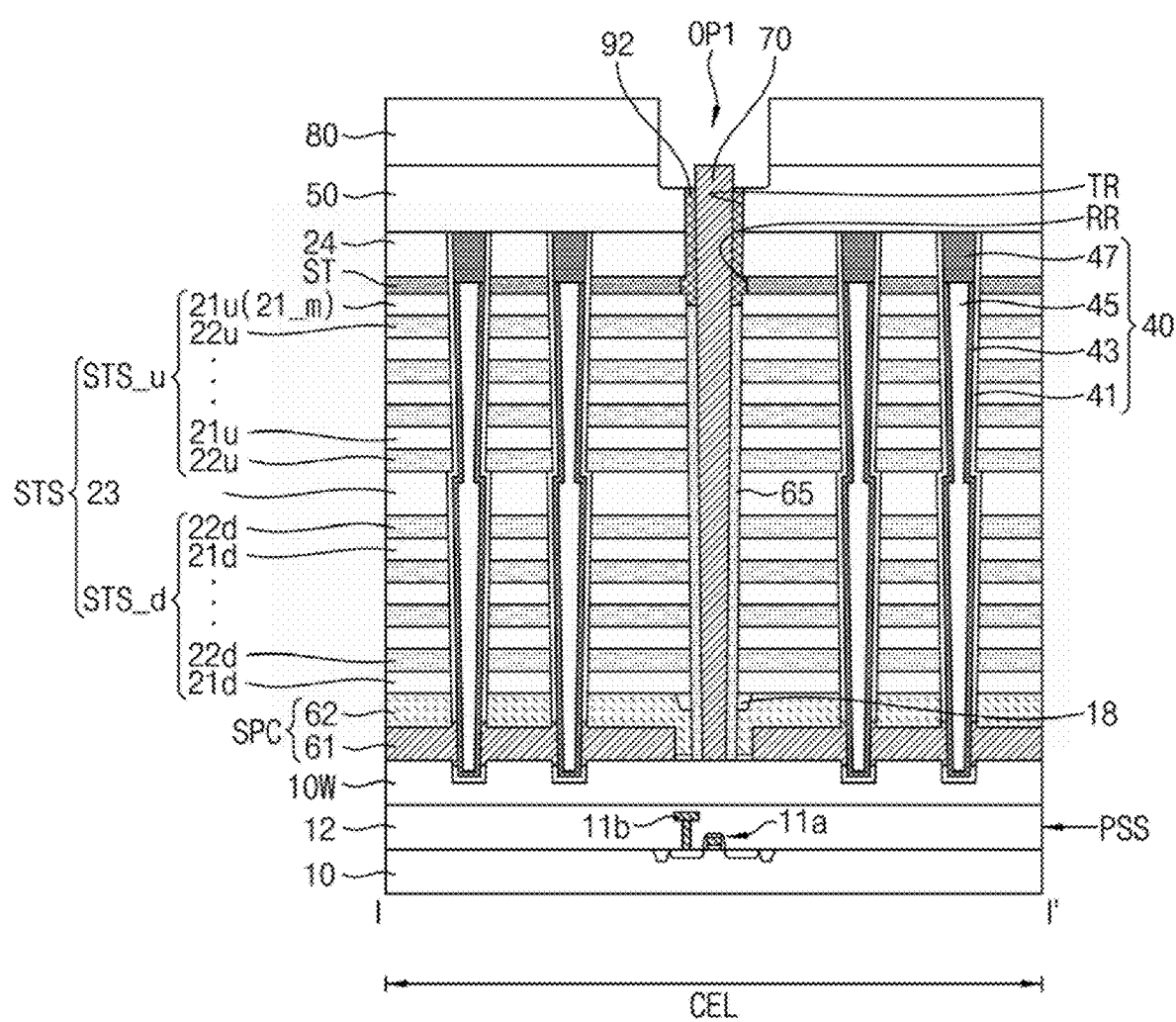

Referring to FIG. 30, the method may include partially removing the trench capping layer 91, thereby forming a trench capping pattern 92. The trench capping pattern 92 may be formed by removing a portion on the second capping layer 80 and a portion in the upper opening OP1 from among portions of the trench capping layer 91. As the portions of the trench capping layer 91 are removed, the upper surface of the second capping layer 80 may be exposed, and an inner side surface of the second capping layer 80, the inner side surface of the first capping layer 50, and a bottom surface of the first capping layer 50 may be exposed through the upper opening OP1. In an implementation, as the portions of the trench capping layer 91 are removed, the surface of the upper portion of the sealing layer 70 may be exposed. As the portions of the trench capping layer 81 are removed, a non-removed portion of the trench capping layer 81 may remain in the trench TR and the recess RR, thereby forming the trench capping pattern 92. The trench capping pattern 92 may be on the spacer 65. The trench capping pattern 92 may contact the upper surface of the spacer 65, the inner side and top surfaces of the uppermost upper insulating layer 21_m of the upper stack structure STS_u, the inner side surface of the stopper layer ST, and the inner side and bottom surfaces of the upper mold layer 24. In an implementation, the trench capping pattern 92 may be formed by partially removing the trench capping layer 91 through an etch-back process.

Figure 31:
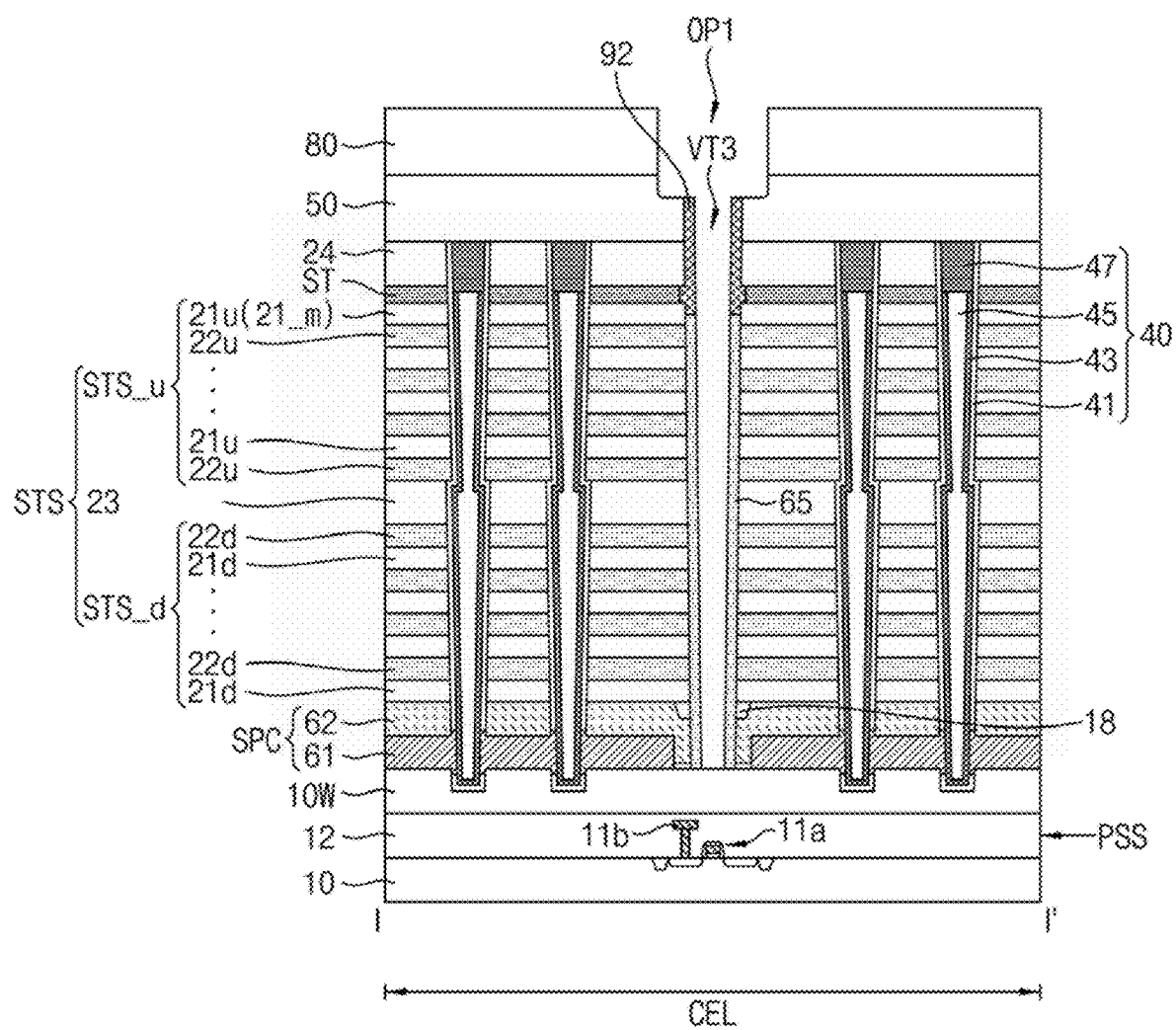

Referring to FIG. 31, the method may include removing the sealing layer 70. In an implementation, removal of the sealing layer 70 may be performed through an isotropic etching process. As the sealing layer 70 is removed, a vertical through region VT3 may be formed. The vertical through region VT3 may expose the upper surface of the horizontal semiconductor layer 10W, an inner side surface of the spacer 65, and an inner side surface of the trench capping pattern 92. The vertical through region VT3 may be connected to the upper opening OP1, thereby forming an integrated trench.

Figure 32:
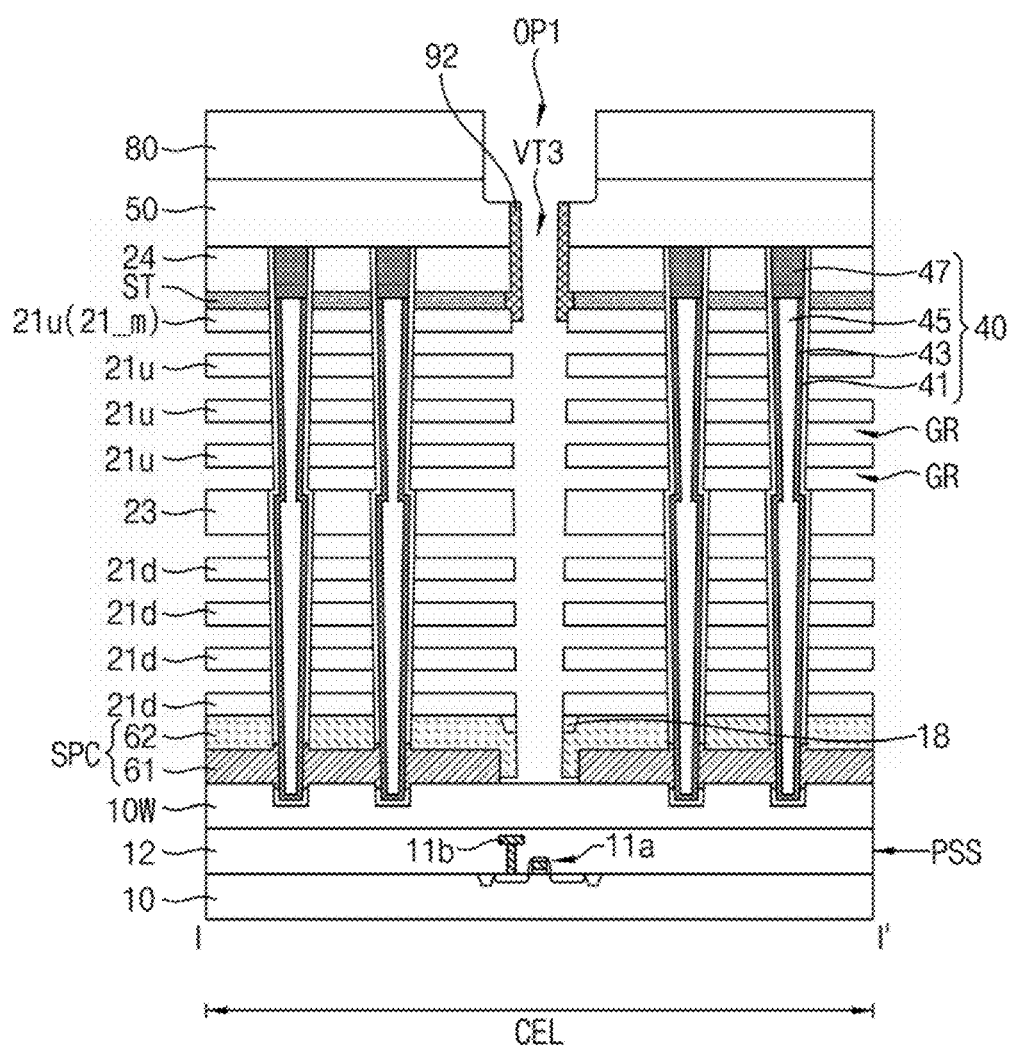

Referring to FIG. 32, the method may include removing the spacer 65, the lower sacrificial layer 22d, and the upper sacrificial layer 22u, which are exposed through the vertical through region VT3, thereby forming gate regions GR among the lower insulating layer 21d, the lower mold layer 23 and the upper insulating layer 21u. The gate regions GR may be formed by isotropically etching the spacer 65, the lower sacrificial layer 22d, and the upper sacrificial layer 22u using an etching recipe having etch selectivity with respect to the lower insulating layer 21d, the lower mold layer 23, the upper insulating layer 21u, the trench capping pattern 92, the information storage pattern 41, the source conductive pattern SPC, the buffer layer 18, the horizontal semiconductor layer 10W, the first capping layer 50, and the second capping layer 80. The spacer 65 may first be removed through an isotropic etching process and, as such, the width of the vertical through region VT3 may be increased. As the spacer 65 is removed, inner side surfaces of the upper and lower sacrificial layers 22u and 22d and the upper and lower insulating layers 21u and 21d may be exposed through the vertical through region VT3. In an implementation, a bottom surface of the trench capping pattern 92 may be exposed. As the spacer 65 is removed, and the upper and lower sacrificial layers 22u and 22d exposed by the vertical through region VT3 are removed, the gate regions GR may be formed. The gate regions GR may extend horizontally from the vertical through region VT3, and may expose portions of a side wall of the information storage pattern 41, respectively.

Figure 33:
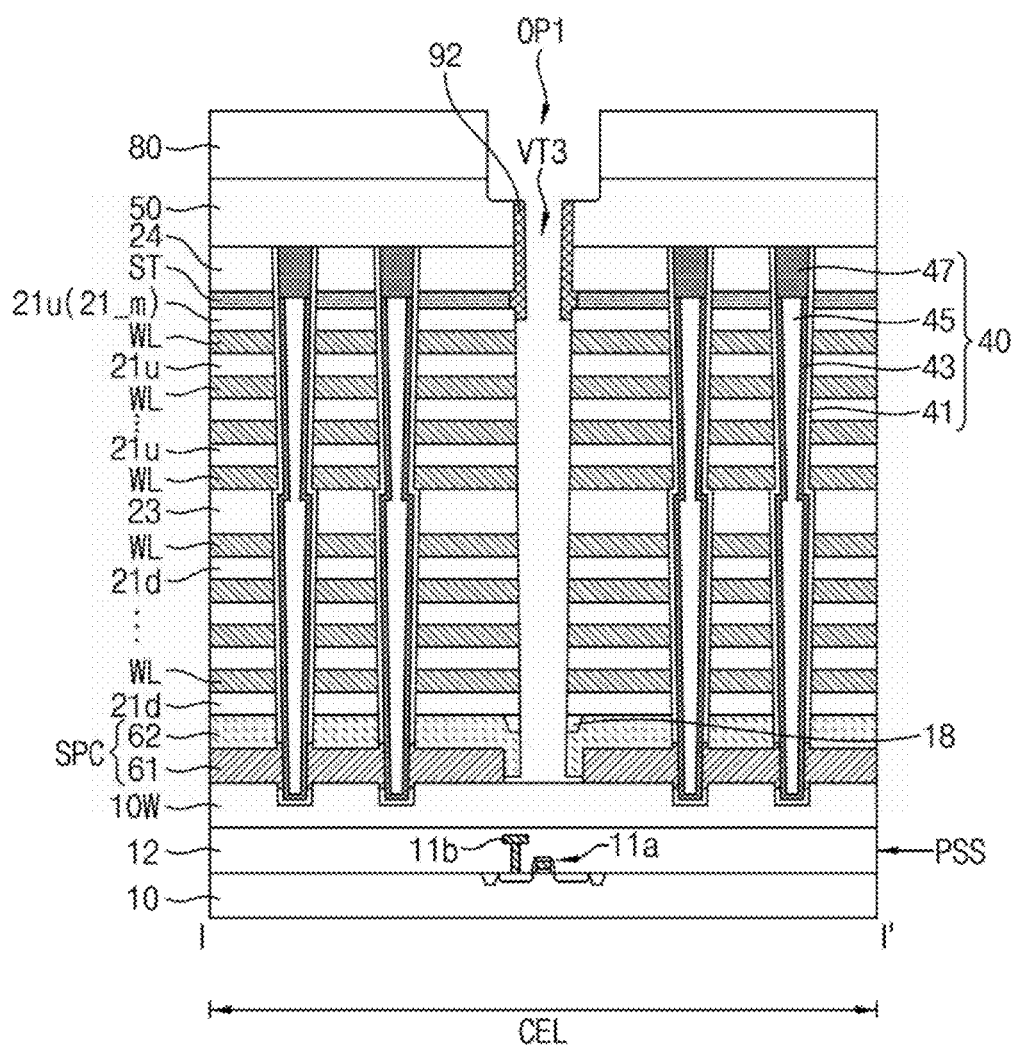

Referring to FIG. 33, the method may include forming a gate electrode WL filling each gate region GR. The gate electrode WL may also be referred to as a "word line". The gate electrode WL may completely fill or incompletely fill the gate region GR. In an implementation, formation of the gate electrode WL may include sequentially depositing a metal nitride (e.g., titanium nitride, tantalum nitride, or the like) or a metal (e.g., tungsten, aluminum, titanium, tantalum, or the like).

Figure 34:
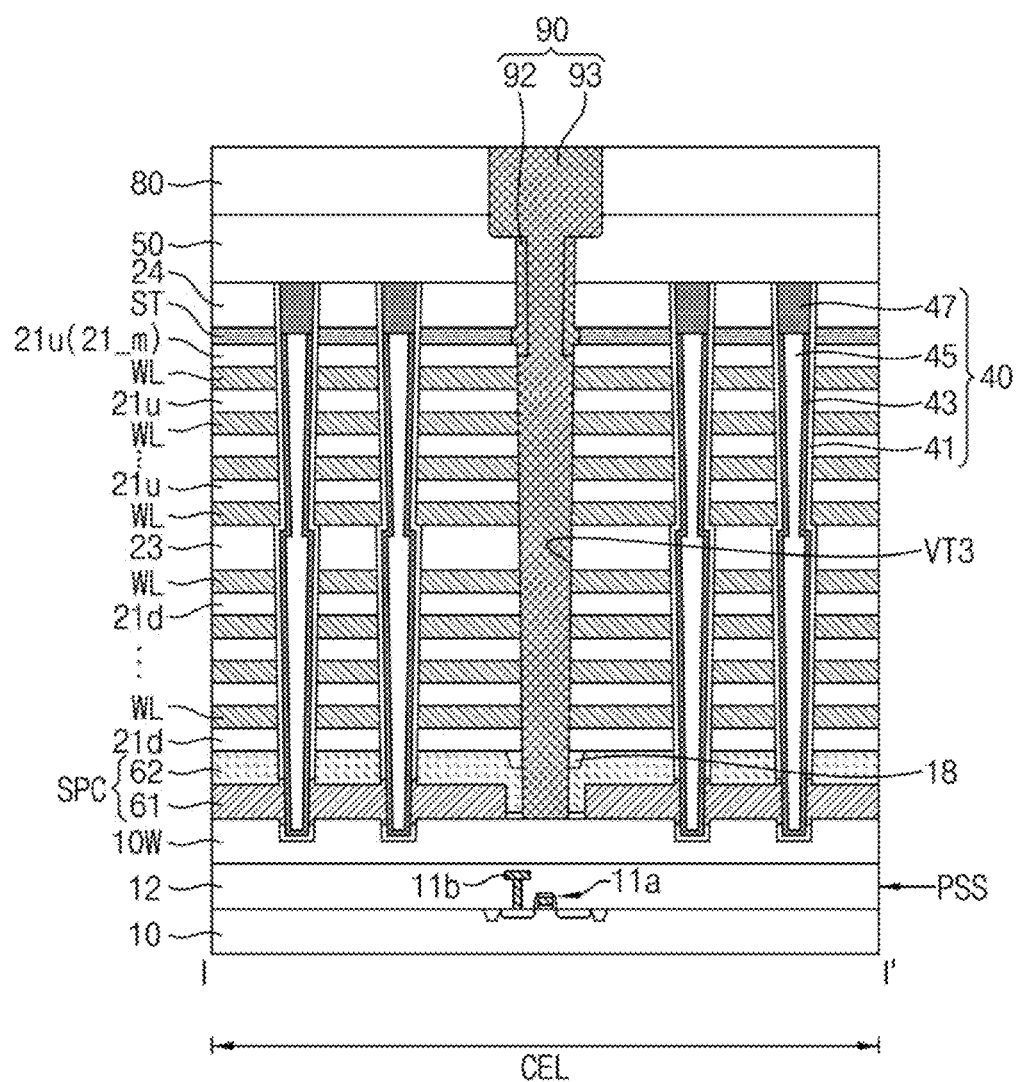

Referring to FIG. 34, the method may include forming a separation structure layer 93 filling the vertical through region VT3 and the upper opening OP1, thereby forming a word line separation structure 90 extending through the gate electrode WL and the upper and lower insulating layers 21u and 21d. In an implementation, the separation structure layer 93 may be formed through chemical vapor deposition (CVD) or atomic layer deposition (ALD). In an implementation, the separation structure layer 93 may include silicon oxide, silicon nitride, or silicon oxynitride.

The separation structure layer 93 may be formed to completely fill the vertical through region VT3 and the upper opening OP1. The separation structure layer 93 may be formed to cover inner side surfaces of the lower and upper insulating layers 21d and 21u, the lower mold layer 23 and the gate electrode WL exposed through the vertical through region VT3. The separation structure layer 93 may cover a surface of the trench capping pattern 92 exposed through the vertical through region VT3 and the upper opening OP1. In an implementation, the separation structure layer 93 may include the same material as the trench capping pattern 92, and may be integrated with the trench capping pattern 92, thereby forming the word line separation structure 90. In an implementation, the separation structure layer 93 may include an insulating material different from that of the trench capping pattern 92.

Figure 35:
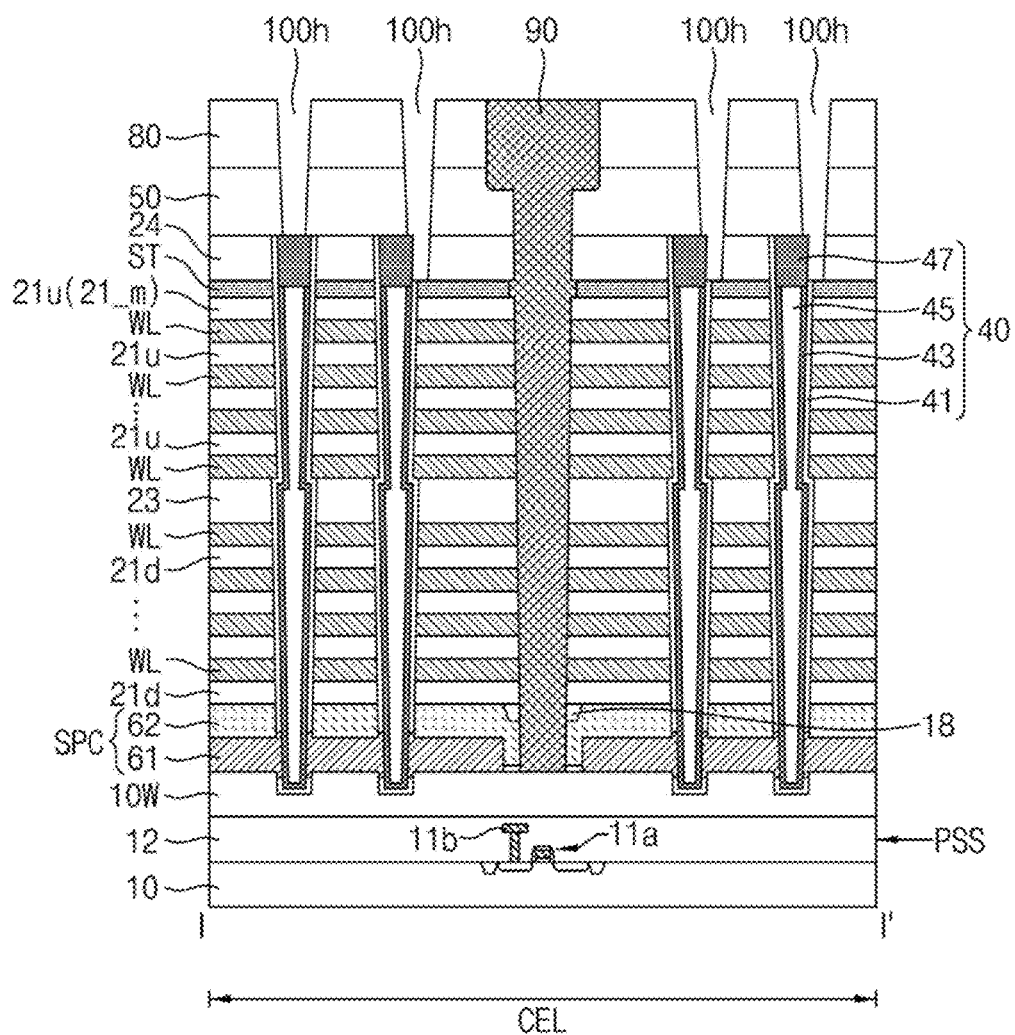
Figure 36:
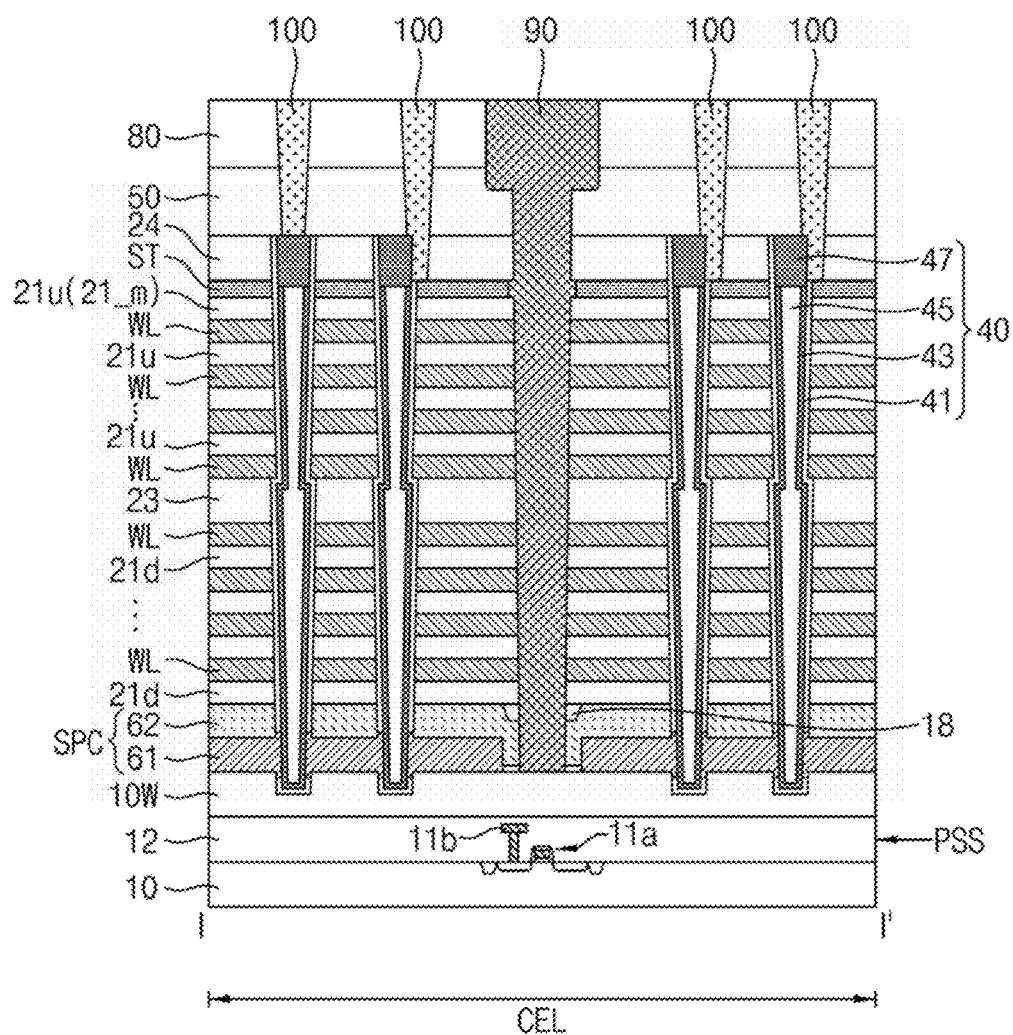

Referring to FIGS. 35 and 36, the method may include forming a bit line contact plug 100. Formation of the bit line contact plug 100 may include forming a through hole 100h extending through the first capping layer 50 and the second capping layer 80. The through hole 100h may be formed at a position vertically overlapping with the cell channel structure 40. In an implementation, the through hole 100h may be vertically aligned with the cell channel structure 40. The through hole 100h may expose an upper surface of the cell channel structure 40, that is, the conductive pad 47.

Figure 37:
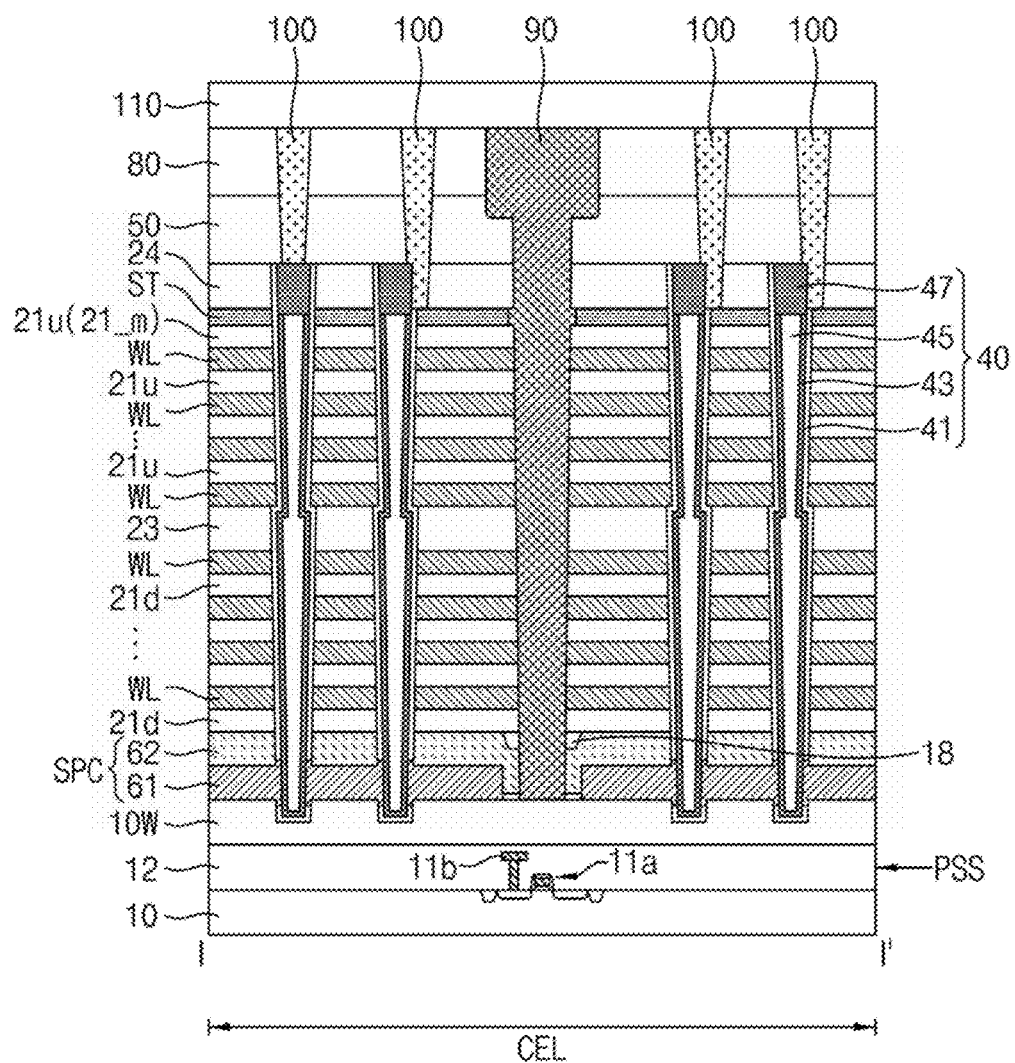

In an implementation, the through hole 100h may be formed through an anisotropic etching process using the conductive pad 47 and the stopper layer ST as an etch stop layer. In some cases, the through hole 100h may be misaligned from the cell channel structure 40 such that at least a portion of the through hole 100h does not (e.g., perfectly or completely) vertically overlap with the cell channel structure 40 (or the conductive pad 47 of the cell channel structure 40). In an implementation, the through hole 100h may be formed as a portion of the information storage pattern 41 of the cell channel structure 40 or a portion of the upper mold layer 24 is removed. When the through hole 100h is misaligned such that the through hole 100h extends through the upper mold layer 24, the anisotropic etching process for formation of the through hole 100h may use the stopper layer ST as an etch stop layer and, as such, the through hole 100h may extend only to an upper surface of the stopper layer ST (e.g., As a conductive material fills the through hole 100h, the bit line contact plug 100 may be formed. Referring to FIGS. 3 and 37, the method may include forming a third capping layer 110. After formation of the third capping layer 110, a gate contact plug 120 may be formed.

FIGS. 38 to 43 are cross-sectional views of stages in a semiconductor device manufacturing method according to an exemplary embodiment of the disclosure. The method may be performed after execution of the processes of FIGS. 8 to 13.

Figure 38:
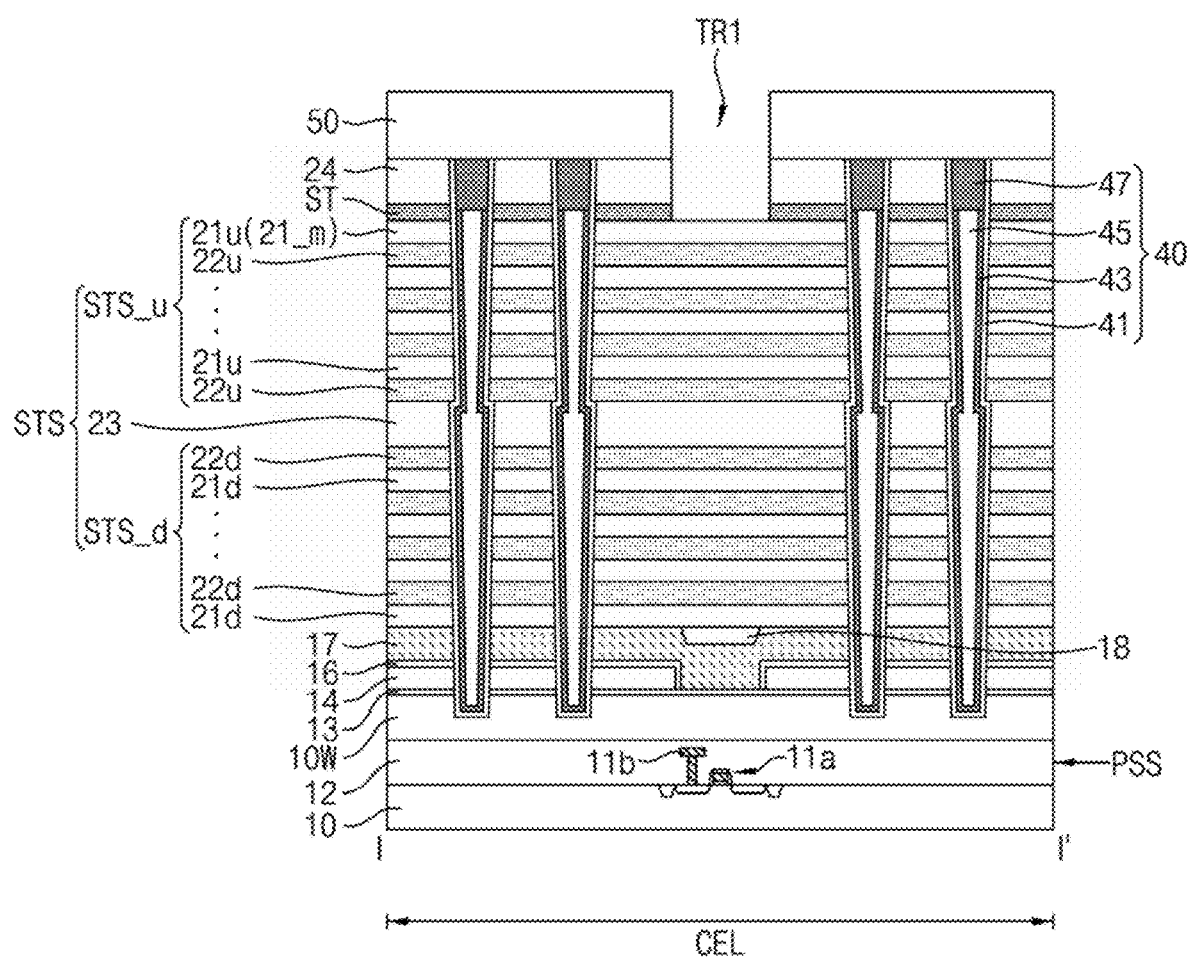
FIGS. 38 to 43 are cross-sectional views of stages in a method of manufacturing a semiconductor device according to an exemplary embodiment of the disclosure.

Referring to FIG. 38, the method may include removing portions of the first capping layer 50, the upper mold layer 24, and the stopper layer ST, thereby forming a first trench TR1. The first trench TR1 may be defined by the first capping layer 50, the upper mold layer 24, the stopper layer ST, and the uppermost upper insulating layer 21_m of the stack structure STS. Formation of the first trench TR1 may include forming a mask pattern at the first capping layer 50, and performing an anisotropic etching process using the mask pattern as an etch mask. The anisotropic etching process may use the uppermost upper insulating layer 21_m of the stack structure STS as an etch stop layer.

Figure 39:
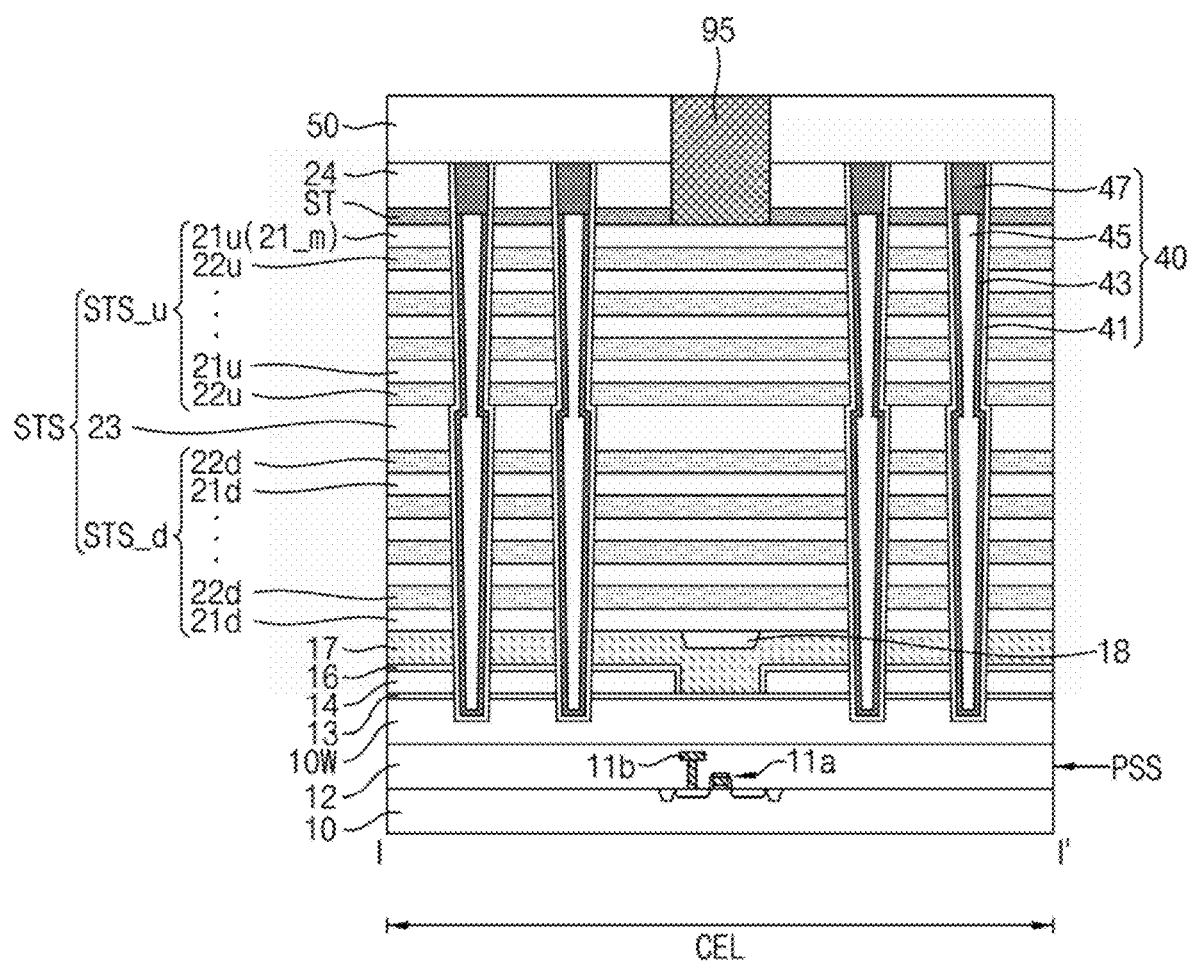

Referring to FIG. 39, the method may include forming a stopper capping pattern 95 filling the first trench TR1. Formation of the stopper capping pattern 95 may include forming an insulating material covering the first capping layer 50 while filling the first trench TR1, and then removing the insulating material on the first capping layer 50. In an implementation, removal of the insulating material may include performing a chemical mechanical polishing (CMP) process until the first capping layer 50 is exposed. The stopper capping pattern 95 may include a material having etch selectivity with respect to the stopper layer ST, the lower sacrificial layer 22d, and the upper sacrificial layer 22u. For example, the stopper capping pattern 95 may include silicon oxide.

Figure 40:
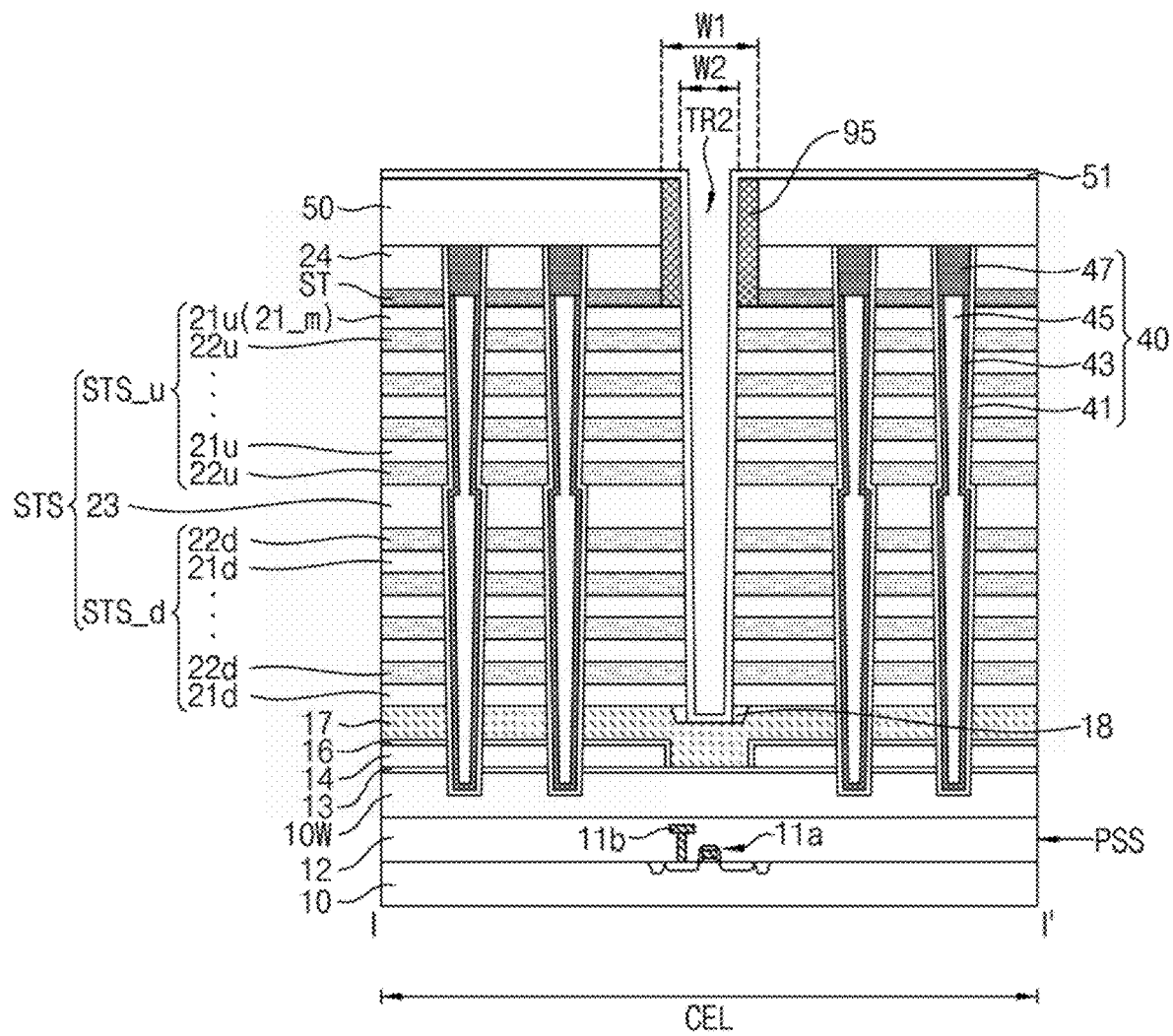

Referring to FIG. 40, the method may include forming a second trench TR2 extending through the stopper capping pattern 95 and the stack structure STS. The second trench TR2 may be formed through an anisotropic etching process using the buffer layer 18 or the source conductive layer 17 as an etch stop layer. A horizontal width W2 of the second trench TR2 may be smaller than a horizontal width W1 of the stopper capping pattern 95. The second trench TR2 may expose an inner side surface of the stopper capping pattern 95, the inner side surface of the stack structure STS, and the top surface of the source conductive layer 17. The method may include forming a sacrificial spacer layer 51 in the second trench TR2. Formation of the sacrificial spacer layer 51 may be the same process as descried with reference to FIGS. 14 and 15.

Figure 41:
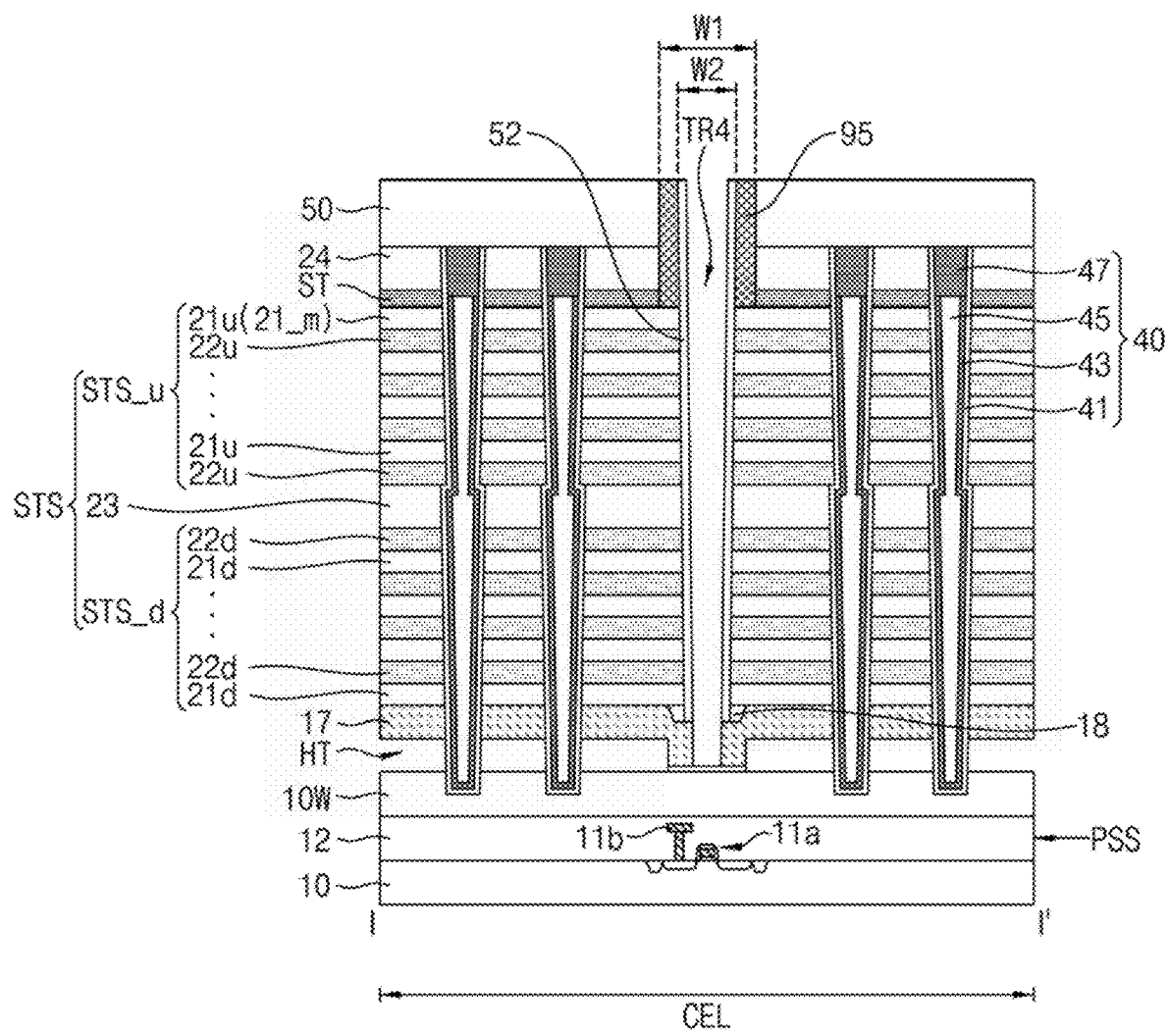

Referring to FIG. 41, the method may include forming a sacrificial spacer 52, forming a vertical through region TR4, and forming a horizontal through region HT. In addition, the method may include removing a portion of the information storage pattern 41 exposed by the horizontal through region HT, thereby exposing a portion of the side surface of the channel pattern 43. Processes performed in a procedure of FIG. 41 may be identical or similar to the processes described with reference to FIGS. 16 to 19.

Figure 42:
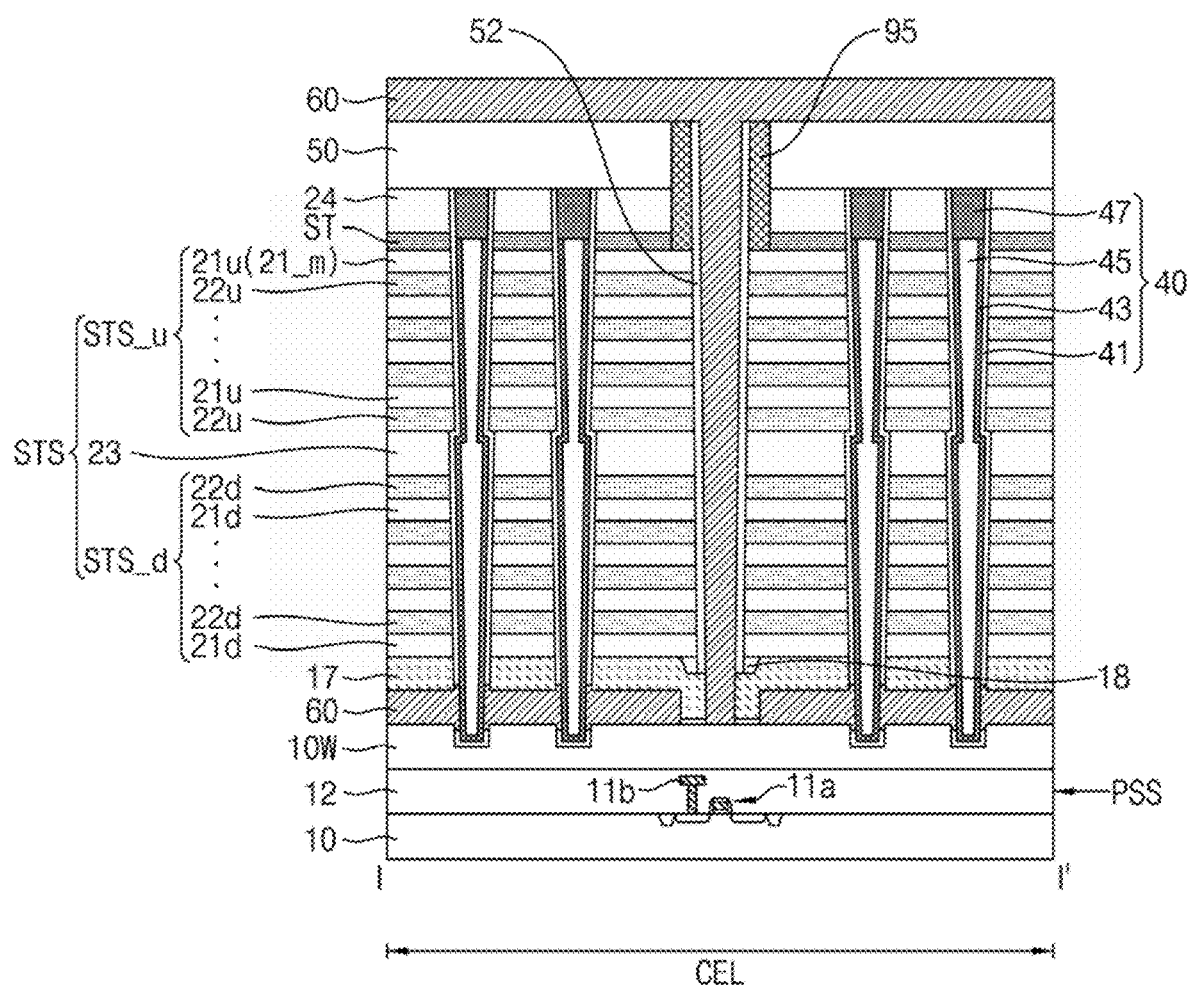

Referring to FIG. 42, the method may include forming a conductive layer 60 in the horizontal through region HT and the vertical through region TR4. A process performed in a procedure of FIG. 42 may be identical or similar to the process described with reference to FIGS. 20 and 21.

Figure 43:
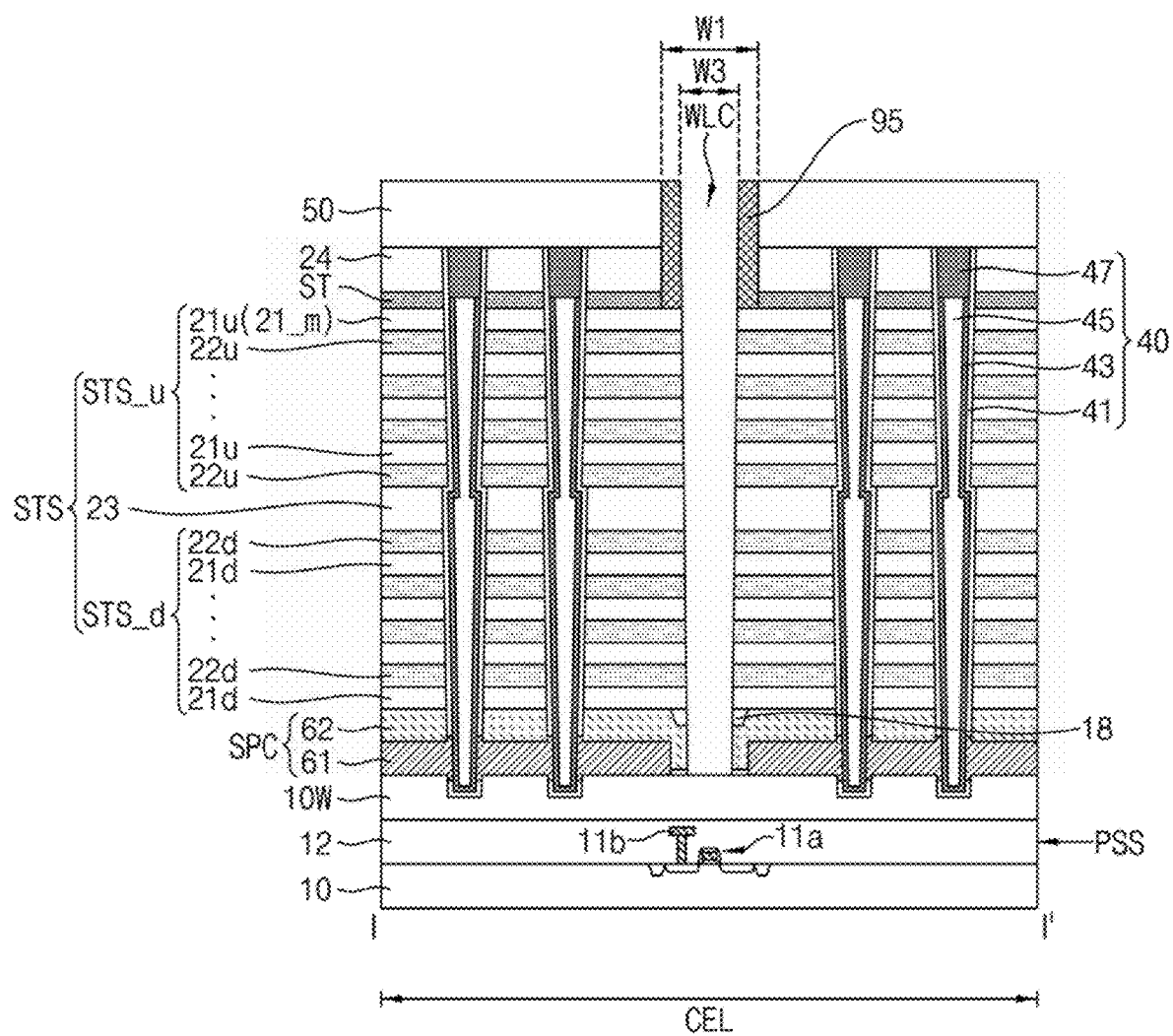

Referring to FIG. 43, the method may include forming a source conductive pattern SPC, and forming a word line cut WLC. Processes performed in a procedure of FIG. 43 may be identical or similar to the processes described with reference to FIGS. 22 and 23. The embodiment of FIG. 43 may differ from the embodiment of FIGS. 22 and 23 in that this embodiment further includes the stopper capping pattern 95. In an implementation, the word line cut WLC may extend through the stopper capping pattern 95, and a horizontal width W3 of the word line cut WLC may be smaller than the horizontal width W1 of the stopper capping pattern 95.

Thereafter, referring to FIG. 7, the method may include removing the upper sacrificial layer 22u and the lower sacrificial layer 22d, forming an upper gate electrode WL_u and a lower gate electrode WL_d, and forming a word line separation structure 90_1. The processes performed in the procedure of FIG. 7 may be identical or similar to the processes described with reference to FIGS. 32 to 34. The word line separation structure 90_1 and the stopper capping pattern 95 may include the same material. In an implementation, the word line separation structure 90_1 and the stopper capping pattern 95 may include different materials.

Figure 44:
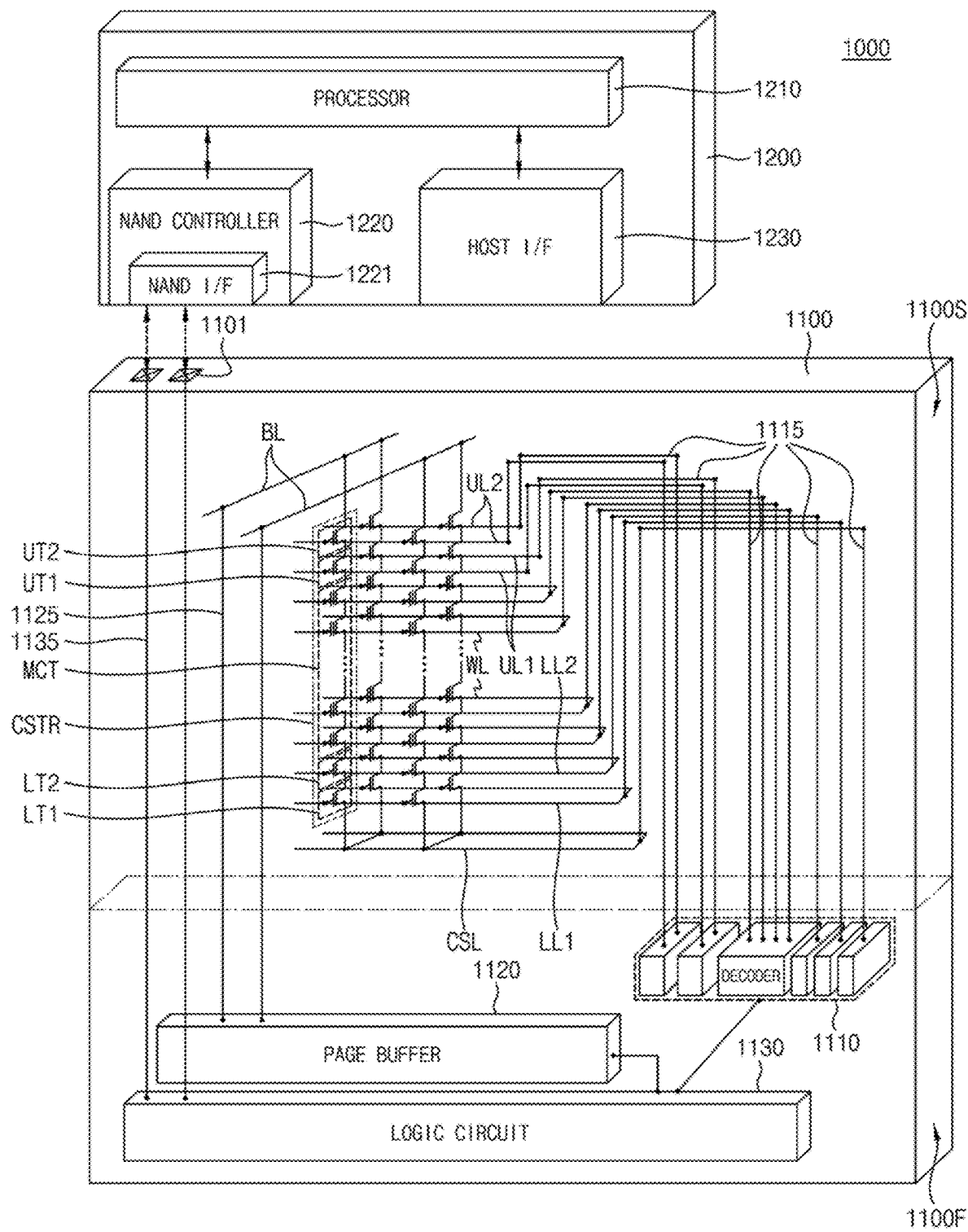
FIG. 44 is a diagram of an electronic system including a semiconductor device according to an exemplary embodiment of the disclosure.

FIG. 44 is a diagram of an electronic system including a semiconductor device according to an exemplary embodiment of the disclosure.

Referring to FIG. 44, an electronic system 1000 according to an exemplary embodiment of the disclosure may include a semiconductor device 1100, and a controller 1200 electrically connected to the semiconductor device 1100. The electronic system 1000 may be a storage device including one semiconductor device 1100 or a plurality of semiconductor devices 1100, or an electronic device including a storage device. In an implementation, the electronic system 1000 may be a solid state drive (SSD), a universal serial bus (USB) thumb drive, a computing system, a medical device, or a communication device which includes one semiconductor device 1100 or a plurality of semiconductor devices 1100.

The semiconductor device 1100 may be a non-volatile memory device. In an implementation, the semiconductor device 1100 may be a NAND flash memory device described with reference to FIGS. 1 to 7. The semiconductor device 1100 may include a first structure 1110F, and a second structure 1100S on the first structure 1110F. In an implementation, the first structure 1110F may be at one side of the second structure 1100S. The first structure 1110F may be a peripheral circuit structure including a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of lower transistors LT1 and LT2 and the number of upper transistors UT1 and UT2 may be diversely varied in accordance with embodiments.

In an implementation, the upper transistors UT1 and UT2 may include a string selection transistor, and the lower transistors LT1 and LT2 may include a ground selection transistor. The first and second gate lower lines LL1 and LL2 may be gate electrodes of the lower transistors LT1 and LT2, respectively. The word lines WL may be gate electrodes of the memory cell transistors MCT, respectively. The first and second gate upper lines UL1 and UL2 may be gate electrodes of the upper transistors UT1 and UT2, respectively.

The common source line CSL, the first and second gate lower lines LL1 and LL2, the word lines WL, and the first and second gate upper lines UL1 and UL2 may be electrically connected to the decoder circuit 1110 via first connecting lines 1115 extending from the first structure 1110F to the second structure 1100S. The bit lines BL may be electrically connected to the page buffer 1120 via second connecting lines 1125 extending from the first structure 1110F to the second structure 1100S.

In the first structure 1110F, the decoder circuit 1110 and the page buffer 1120 may perform a control operation for a selection memory cell transistor of at least one of the plurality of memory cell transistors MCT. The decoder circuit 1110 and the page buffer 1120 may be controlled by the logic circuit 1130. The semiconductor device 1100 may communicate with the controller 1200 through input/output pads 1101 electrically connected to the logic circuit 1130. The input/output pads 1101 may be electrically connected to the logic circuit 1130 via input/output connecting lines 1135 extending from the first structure 1110F to the second structure 1100S.

The controller 1200 may include a processor 1210, a NAND controller 1220, and a host interface 1230. In an implementation, the electronic system 1000 may include a plurality of semiconductor devices 1100. In this case, the controller 1200 may control the plurality of semiconductor devices 1100.

The processor 1210 may control overall operations of the electronic system 1000 including the controller 1200. The processor 1210 may operate in accordance with predetermined firmware, and may access the semiconductor device 1100 by controlling the NAND controller 1220. The NAND controller 1220 may include a NAND interface 1221 for processing communication with the semiconductor device 1100. A control command for controlling the semiconductor device 1100, data to be written in the memory cell transistors MCT of the semiconductor device 1100, data to be read out from the memory cell transistors MCT of the semiconductor device 1100, etc. may be transmitted through the NAND interface 1221. The host interface 1230 may provide a communication function between the electronic system 1000 and an external host. Upon receiving a control command from an external host via the host interface 1230, the processor 1210 may control the semiconductor device 1100 in response to the control command.

Figure 45:
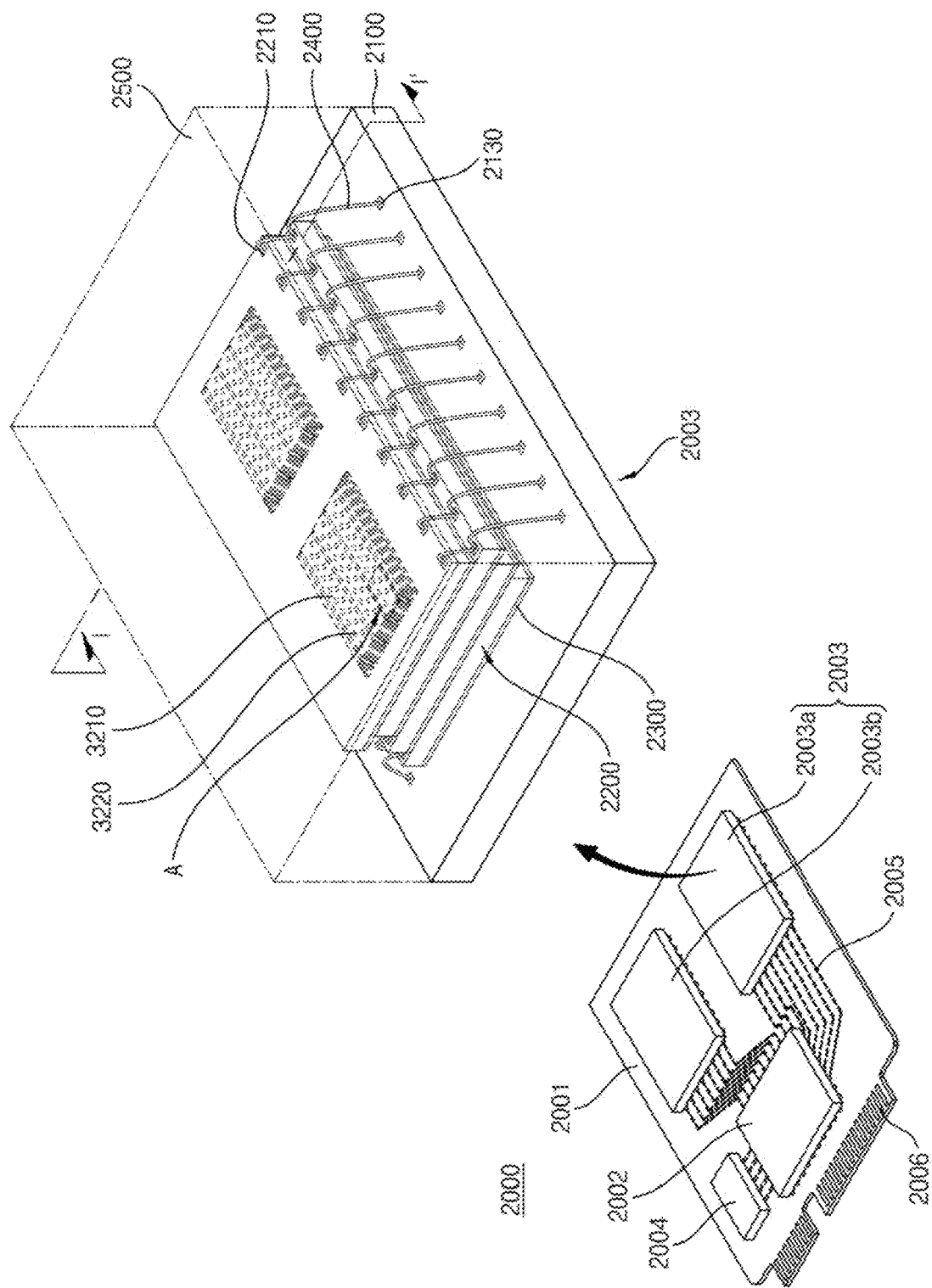
FIG. 45 is a perspective view of an electronic system including a semiconductor device according to an exemplary embodiment of the disclosure.

FIG. 45 is a perspective view of an electronic system including a semiconductor device according to an exemplary embodiment of the disclosure.

Referring to FIG. 45, an electronic system 2000 according to an exemplary embodiment of the disclosure may include a main substrate 2001, a controller 2002 mounted on the main substrate 2001, at least one semiconductor package 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and arrangement of the plurality of pins in the connector 2006 may be varied in accordance with a communication interface between the electronic system 2000 and the external host. In an implementation, the electronic system 2000 may communicate with the external host in accordance with any one of interfaces such as a universal serial bus (USB), peripheral component interconnect express (PCI-Express), serial advanced technology attachment (SATA), M-PHY for universal flash storage (UFS), or the like. In an implementation, the electronic system 2000 may operate by power supplied from the external host via the connector 2006. The electronic system 2000 may further include a power management integrated circuit (PMIC) for distributing power supplied from the external host to the controller 2002 and the semiconductor package 2003.

The controller 2002 may write data in the semiconductor package 2003 or may read out data from the semiconductor package 2003. The controller 2002 may also enhance an operation speed of the electronic system 2000.

The DRAM 2004 may be a buffer memory for reducing a speed difference between the semiconductor package 2003, which is a data storage space, and the external host. The DRAM 2004, which is included in the electronic system 2000, may also operate as a kind of cache memory. The DRAM 2004 may also provide a space for temporarily storing data in a control operation for the semiconductor package 2003. When the DRAM 2004 is included in the electronic system 2000, the controller 2002 may further include a DRAM controller for controlling the DRAM 2004, in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 respectively at lower surfaces of the semiconductor chips 2200, a connecting structure 2400 for electrically connecting the semiconductor chips 2200 and the package substrate 2100, and a molding layer 2500 covering the semiconductor chips 2200 and the connecting structure 2400 on the package substrate 2100.

The package substrate 2100 may be a printed circuit board including package upper pads 2130. Each of the semiconductor chips 2200 may include input/output pads 2210. The input/output pads 2210 may correspond to the input/output pads 1101 of FIG. 44. Each of the semiconductor chips 2200 may include gate stack structures 3210 and cell channel structures 3220. Each of the semiconductor chips 2200 may include a semiconductor device described with reference to FIGS. 1 to 7.

In an implementation, the connecting structure 2400 may be bonding wires for electrically connecting the input/output pads 2210 and the package upper pads 2130, respectively. Accordingly, in each of the first and second semiconductor packages 2003a and 2003b, the semiconductor chips 2200 may be electrically interconnected through wire bonding, and may be electrically connected to the corresponding package upper pads 2130 of the package substrate 2100. In an implementation, in each of the first and second semiconductor packages 2003a and 2003b, the semiconductor chips 2200 may be electrically interconnected by a connecting structure including a through-silicon via (TSV) in place of the bonding wire type connecting structure 2400.

In an implementation, the controller 2002 and the semiconductor chips 2200 may be included in one package. In an implementation, the controller 2002 and the semiconductor chips 2200 may be mounted on a separate interposer substrate different from the main substrate 2001. In this case, the controller 2002 and the semiconductor chips 2200 may be interconnected by wirings formed at the interposer substrate.

Figure 46:
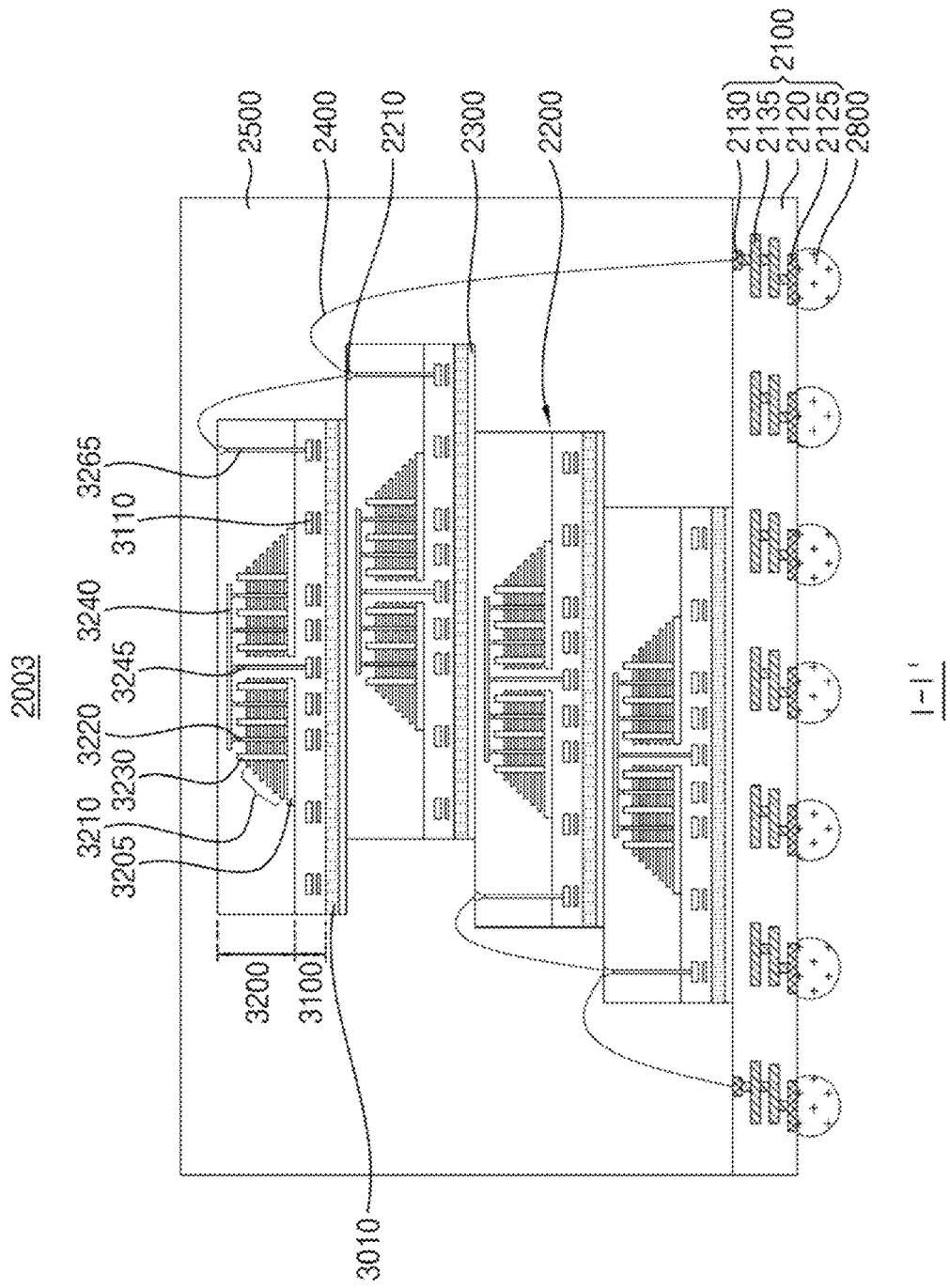

FIGS. 46 and 47 are sectional views of semiconductor packages according to exemplary embodiments of the disclosure. Each of FIGS. 46 and 47 correspond with an exemplary embodiment of the semiconductor package 2003 of FIG. 45, and conceptually shows an area of the semiconductor package 2003 taken along line I-I' in FIG. 45.

Referring to FIG. 46, in the semiconductor package 2003, the package substrate 2100 thereof may be a printed circuit board. The package substrate 2100 may include a package substrate body 2120, package upper pads 2130 at an upper surface of the package substrate body 2120, lower pads 2125 at a lower surface of the package substrate body 2120 or exposed through the lower surface of the package substrate body 2120, and inner wirings 2135 electrically connecting the package upper pads 2130 and the lower pads 2125 within the package substrate body 2120. The package upper pads 2130 may be electrically connected to connecting structures 2400. The lower pads 2125 may be connected to the wiring patterns 2005 of the main substrate 2010 of the electronic system 2000 through conductive connectors 2800, as shown in FIG. 46.

Each of the semiconductor chips 2200 may include a semiconductor substrate 3010, and a first structure 3100 and a second structure 3200 sequentially stacked on the semiconductor substrate 3010. The first structure 3100 may include a peripheral circuit region including peripheral wirings 3110. The second structure 3200 may include a lower source conductive pattern 3205, a gate stack structure 3210 on the lower source conductive pattern 3205, cell channel structures 3220, and word line separation structures 3230 extending through the gate stack structure 3210, bit lines 3240 electrically connected to the cell channel structures 3220, and gate contact plugs ("120" in FIG. 3) electrically connected to word lines ("WL" in FIG. 44) of the gate stack structure 3210. Upon viewing the second structure 3200 of FIG. 46 in an enlarged state, the second structure 3200 may include a semiconductor device of FIG. 2 or 7. In an implementation, the second structure 3200 may further include a stopper layer ("ST" in FIG. 2 or 7) disposed between the gate stack structure 3210 and the bit lines 3240.

Each of the semiconductor chips 2200 may include a through wiring 3245 electrically connected to the peripheral wirings 3110 of the first structure 3100 while extending into the second structure 3200. The through wiring 3245 may extend through the gate stack structure 3210, and may be further disposed outside the gate stack structure 3210. Each of the semiconductor chips 2200 may further include an input/output connecting wiring 3265 electrically connected to the peripheral wirings 3110 of the first structure 3100 and extending into the second structure 3200, and an input/output pad 2210 electrically connected to the input/output connecting wirings 3265.

Referring to FIG. 47, in a semiconductor package 2003A, each of semiconductor chips 2200a thereof may include a semiconductor substrate 4010, a first structure 4100 on the semiconductor substrate 4010, and a second structure 4200 bonded to the first structure 4100 in a wafer bonding manner on the first structure 4100.

The first structure 4100 may include a peripheral circuit region including a peripheral wiring 4110 and first bonding structures 4150. The second structure 4200 may include a lower source conductive pattern 4205, a gate stack structure 4210 between the lower source conductive pattern 4205 and the first structure 4100, cell channel structures 4220 and word line separation structures 4230 extending through the gate stack structure 4210, and second bonding structures 4250 electrically connected to the cell channel structures 4220 and word lines of the gate stack structure 4210 ("WL" in FIG. 44), respectively. In an implementation, the second bonding structures 4250 may be electrically connected to the cell channel structures 4220 and the word lines ("WL" in FIG. 44) through bit lines 4240 electrically connected to the cell channel structures 4220 and gate contact plugs ("120" in FIG. 3) electrically connected to the word lines ("WL" in FIG. 44), respectively. The first bonding structures 4150 of the first structure 4100 and the second bonding structures 4250 of the second structure 4200 may be bonded to each other while contacting each other. Bonding portions of the first bonding structures 4150 and the second bonding structures 4250 may be made of, e.g., copper (Cu).

Upon viewing the second structure 4200 of FIG. 47 in an enlarged state, the second structure 4200 may include a semiconductor device of FIG. 2 or 7. In an implementation, the second structure 4200 may further include a stopper layer ("ST" in FIG. 2 or 7) between the gate stack structure 4210 and the first structure 4100. Each of the semiconductor chips 2200a may further include an input/output pad 2210, and an input/output connecting wiring 4265 under the input/output pad 2210. The input/output connecting wiring 4265 may be electrically connected to a part of the second bonding structures 4250.

The semiconductor chips 2200 of FIG. 46 and the semiconductor chips 2200a of FIG. 47 may be electrically connected by bonding wire type connecting structures 2400. Of course, in exemplary embodiments of the disclosure, semiconductor chips in one semiconductor package such as the semiconductor chips 2200 of FIG. 46 and the semiconductor chips 2200a of FIG. 47 may be electrically connected by a connecting structure including a through-silicon via (TSV).

In accordance with exemplary embodiments of the disclosure, a semiconductor device including a stopper layer on an uppermost gate electrode and a manufacturing method thereof may be provided. Accordingly, even if a bit line contact plug were to be misaligned from a cell channel structure, a short circuit between the bit line contact plug and the stopper layer may be avoided. Thus, a semiconductor device having further enhanced reliability may be provided.

By way of summation and review, increasing the data storage capacity of a semiconductor device has been considered. For example, increasing the data storage capacity of a semiconductor device may include using a semiconductor device including three-dimensionally arranged memory cells in place of two-dimensionally arranged memory cells.

One or more embodiments may provide a semiconductor device having superior reliability even if misalignment were to occur in a semiconductor device manufacturing process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
a substrate;
a peripheral circuit layer on the substrate;
a semiconductor layer on the peripheral circuit layer;
a source conductive pattern on the semiconductor layer;
a first stack on the source conductive pattern, the first stack including first insulating layers and first gate electrodes which are alternately stacked;
a second stack on the first stack, the second stack including second insulating layers and second gate electrodes which are alternately stacked;
a stopper layer on the second stack, the stopper layer including a first insulating material;
a mold layer on the stopper layer, the mold layer including a second insulating material having etch selectivity with respect to the stopper layer;
a cell channel structure extending through the source conductive pattern, the first stack, the second stack, the stopper layer, and the mold layer, a side surface of the cell channel structure contacting the stopper layer;
a capping layer on the mold layer and the cell channel structure, wherein the mold layer is disposed in a space between the capping layer and the stopper layer;
a word line separation structure extending through the source conductive pattern, the first stack, the second stack, the stopper layer, the mold layer, and the capping layer, the word line separation structure including a protrusion protruding toward the stopper layer; and
a bit line contact plug extending through the capping layer, the bit line contact plug being connected to the cell channel structure,
wherein an inner side surface of the stopper layer is:
offset from an inner side surface of the second stack, and
in contact with the word line separation structure, the inner side surface of the second stack in contact with the word line separation structure.
2. The semiconductor device as claimed in claim 1, wherein the inner side surface of the stopper layer is offset from respective inner side surfaces of the second insulating layers and the second gate electrodes.
3. The semiconductor device as claimed in claim 1, wherein a thickness of the stopper layer is smaller than a thickness of each of the first gate electrodes and smaller than a thickness of each of the second gate electrodes.
4. The semiconductor device as claimed in claim 1, wherein the protrusion contacts the inner side surface of the stopper layer, an upper surface of the second stack, and a bottom surface of the mold layer.
5. The semiconductor device as claimed in claim 1, wherein:
the mold layer includes a silicon oxide, and
the stopper layer includes a silicon nitride.
6. The semiconductor device as claimed in claim 1, wherein an area of the stopper layer is equal to or smaller than an area of an uppermost one of the second gate electrodes.
7. A semiconductor device, comprising:
a substrate;
a gate stack structure on the substrate, the gate stack structure including insulating layers and gate electrodes which are alternately stacked;
a stopper layer on the gate stack structure;
a mold layer on the stopper layer;
a cell channel structure extending through the gate stack structure, the stopper layer, and the mold layer, a side surface of the cell channel structure contacting the stopper layer;
a capping layer on the cell channel structure, wherein the mold layer is disposed in a space between the capping layer and the stopper layer;
a word line separation structure extending through the gate stack structure, the stopper layer, and the capping layer; and
a bit line contact plug extending through the capping layer, the bit line contact plug contacting the cell channel structure,
wherein an inner side surface of the stopper layer is:
offset from an inner side surface of the gate electrodes, and
in contact with the word line separation structure, the inner side surface of the gate electrodes in contact with the word line separation structure.
8. The semiconductor device as claimed in claim 7, wherein the word line separation structure includes a protrusion extending horizontally toward the stopper layer.
9. The semiconductor device as claimed in claim 8, wherein the protrusion contacts the inner side surface of the stopper layer, a bottom surface of the mold layer, and an upper surface of an uppermost one of the insulating layers.
10. The semiconductor device as claimed in claim 7, wherein a thickness of the stopper layer is smaller than a thickness of each of the gate electrodes.
11. The semiconductor device as claimed in claim 7, wherein the stopper layer includes a silicon nitride.
12. The semiconductor device as claimed in claim 7, wherein an area of the stopper layer is equal to or smaller than an area of an uppermost one of the gate electrodes.
13. An electronic system, comprising:
a main substrate;
a semiconductor device on the main substrate; and
a controller electrically connected to the semiconductor device on the main substrate,
wherein the semiconductor device includes:
a substrate,
a gate stack structure on the substrate, the gate stack structure including insulating layers and gate electrodes which are alternately stacked,
a stopper layer on the gate stack structure,
a mold layer on the stopper layer, a cell channel structure extending through the gate stack structure, the stopper layer, and the mold layer, a side surface of the cell channel structure contacting the stopper layer, a capping layer on the cell channel structure, wherein the mold layer is disposed in a space between the capping layer and the stopper layer, a word line separation structure extending through the gate stack structure, the stopper layer, and the capping layer, and a bit line contact plug extending through the capping layer, the bit line contact plug contacting the cell channel structure, and wherein an inner side surface of the stopper layer is:

offset from an inner side surface of the gate electrodes, and in contact with the word line separation structure, the inner side surface of the gate electrodes in contact with the word line separation structure.

14. The electronic system as claimed in claim 13, wherein:

the main substrate further includes wiring patterns electrically interconnecting the semiconductor device and the controller; and the word line separation structure includes a protrusion extending horizontally toward the stopper layer.

15. The electronic system as claimed in claim 14, wherein the protrusion contacts the inner side surface of the stopper layer, a bottom surface of the mold layer, and an upper surface of an uppermost one of the insulating layers.

16. The semiconductor device as claimed in claim 13, wherein a thickness of the stopper layer is smaller than a thickness of each of the gate electrodes.

* * * * *